(12) United States Patent
Jeong et al.

(10) Patent No.: US 9,431,478 B2
(45) Date of Patent: Aug. 30, 2016

(54) SEMICONDUCTOR DEVICE AND METHOD OF FABRICATING THE SAME

(71) Applicants: Yeong-Jong Jeong, Yongin-si (KR); Jeong-Yun Lee, Yongin-si (KR); Geo-Myung Shin, Seoul (KR); Dong-Suk Shin, Yongin-si (KR); Si-Hyung Lee, Suwon-si (KR); Seo-Jin Jeong, Incheon (KR)

(72) Inventors: Yeong-Jong Jeong, Yongin-si (KR); Jeong-Yun Lee, Yongin-si (KR); Geo-Myung Shin, Seoul (KR); Dong-Suk Shin, Yongin-si (KR); Si-Hyung Lee, Suwon-si (KR); Seo-Jin Jeong, Incheon (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 36 days.

(21) Appl. No.: 14/600,142

(22) Filed: Jan. 20, 2015

(65) Prior Publication Data

US 2015/0318399 A1 Nov. 5, 2015

(30) Foreign Application Priority Data

Apr. 30, 2014 (KR) ........................ 10-2014-0052532

(51) Int. Cl.
| | |
|---|---|
| *H01L 27/088* | (2006.01) |
| *H01L 29/06* | (2006.01) |
| *H01L 29/78* | (2006.01) |
| *B82Y 10/00* | (2011.01) |
| *H01L 29/775* | (2006.01) |
| *H01L 29/41* | (2006.01) |

(52) U.S. Cl.
CPC .............. *H01L 29/06* (2013.01); *B82Y 10/00* (2013.01); *H01L 27/0886* (2013.01); *H01L 29/0653* (2013.01); *H01L 29/0673* (2013.01); *H01L 29/413* (2013.01); *H01L 29/775* (2013.01); *H01L 29/78* (2013.01); *H01L 29/7851* (2013.01); *H01L 29/7853* (2013.01)

(58) Field of Classification Search
None
See application file for complete search history.

(56) References Cited

U.S. PATENT DOCUMENTS

| | | |
|---|---|---|
| 7,026,199 B2 | 4/2006 | Lee |
| 7,056,781 B2 | 6/2006 | Yoon et al. |
| 7,402,856 B2 | 7/2008 | Brask et al. |
| 7,767,560 B2 | 8/2010 | Jin et al. |
| 7,821,044 B2 | 10/2010 | Bohr et al. |
| 7,863,683 B2 | 1/2011 | Kim et al. |
| 8,373,226 B2 | 2/2013 | Taketani |
| 2009/0057846 A1 | 3/2009 | Doyle et al. |
| 2012/0138886 A1 | 6/2012 | Kuhn et al. |

(Continued)

FOREIGN PATENT DOCUMENTS

| | | |
|---|---|---|
| JP | 2012-190896 A | 10/2012 |
| JP | 2013-162076 A | 8/2013 |

*Primary Examiner* — Sonya D McCall Shepard
(74) *Attorney, Agent, or Firm* — Harness, Dickey & Pierce, P.L.C.

(57) ABSTRACT

A semiconductor device includes a first multi-channel active pattern defined by a field insulating layer and extending along a first direction, the first multi-channel active pattern including a first portion having a top surface protruding further in an upward direction than a top surface of the field insulating layer and a second portion on both sides of the first portion, the second portion having sidewalls with a continuous profile and a top surface protruding further in the upward direction than the top surface of the field insulating layer and protruding in the upward direction less than the top surface of the first portion, a gate electrode on the first portion of the first multi-channel active pattern and extending along a second direction different from the first direction, and a first source/drain region on the second portion of the first multi-channel active pattern and contacting the field insulating layer.

20 Claims, 53 Drawing Sheets

(56) References Cited

U.S. PATENT DOCUMENTS

| | | |
|---|---|---|
| 2013/0020642 A1 | 1/2013 | Basker et al. |
| 2013/0049080 A1 | 2/2013 | Okano |
| 2013/0082310 A1 | 4/2013 | Yin et al. |
| 2013/0154029 A1 | 6/2013 | Cai et al. |
| 2013/0175620 A1 | 7/2013 | Cai et al. |
| 2013/0193446 A1 | 8/2013 | Chao et al. |
| 2013/0228865 A1 | 9/2013 | Lin et al. |
| 2015/0200291 A1* | 7/2015 | Alptekin ............... H01L 29/785 257/401 |

* cited by examiner

15

SEMICONDUCTOR DEVICE AND METHOD OF FABRICATING THE SAME

CROSS REFERENCE TO RELATED APPLICATION

This application claims priority from Korean Patent Application No. 10-2014-0052532 filed on Apr. 30, 2014 in the Korean Intellectual Property Office, the disclosure of which is incorporated herein by reference in its entirety.

BACKGROUND

1. Field

Some example embodiments of the inventive concepts relate to a semiconductor device and a method of fabricating the same.

2. Description of the Related Art

As one scaling technique for increasing the density of a semiconductor device, a multi-gate transistor has been suggested. The multi-gate transistor includes a fin-shaped silicon body formed on a substrate and gates formed on the surface of the silicon body.

The multi-gate transistor can be more easily scaled because the multi-gate transistor uses a three-dimensional (3D) channel. In addition, the current control capability can be improved without the need to increase the gate length of the multi-gate transistor. Moreover, effectively suppressing a short channel effect (SCE) in which an electric potential of a channel region is affected by a drain voltage may be possible.

SUMMARY

Some example embodiments of the inventive concepts provide a semiconductor device in which a portion of a multi-channel active pattern is made to protrude further upward than a field insulating layer and/or fin spacers in order to increase the volume of a source/drain region formed on the protruding portion of the multi-channel active pattern, thereby improving element characteristics.

Other example embodiments of the inventive concepts provide a method of fabricating the semiconductor device.

However, example embodiments of the inventive concepts are not restricted to the ones set forth herein. The above and other aspects of the example embodiments of the inventive concepts will become more apparent to one of ordinary skill in the art to which the inventive concepts pertain by referencing the detailed description given below.

According to an example embodiment of the inventive concepts, a semiconductor device includes a first multi-channel active pattern defined by a field insulating layer and extending along a first direction, the first multi-channel active pattern including a first portion having a top surface protruding further in an upward direction than a top surface of the field insulating layer, and a second portion on both sides of the first portion, the second portion having a top surface protruding further in the upward direction than the top surface of the field insulating layer and protruding in the upward direction less than the top surface of the first portion, the second portion having sidewalls with a continuous profile, a gate electrode on the first portion of the first multi-channel active pattern, the gate electrode extending along a second direction different from the first direction, and a first source/drain region on the second portion of the first multi-channel active pattern and contacting the field insulating layer.

The entire second portion may protrude further in the upward direction than the top surface of the field insulating layer, and the first source/drain region may be formed on the top surface and sidewalls of the second portion. The entire second portion may protrude further in the upward direction than the top surface of the field insulating layer, and the first source/drain region may directly contact the entire second portion. The first source/drain region may contact the top surface of the field insulating layer.

The semiconductor device may further include fin spacers on a part of the sidewalls of the second portion protruding further in the upward direction than the top surface of the field insulating layer. A part of the second portion may protrude further in the upward direction than the fin spacers. Each of the fin spacers may include an inner side surface adjacent to the second portion and an outer side surface facing the inner side surface, and the first source/drain region may contact each of the fin spacers along the outer side surface of each of the fin spacers. The first source/drain region may contact the top surface of the field insulating layer.

The semiconductor device may further include a second multi-channel active pattern adjacent to the first multi-channel active pattern and extending along the first direction, the second multi-channel active pattern including a third portion having a top surface protruding further in the upward direction than a top surface of the field insulating layer, and a fourth portion on both sides of the third portion, the fourth portion having a top surface protruding further in the upward direction than the top surface of the field insulating layer and protruding in the upward direction less than the top surface of the third portion, and a second source/drain region on the fourth portion of the second multi-channel active pattern and contacting the field insulating layer, wherein the gate electrode may be formed on the third portion and the second source/drain region may be formed on both sides of the gate electrode. The second source/drain region may contact the first source/drain region. Each of the first source/drain region and the second source/drain region may contact the top surface of the field insulating layer.

A width of the first source/drain region may be w1, a width of a reference source/drain region formed on a surface of a reference multi-channel active pattern that is recessed to be in the same plane as a top surface of the reference field insulating layer may be w2, a height of the first portion of the first multi-channel active pattern protruding further in the upward direction than the field insulating layer may be a, and Equation (1): $w1=w2+2\times a/1.4$ . . . (1). The first source/drain region and the reference source/drain region may include SiGe.

A height from the top surface of the field insulating layer to the top surface of the first portion may be a first height, a height from the top surface of the field insulating layer to the top surface of the second portion may be a second height, and the first height may be greater than the second height. An outer circumferential surface of the first source/drain region may have at least one of a diamond shape, a circular shape, and a rectangular shape. The first multi-channel active pattern may be a fin-type active pattern.

According to another example embodiment of the inventive concepts, a semiconductor device includes a multi-channel active pattern defined by a field insulating layer and extending along a first direction, the multi-channel active pattern including a first portion having a top surface protruding further in an upward direction than a top surface of the field insulating layer, and a second portion on both sides of the first portion, the second portion protruding further in the upward direction than the top surface of the field insulating layer and protruding in the upward direction less than the top surface of the first portion, a gate electrode on the first portion of the multi-channel active pattern, the gate electrode extending along a second direction different from the first direction, fin spacers on a part of sidewalls of the second portion protruding further in the upward direction than the top surface of the field insulating layer, and a source/drain region covering at least part of the fin spacers and contacting the top surface and the sidewalls of the second portion protruding further in the upward direction than the fin spacers.

The source/drain region may partially cover the fin spacers. Each of the fin spacers may include an inner side surface adjacent to the second portion protruding further in the upward direction than the top surface of the field insulating layer and an outer side surface facing the inner side surface, and upper parts of the outer side surfaces of the fin spacers contact the source/drain region and lower parts of the outer side surfaces of the fin spacers do not contact the source/drain region. The semiconductor device may further include gate spacers on sidewalls of the gate electrode, wherein the gate spacers and the fin spacers may be connected to each other. The source/drain region may contact the field insulating layer.

According to yet another example embodiment of the inventive concepts, a semiconductor device includes a substrate including a first region and a second region, a first transistor in the first region, the first transistor including a first multi-channel active pattern defined by a field insulating layer and extending along a first direction, the first multi-channel active pattern including a first portion having a top surface protruding further in an upward direction than a top surface of the field insulating layer, and a second portion on both sides of the first portion, the second portion having a top surface protruding further in the upward direction than the top surface of the field insulating layer and protruding in the upward direction less than the top surface of the first portion, the second portion having sidewalls with a continuous profile, a first gate electrode on the first portion of the first multi-channel active pattern, the gate electrode extending along a second direction different from the first direction, and a first source/drain region on both sides of the first gate electrode, the first source/drain region contacting the field insulating layer and the top surface and the sidewalls of the second portion protruding further in the upward direction than a top surface of the field insulating layer, and a second transistor in the second region, the second transistor including a second multi-channel active pattern defined by the field insulating layer and extending along a third direction, the second multi-channel active pattern including a third portion having a top surface protruding further in the upward direction than a top surface of the field insulating layer, and a fourth portion on both sides of the third portion, the fourth portion having a top surface protruding further in the upward direction than the top surface of the field insulating layer and protruding in the upward direction less than the top surface of the third portion, the fourth portion having sidewalls with a continuous profile, a second gate electrode on the third portion of the second multi-channel active pattern, the gate electrode extending along a fourth direction different from the third direction, and a second source/drain region on both sides of the second gate electrode, the second source/drain region having a different conductivity type than the first source/drain region and contacting the field insulating layer and the top surface and the sidewalls of the fourth portion protruding further in the upward direction than a top surface of the field insulating layer.

The first source/drain region and the field insulating layer may contact each other in the first region, and the second source/drain region and the field insulating layer may contact each other in the second region, and the area of the second region and the area of the first region may be different from each other.

According to still another example embodiment of the inventive concepts, a semiconductor device includes a substrate including a first region and a second region, a first transistor in the first region, the first transistor including a first multi-channel active pattern defined by a field insulating layer and extending along a first direction, the multi-channel active pattern including a first portion having a top surface protruding further in an upward direction than a top surface of the field insulating layer, and a second portion protruding further in the upward direction than the top surface of the field insulating layer and protruding in the upward direction less than the top surface of the first portion, a first gate electrode on the first portion of the first multi-channel active pattern, the first gate electrode extending along a second direction different from the first direction, first fin spacers on a part of sidewalls of the second portion protruding further in the upward direction than the top surface of the field insulating layer, and a first source/drain region on both sides of the first gate electrode, the first source/drain region contacting the top surface and the sidewalls of the second portion protruding further in the upward direction than the first fin spacers, and a second transistor in the second region, the second transistor including a second multi-channel active pattern defined by the field insulating layer and extending along a third direction, the second multi-channel active pattern including a third portion having a top surface protruding further in the upward direction than a top surface of the field insulating layer, and a fourth portion having a top surface protruding further in the upward direction than the top surface of the field insulating layer and protruding in the upward direction less than the top surface of the third portion, second fin spacers on part of sidewalls of the fourth portion protruding further in the upward direction than the top surface of the field insulating layer, and a second source/drain region on both sides of the second gate electrode, the second source/drain region having a different conductivity type than the first source/drain region and contacting the top surface and the sidewalls of the fourth portion protruding further in the upward direction than the top surface of the field insulating layer.

A bottom portion of the first source/drain region may be formed along a top portion of the first fin spacers. The second source/drain region may partially cover the second fin spacers. The second source/drain region may contact the field insulating layer.

According to still yet another example embodiment of the inventive concepts, a semiconductor device includes a substrate including a first region and a second region, a first transistor in the first region, the first transistor including a first multi-channel active pattern defined by a field insulating layer and extending along a first direction, the first multi-channel active pattern including a first portion having a top surface protruding further in an upward direction than a top surface of the field insulating layer, and a second portion having a top surface protruding further in the upward direction than the top surface of the field insulating layer and protruding in the upward direction less than the top surface of the first portion, the second portion having sidewalls with a continuous profile, a first gate electrode on the first portion of the first multi-channel active pattern, the first gate electrode extending along a second direction different from the first direction, and a first source/drain region on both sides of the first gate electrode, the first source/drain region contacting the field insulating layer and the top surface and the sidewalls of the second portion protruding further in the upward direction than a top surface of the field insulating layer, and a second transistor in the second region, the second transistor including a second multi-channel active pattern defined by a field insulating layer and extending along a third direction, the second multi-channel active pattern including a third portion having a top surface protruding further in the upward direction than a top surface of the field insulating layer, and a fourth portion having a top surface protruding in the upward direction less than the top surface of the field insulating layer, a second gate electrode on the third portion of the second multi-channel active pattern, the second gate electrode extending along a fourth direction different from the third direction, and a second source/drain region on the fourth portion of the second multi-channel active pattern and both sides of the second gate electrode.

The top surface of the field insulating layer and the top surface of the fourth portion may be in the same plane. The top surface of the fourth portion may be more recessed than the top surface of the field insulating layer.

According to still another example embodiment of the inventive concepts, a semiconductor device includes a substrate including a first region and a second region, a first transistor in the first region, the first transistor including a first multi-channel active pattern defined by a field insulating layer and extending along a first direction, the multi-channel active pattern including a first portion having a top surface protruding further in an upward direction than a top surface of the field insulating layer, and a second portion protruding further in the upward direction than the top surface of the field insulating layer and protruding in the upward direction less than the top surface of the first portion, a first gate electrode on the first portion of the first multi-channel active pattern, the first gate electrode extending along a second direction different from the first direction, first fin spacers on a part of sidewalls of the second portion protruding further in the upward direction than the top surface of the field insulating layer, and a first source/drain region on both sides of the first gate electrode, the first source/drain region covering at least a portion of the first fin spacers and contacting the top surface and the sidewalls of the second portion protruding further in the upward direction than the first fin spacers, and a second transistor in the second region, the second transistor including a second multi-channel active pattern defined by the field insulating layer and extending along a third direction, the second multi-channel active pattern including a third portion and a fourth portion, the third portion having a top surface protruding further in the upward direction than a top surface of the field insulating layer, and second fin spacers on sidewalls of the fourth portion, a top surface of the fourth portion protruding in the upward direction less than the second fin spacers, and a second source/drain region on the fourth portion of the second multi-channel active pattern and both sides of the second gate electrode.

A height of the second fin spacers may be equal to a height from the top surface of the field insulating layer to the top surface of the fourth portion. The top surface of the fourth portion may be more recessed than a top surface of the field insulating layer. The first source/drain region may contact the field insulating layer.

According to yet another example embodiment of the inventive concepts, a semiconductor device includes a field insulating layer on a substrate, a first multi-channel active pattern defined by a field insulating layer and extending along a first direction, the multi-channel active pattern including a first portion having a top surface protruding further in an upward direction than a top surface of the field insulating layer, and a second portion on both sides of the first portion, the second portion protruding further in the upward direction than the top surface of the field insulating layer and protruding in the upward direction less than the top surface of the first portion, the second portion having sidewalls with a continuous profile, a first gate electrode on the first portion of the first multi-channel active pattern, the first gate electrode extending along a second direction different from the first direction, a first source/drain region surrounding the second portion protruding further in the upward direction than a top surface of the field insulating layer, a second multi-channel active pattern defined by the field insulating layer and extending along a third direction, the second multi-channel active pattern including a third portion having a top surface protruding further in the upward direction than a top surface of the field insulating layer, and a fourth portion on both sides of the third portion in the third direction, the fourth portion having a top surface protruding further in the upward direction than the top surface of the field insulating layer and protruding in the upward direction less than the top surface of the third portion, a second gate electrode on the third portion of the second multi-channel active pattern, the second gate electrode extending along a fourth direction different from the third direction, fin spacers on a part of sidewalls of the fourth portion protruding further in the upward direction than the top surface of the field insulating layer, and a second source/drain region contacting the top surface and the sidewalls of the fourth portion protruding further than the fin spacers.

The second source/drain region may cover at least a portion of the fin spacers.

According to still another example embodiment of the inventive concepts, a method of fabricating a semiconductor device includes forming a multi-channel active pattern defined by a field insulating layer and extending along a first direction, the multi-channel active pattern including a first portion having a top surface protruding further in an upward direction than a top surface of the field insulating layer, and a second portion having a top surface protruding further in the upward direction than the top surface of the field insulating layer and protruding in the upward direction less than the top surface of the first portion, forming a gate electrode on the first portion of the multi-channel active pattern to intersect the multi-channel active pattern, the gate electrode extending along a second direction different from the first direction, forming pre-fin spacers on sidewalls of the second portion of the multi-channel active pattern protruding further in the upward direction than the top surface of the field insulating layer, exposing at least part of the sidewalls of the second portion protruding further in the upward direction than the top surface of the field insulating layer by removing at least part of the pre-fin spacers, and forming a source/drain region to contact the exposed sidewalls of the second portion and the top surface of the second portion.

Forming the multi-channel active pattern may include forming a pre-multi-channel active pattern protruding further in the upward direction than the field insulating layer, forming the gate electrode to intersect the pre-multi-channel active pattern, forming a spacer layer on the field insulating layer to cover the gate electrode and the pre-multi-channel active pattern, and partially etching the spacer layer and the pre-multi-channel active pattern to form the pre-fin spacers. Exposing at least part of the sidewalls may completely expose the sidewalls of the second portion protruding further in the upward direction than the top surface of the field insulating layer by completely removing the pre-fin spacers such that the entire second portion protruding further in the upward direction than the top surface of the field insulating layer directly contacts the source/drain region. Exposing at least part of the sidewalls may form fin spacers on part of the sidewalls of the second portion protruding further in the upward direction than the top surface of the field insulating layer by partially removing the pre-fin spacers such that the source/drain region covers at least part of the fin spacers.

According to still yet another example embodiment of the inventive concepts, a semiconductor device includes a field insulating layer on a substrate, a source/drain region on the field insulating layer, and a fin-type active pattern projecting through a top surface of the field insulating layer and into the source/drain region.

The source/drain region may directly contact the field insulating layer. The semiconductor device may further include a gate electrode on the fin-type active pattern, the gate electrode extending in a direction different from a direction of the fin-type active pattern, and fin spacers on a portion of sidewalls of the fin-type active pattern projecting into the source/drain region, the fin spacers having a top surface at a height less than the top surface of the fin-type active pattern. The first source/drain region may include SiGe, and the sidewalls of the fin-type active pattern may have a continuous profile.

BRIEF DESCRIPTION OF THE DRAWINGS

The above and other aspects and features of the inventive concepts will become more apparent by describing in detail example embodiments thereof with reference to the attached drawings, in which.

DETAILED DESCRIPTION

Figure 1:
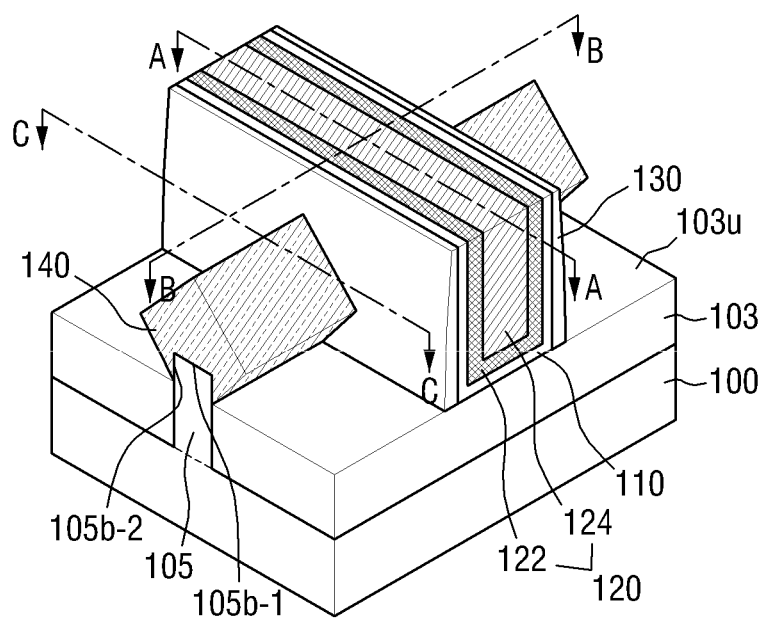
FIG. 1 is a perspective view of a semiconductor device according to a first example embodiment of the inventive concepts.
Figure 1:
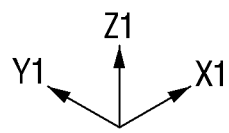

The inventive concepts will now be described more fully hereinafter with reference to the accompanying drawings, in which some example embodiments of the inventive concepts are shown. The inventive concepts may, however, be embodied in different forms and should not be construed as limited to the embodiments set forth herein. Rather, these embodiments are provided so that this disclosure will be thorough and complete, and will fully convey the scope of the inventive concepts to those skilled in the art. The same reference numbers indicate the same components throughout the specification. In the attached figures, the thickness of layers and regions is exaggerated for clarity.

It will be understood that when an element or layer is referred to as being "connected to," or "coupled to" another element or layer, it can be directly connected to or coupled to another element or layer or intervening elements or layers may be present. In contrast, when an element is referred to as being "directly connected to" or "directly coupled to" another element or layer, there are no intervening elements or layers present. Like numbers refer to like elements throughout. As used herein, the term "and/or" includes any and all combinations of one or more of the associated listed items.

It will also be understood that when a layer is referred to as being "on" another layer or substrate, it can be directly on the other layer or substrate, or intervening layers may also be present. In contrast, when an element is referred to as being "directly on" another element, there are no intervening elements present.

It will be understood that, although the terms first, second, etc. may be used herein to describe various elements, these elements should not be limited by these terms. These terms are only used to distinguish one element from another element. Thus, for example, a first element, a first component or a first section discussed below could be termed a second element, a second component or a second section without departing from the teachings of the inventive concepts.

The use of the terms "a" and "an" and "the" and similar references in the context of describing the inventive concepts (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted.

Unless defined otherwise, all technical and scientific terms used herein have the same meaning as commonly understood by one of ordinary skill in the art to which the inventive concepts belong. It is noted that the use of any and all examples, or example terms provided herein is intended merely to better illuminate the inventive concepts and is not a limitation on the scope of the inventive concepts unless otherwise specified. Further, unless defined otherwise, all terms defined in generally used dictionaries may not be overly interpreted.

A semiconductor device according to a first example embodiment of the inventive concepts will now be described with reference to FIGS. 1 through 4.

Figure 2:
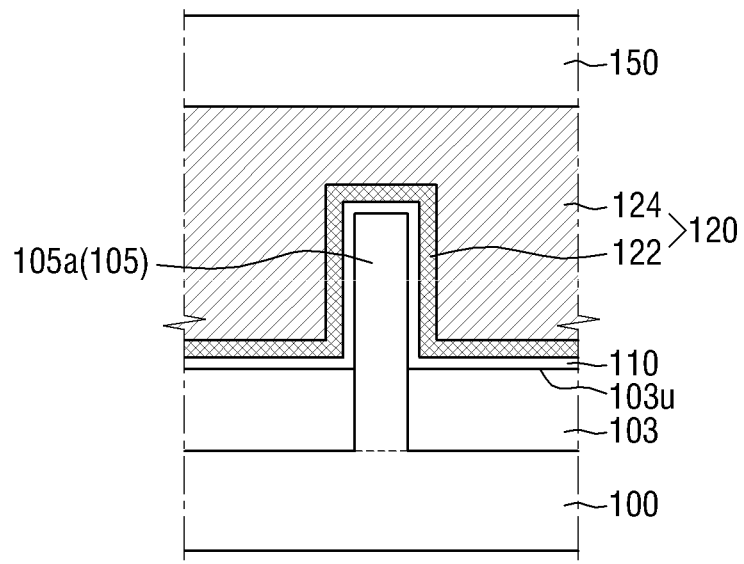
FIGS. 2, 3 and 4 are cross-sectional views of the semiconductor device taken along the lines A-A, B-B and C-C of FIG. 1, respectively.
Figure 3:
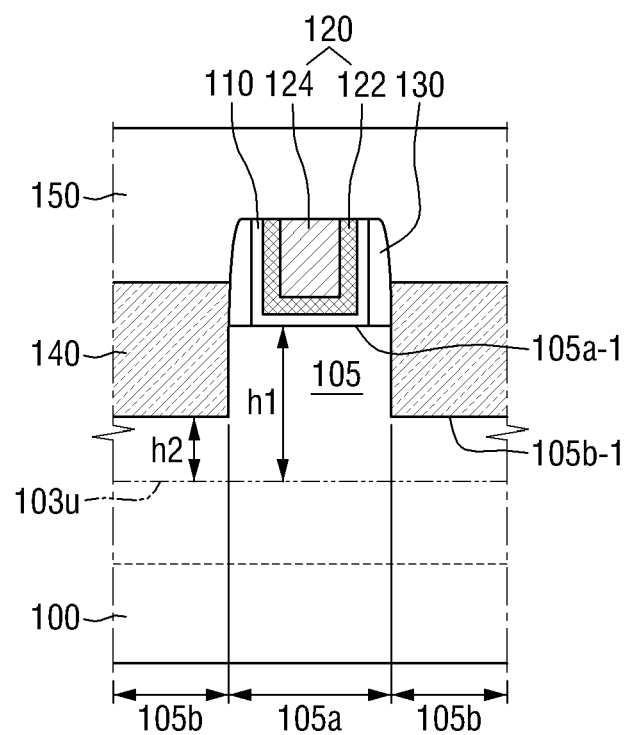
Figure 4:
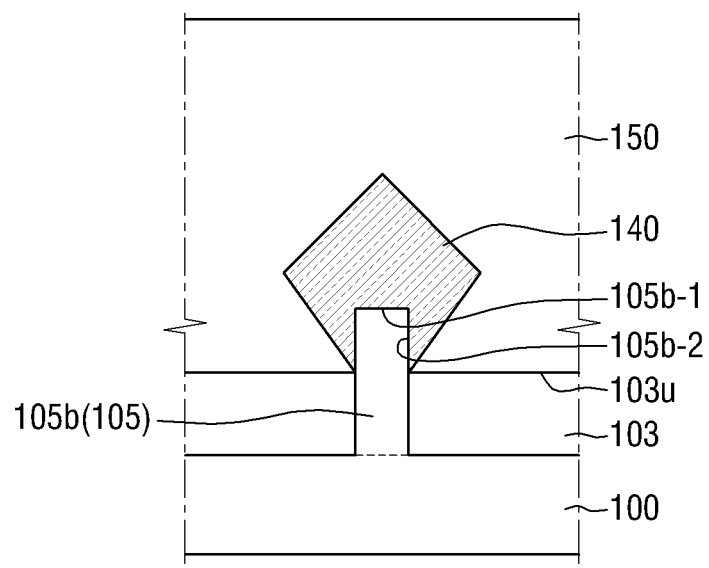

FIG. 1 is a perspective view of a semiconductor device 1 according to a first example embodiment of the inventive concepts. FIGS. 2, 3 and 4 are cross-sectional views of the semiconductor device 1 taken along the lines A-A, B-B and C-C of FIG. 1, respectively. For ease of description, an interlayer insulating film 150 is not illustrated in FIG. 1.

Referring to FIGS. 1 through 4, the semiconductor device 1 according to the first example embodiment of the inventive concepts may include a substrate 100, a field insulating layer 103, a first multi-channel active pattern 105, a first gate electrode 120, first gate spacers 130, first source/drain regions 140 and an interlayer insulating film 150.

The substrate 100 may be, for example, a bulk silicon substrate or a silicon-on-insulator (SOI) substrate. Otherwise, the substrate 100 may be a silicon substrate or may be a substrate formed of another material such as silicon germanium, indium antimonide, lead telluride, indium arsenide, indium phosphide, gallium arsenide, or gallium antimonide. Alternatively, the substrate 100 may consist of a base substrate and an epitaxial layer formed on the base substrate.

The first multi-channel active pattern 105 may protrude from the substrate 100. The field insulating layer 103 may partially cover side surfaces of the first multi-channel active pattern 105. Therefore, the first multi-channel active pattern 105 may protrude further upward than the field insulating layer 103 formed on the substrate 100. The first multi-channel active pattern 105 is defined by the field insulating layer 103.

The first multi-channel active pattern 105 may extend along a first direction X1. The first multi-channel active pattern 105 includes a first portion 105*a* and a second portion 105*b*. The second portion 105*b* of the first multi-channel active pattern 105 is disposed on both sides of the first portion 105*a* of the first multi-channel active pattern 105 in the first direction X1.

A top surface 105*b*-1 of the second portion 105*b* of the first multi-channel active pattern 105 and a top surface 105*a*-1 of the first portion 105*a* of the first multi-channel active pattern 105 protrude further upward than a top surface 103*u* of the field insulating layer 103. That is, the first portion 105*a* of the first multi-channel active pattern 105 and the second portion 105*b* of the first multi-channel active pattern 105 protrude further upward than the field insulating layer 103.

The second portion 105*b* of the first multi-channel active pattern 105 is more recessed than the first portion 105*a* of the first multi-channel active pattern 105. In other words, the top surface 105*b*-1 of the second portion 105*b* of the first multi-channel active pattern 105 is located more adjacent to the top surface 103*u* of the field insulating layer 103 than the top surface 105*a*-1 of the first portion 105*a* of the first multi-channel active pattern 105. Assuming that a height from the top surface 103*u* of the field insulating layer 103 to the top surface 105*a*-1 of the first portion 105*a* of the first multi-channel active pattern 105 is a first height h1 and that a height from the top surface 103*u* of the field insulating layer 103 to the top surface 105*b*-1 of the second portion 105b of the first multi-channel active pattern 105 is a second height h2, the first height h1 is greater than the second height h2.

For ease of description, the top surface 103u of the field insulating layer 103 is illustrated in the drawings as being flat, but the inventive concepts are not limited thereto. In semiconductor devices according to some example embodiments of the inventive concepts, the first height h1 and the second height h2 are measured based on a point at which the first multi-channel active pattern 105 contacts the field insulating layer 103.

The profile of sidewalls of the second portion 105b of the first multi-channel active pattern 105 is continuous. Specifically, the second portion 105b of the first multi-channel active pattern 105 includes a portion which contacts the field insulating layer 103 and a portion which protrudes further upward than the field insulating layer 103 without contacting the field insulating layer 103. Here, the profile of sidewalls of the second portion 105b of the first multi-channel active pattern 105 which contacts the field insulating layer 103 is continuous with the profile of sidewalls 105b-2 of the second portion 105b of the first multi-channel active pattern 105 which protrudes further upward than the field insulating layer 103.

In other words, at a boundary between the second portion 105b of the first multi-channel active pattern 105 and the top surface 103u of the field insulating layer 103, a width of the second portion 105b of the first multi-channel active pattern 105 which protrudes further upward than the field insulating layer 103 is equal to a width of the second portion 105b of the first multi-channel active pattern 105 which contacts the field insulating layer 103.

The first multi-channel active pattern 105 may be part of the substrate 100 and may include an epitaxial layer grown from the substrate 100. The first multi-channel active pattern 105 may include an element semiconductor material such as silicon or germanium. In addition, the first multi-channel active pattern 105 may include a compound semiconductor such as a group IV-IV compound semiconductor or a group III-V compound semiconductor. Specifically, the group IV-IV compound semiconductor that forms the first multi-channel active pattern 105 may be a binary or ternary compound containing two or more of carbon (C), silicon (Si), germanium (Ge) and tin (Sn) or a compound obtained by doping the binary or ternary compound with a group IV element. The group III-V compound semiconductor that forms the first multi-channel active pattern 105 may be a binary, ternary, or quaternary compound composed of at least one of aluminum (Al), gallium (Ga) and indium (In) (i.e., group III elements) bonded with one of phosphorus (P), arsenic (As) and antimony (Sb) (i.e., group V elements).

In semiconductor devices according to example embodiments of the inventive concepts, the first multi-channel active pattern 105 may contain silicon.

In addition, in semiconductor devices according to some example embodiments of the inventive concepts, the first multi-channel active pattern 105 may be, but is not limited to, a fin-type active pattern. A case where the first multi-channel active pattern 105 is not a fin-type active pattern will be described later with reference to FIG. 6.

The first gate electrode 120 may extend along a second direction Y1 and intersect the first multi-channel active pattern 105. The first gate electrode 120 may be formed on the first multi-channel active pattern 105 and the field insulating layer 103. More specifically, the first gate electrode 120 is formed on the first portion 105a of the first multi-channel active pattern 105.

The first gate electrode 120 may include metal layers (122, 124). As illustrated in the drawings, the first gate electrode 120 may be a stack of two or more metal layers (122, 124). A first metal layer 122 may control a work function, and a second metal layer 124 may fill a space formed by the first metal layer 122. For example, the first metal layer 122 may include at least one of TiN, TaN, TiC, and TaC. In addition, the second metal layer 124 may include W or Al. Alternatively, the first gate electrode 120 may be made of a material (e.g., Si or SiGe) other than metal. The first gate electrode 120 may be formed by, but not limited to, a replacement process.

A first gate insulating layer 110 may be formed between the first multi-channel active pattern 105 and the first gate electrode 120. The first gate insulating layer 110 may be formed on the top surface 105a-1 and side surfaces of the first portion 105a of the first multi-channel active pattern 105. In addition, the first gate insulating layer 110 may be disposed between the first gate electrode 120 and the field insulating layer 103. The first gate insulating layer 110 may include a high-k material having a higher dielectric constant than a silicon oxide layer. For example, the first gate insulating layer 110 may include one or more of, but not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate.

The first gate spacers 130 may respectively be formed on sidewalls of the first gate electrode 120 extending along the second direction Y1. The first gate spacers 130 may include at least one of silicon nitride (SiN), silicon oxynitride (SiON), silicon oxide (SiO$_2$), silicon oxycarbonitride (SiOCN), and combinations of the same. In the drawings, each of the first gate spacers 130 is illustrated as a single layer. However, the inventive concepts are not limited thereto, and each of the first gate spacers 130 can also have a multilayer structure.

The first source/drain regions 140 are respectively formed on the first multi-channel active pattern 105 on both sides of the first gate electrode 120. In other words, the first source/drain regions 140 are respectively formed on the second portions 105b of the first multi-channel active pattern 105.

An outer circumferential surface of each of the first source/drain regions 140 may have various shapes. For example, the outer circumferential surface of each of the first source/drain regions 140 may have at least one of a diamond shape, a circular shape, and a rectangular shape. In FIGS. 1 and 4, the diamond shape (or a pentagonal shape or a hexagonal shape) is illustrated.

Each of the first source/drain regions 140 is formed around the second portion 105b of the first multi-channel active pattern 105 which protrudes further upward than the top surface 103u of the field insulating layer 103. More specifically, each of the first source/drain regions 140 is formed on the top surface 105b-1 and the sidewalls 105b-2 of the second portion 105b of the first multi-channel active pattern 105 which protrudes further upward than the top surface 103u of the field insulating layer 103.

In the semiconductor device 1 according to the first example embodiment of the inventive concepts, the whole of the second portion 105b of the first multi-channel active pattern 105 which protrudes further upward than the top surface 103u of the field insulating layer 103 directly contacts each of the first source/drain regions 140. That is, a height at which the first source/drain regions 140 contact the first multi-channel active pattern 105 is substantially equal to a height of the sidewalls 105b-2 of the second portion 105b of the first multi-channel active pattern 105 which protrudes further upward than the top surface 103u of the field insulating layer 103.

The first source/drain regions 140 contact the field insulating layer 103. The first source/drain regions 140 are formed higher (in an upward direction Z1) than a boundary between the first multi-channel active pattern 105 and the field insulating layer 103. A bottommost part of each of the first source/drain regions 140 is formed along the boundary between the field insulating layer 103 and the first multi-channel active pattern 105. Therefore, an inner circumferential surface of each of the first source/drain regions 140 contacts the second portion 105b of the first multi-channel active pattern 105 and is formed along the top surface 105b-1 and the sidewalls 105b-2 of the second portion 105b of the first multi-channel active pattern 105 which protrudes further upward than the top surface 103u of the field insulating layer 103.

If the semiconductor device 1 according to the first example embodiment of the inventive concepts is a p-channel metal oxide semiconductor (PMOS) transistor, the first source/drain regions 140 may include a compressive stress material. The compressive stress material may be a material (e.g., SiGe) having a greater lattice constant than Si. The compressive stress material may improve the mobility of carriers in a channel region by applying compressive stress to the first multi-channel active pattern 105 (e.g., the first portion 105a of the first multi-channel active pattern 105).

On the other hand, if the semiconductor device 1 according to the first example embodiment of the inventive concepts is an n-channel metal oxide semiconductor (NMOS) transistor, the first source/drain regions 140 may be made of the same material as the first multi-channel active pattern 105 or a tensile stress material. For example, if the first multi-channel active pattern 105 is made of Si, the first source/drain regions 140 may be made of Si or a material (e.g., SiC) having a smaller lattice constant than Si.

Further, although not illustrated in FIGS. 1 through 4, a seed layer may be formed between the first source/drain regions 140 and the second portions 105b of the first multi-channel active pattern 105. Here, the seed layer may be a layer included in each of the first source/drain regions 140.

In addition, although not illustrated in FIGS. 1, 3 and 4, in semiconductor devices according to some example embodiments of the inventive concepts, each of the source/drain regions 140 may further include a metal silicide layer formed thereon.

The effects of the semiconductor device 1 according to the first example embodiment of the inventive concepts will now be described with reference to FIGS. 5A and 5B.

The following assumptions will be made before the effects of the semiconductor device 1 according to the first example embodiment of the inventive concepts are described. First, it will be assumed that a height from the substrate 100 to a topmost surface of the first source/drain region 140 is equal to a height from the substrate 100 to a topmost surface of a reference source/drain region 140r. In addition, unlike the illustration of FIG. 1, it will be assumed for ease of description that the topmost surface of the first source/drain region 140 and the topmost surface of the reference source/drain region 140r have the same crystal face as the substrate 100.

It will also be assumed that a height from the substrate 100 to a top surface of the first multi-channel active pattern 105 is substantially equal to a height from the substrate 100 to a top surface of a reference multi-channel active pattern 105r.

In addition, it will be assumed that the substrate 100 has been fabricated using a silicon substrate having a (100) crystal surface and that the first multi-channel active pattern 105 and the reference multi-channel active pattern 105r have been fabricated using part of the substrate 100. Further, it will be assumed that the first source/drain region 140 and the reference source/drain region 140r contain silicon germanium (SiGe).

Figure 5A:
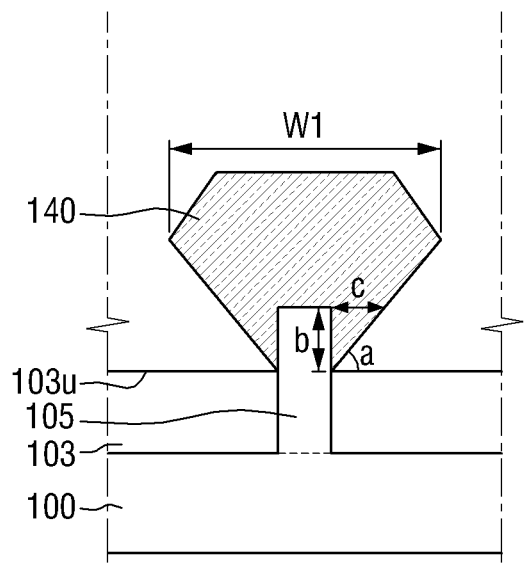
FIGS. 5A-5B is a view illustrating the effects of the semiconductor device of FIG. 1 and the related art, respectively.

Referring to FIG. 5A, in the semiconductor device 1 according to the first example embodiment of the inventive concepts, the first multi-channel active pattern 105 protrudes further upward than the top surface 103u of the field insulating layer 103. Here, a height by which the first multi-channel active pattern 105 protrudes further upward than the field insulating layer 103 is b. In addition, a width of the first source/drain region 140 formed on the first multi-channel active pattern 105 is w1.

Figure 5B:
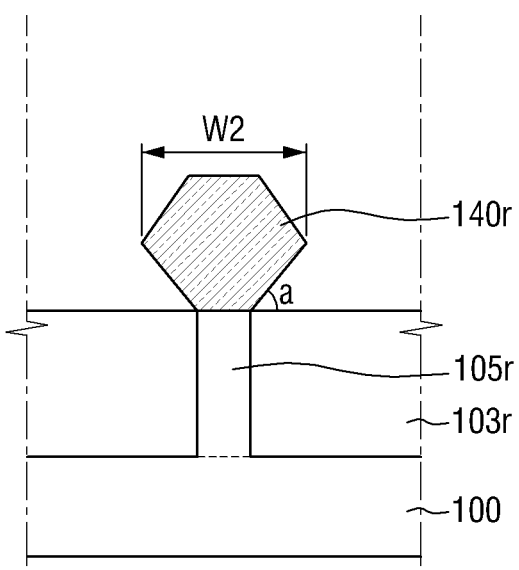

On the other hand, in a reference semiconductor device according to the related art as illustrated in FIG. 5B, the reference multi-channel active pattern 105r does not protrude further upward than a top surface of a reference field insulating layer 103r. That is, the top surface of the reference multi-channel active pattern 105r and the top surface of the reference field insulating layer 103r are in substantially the same plane. In addition, a width of the reference source/drain region 140r formed on the reference multi-channel active pattern 105r is w2.

An angle formed by each side surface of the reference source/drain region 140r grown from the top surface of the reference multi-channel active pattern 105r and the top surface of the reference field insulating layer 103r is a. For example, since the top surface of the reference multi-channel active pattern 105r is the same as the crystal face of the substrate 100, the reference multi-channel active pattern 105r has the (100) crystal face. However, each side surface of the reference source/drain region 140r formed by the lateral growth of the reference source/drain region 140r has a {111} crystal face group. That is, the angle a formed by the top surface of the reference multi-channel active pattern 105r and each side surface of the reference source/drain 140r is about 54.7 degrees.

As in the reference semiconductor device of FIG. 5B, in the semiconductor device 1 according to the first example embodiment of the inventive concepts as illustrated in FIG. 5A, an angle a formed by each side surface of the first source/drain region 140 grown from the top and side surfaces of the first multi-channel active pattern 105 and the top surface 103u of the field insulating layer 103 is approximately 54.7 degrees.

The reference source/drain region 140r of the reference semiconductor device grows only from the top surface of the reference multi-channel active pattern 105r. On the other hand, the first source/drain region 140 of the semiconductor device 1 according to the first example embodiment of the inventive concepts grow not only from the top surface of the protruding first multi-channel active pattern 105 but also from the side surfaces of the first multi-channel active pattern 105. That is, a point at which the first source/drain region 140 begins to grow epitaxially is lower than a point at which the reference source/drain region 140r begins to grow epitaxially by b.

Therefore, the first source/drain region 140 grows laterally more than the reference source/drain region 140r due to the first multi-channel active pattern 105 which protrudes further upward than the top surface 103u of the field insulating layer 103. More specifically, the first source/drain region 140 grows laterally more than the reference source/drain region 140r by 2×c.

The amount of additional lateral growth can be calculated as follows. Geometrically, the height b of the first multi-channel active pattern 105 which protrudes further than the field insulating layer 103 and the amount c of additional lateral growth of the first source/drain region 140 satisfy the relation of tan(a)=b÷c. That is, b÷c=tan(54.7°)≈1.4.

Therefore, the amount of additional lateral growth of the first source/drain region 140 is given by 2×c=2×b÷1.4. In conclusion, the width w1 of the first source/drain region 140 and the width w2 of the reference source/drain region 140r satisfy the relation of w1=w2+2×b÷1.4.

In the semiconductor device 1 according to the first example embodiment of the inventive concepts, since the first multi-channel active pattern 105 protrudes further upward than the field insulating layer 103, the first source/drain region 140 of FIG. 5A is wider than the reference source/drain region 140r of FIG. 5B. Accordingly, the first source/drain region 140 has a greater volume than the reference source/drain region 140r. The first source/drain region 140 having a greater volume than the reference source/drain region 140r reduces contact resistance with a contact formed on the first source/drain region 140, thereby improving element characteristics.

Figure 6:
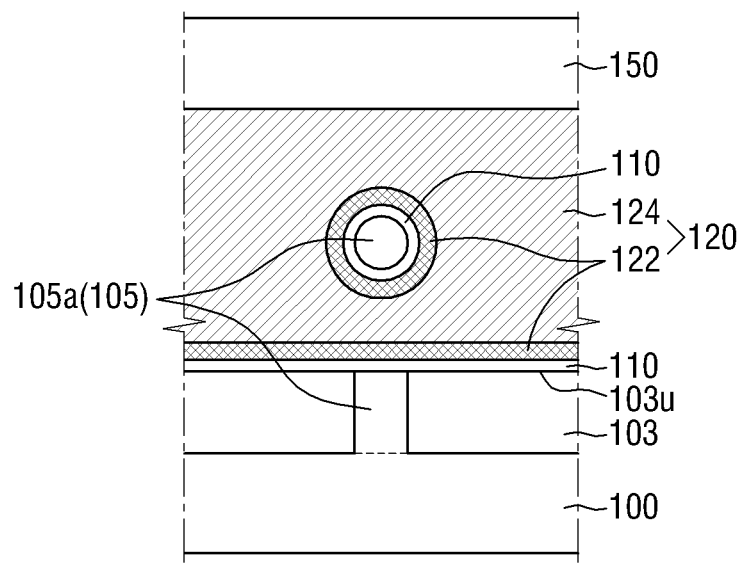
FIGS. 6 through 7B are cross-sectional views of modified examples of the semiconductor device according to the first example embodiment of the inventive concepts.
Figure 7A:
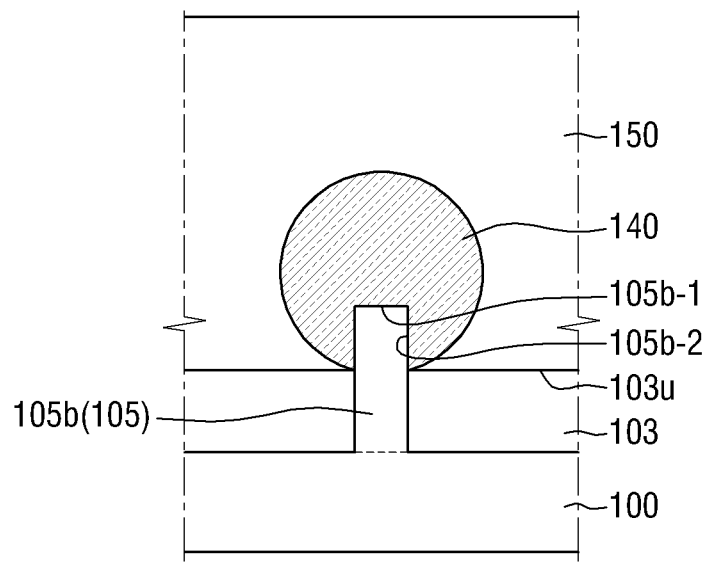
Figure 7B:
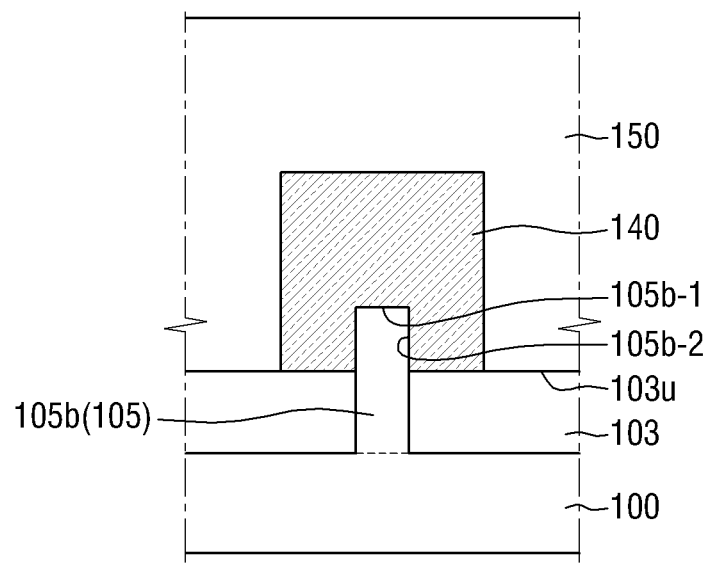

FIGS. 6 through 7B are cross-sectional views of modified examples of the semiconductor device 1 according to the first example embodiment of the inventive concepts. Specifically, FIG. 6 is a cross-sectional view taken along the line A-A of FIG. 1. FIGS. 7A and 7B are cross-sectional views taken along the line C-C of FIG. 1. For simplicity, the modified examples will be described, focusing mainly on differences with the first embodiment described above with reference to FIGS. 1 through 4.

Referring to FIG. 6, in a modified example of the semiconductor device 1 according to the first example embodiment of the inventive concepts, a first portion 105a of a first multi-channel active pattern 105 includes a nanowire.

The nanowire illustrated in the drawing has a circular cross section. However, the inventive concepts are not limited thereto. That is, the nanowire can also have a quadrilateral cross section. In addition, while one nanowire is illustrated in the drawing, this is merely an example, and the inventive concepts are not limited to this example.

A first gate insulating layer 110 may be formed not only on a top surface 103u of a field insulating layer 103 but also entirely surround the first portion 105a of the first multi-channel active pattern 105. In addition, a first metal layer 122 of a first gate electrode 120 may be formed not only on the first gate insulating layer 110 but also entirely surround the first portion 105a of the first multi-channel active pattern 105 having the first gate insulating layer 110.

A second metal layer 124 of the first gate electrode 120 may fill the space left after the first gate insulating layer 110 and the first metal layer 122 are formed. That is, the second metal layer 124 fills the space between the field insulating layer 103 and the first portion 105a of the first multi-channel active pattern 105.

Referring to FIG. 7A, in the modified example of the semiconductor device 1 according to the first example embodiment of the inventive concepts, an outer circumferential surface of a first source/drain region 140 may be circular.

Referring to FIG. 7B, in another modified example of the semiconductor device 1 according to the first example embodiment of the inventive concepts, an outer circumferential surface of a first source/drain region 140 may be rectangular. The first source/drain region 140 having the rectangular outer circumferential surface may contact a field insulating layer 103 along a top surface 103u of the field insulating layer 103, but the inventive concepts are not limited thereto.

The following embodiments will be described based on the assumption that the outer circumferential surface of the first source/drain region 140 is diamond-shaped.

A semiconductor device according to a second example embodiment of the inventive concepts will now be described with reference to FIGS. 8 and 9. For simplicity, the second embodiment will be described, focusing mainly on differences with the first embodiment described above with reference to FIGS. 1 through 4.

Figure 8:
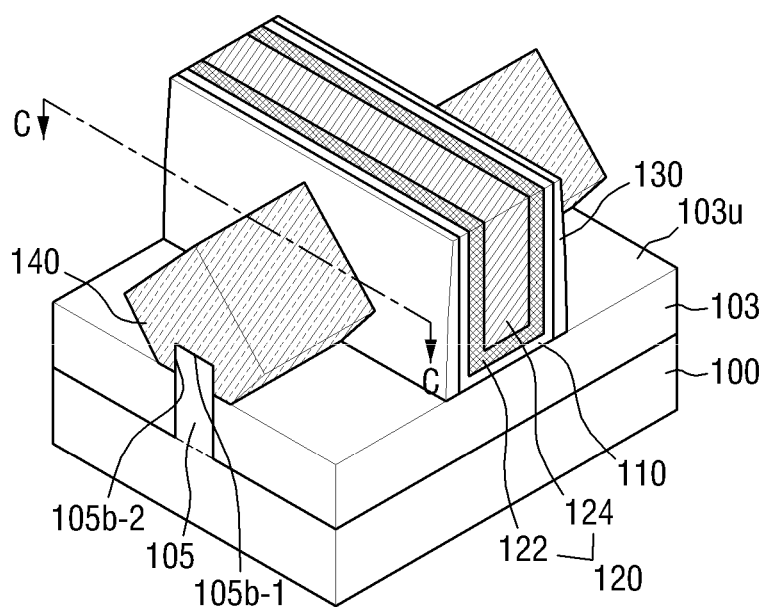
FIG. 8 is a perspective view of a semiconductor device according to a second example embodiment of the inventive concepts.
Figure 8:
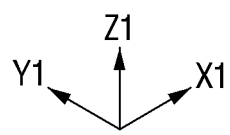

FIG. 8 is a perspective view of a semiconductor device 2 according to a second example embodiment of the inventive concepts. FIG. 9 is a cross-sectional view taken along the line C-C of FIG. 8.

Figure 9:
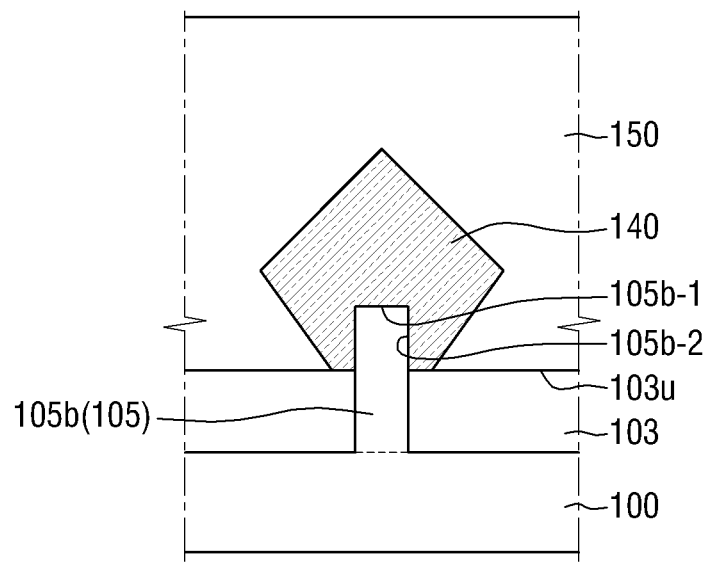
FIG. 9 is a cross-sectional view taken along the line C-C of FIG. 8.

Referring to FIGS. 8 and 9, in the semiconductor device 2 according to the second example embodiment of the inventive concepts, first source/drain regions 140 contact a field insulating layer 103 along a top surface 103u of the field insulating layer 103.

Specifically, each of the first source/drain regions 140 is formed on a top surface 105b-1 and sidewalls 105b-2 of a second portion 105b of a first multi-channel active pattern 105 which protrudes further upward than the top surface 103u of the field insulating layer 103 and on the top surface 103u of the field insulating layer 103.

Therefore, each of the first source/drain regions 140 contacts not only the second portion 105b of the first multi-channel active pattern 105 which protrudes further upward than the top surface 103u of the field insulating layer 103 but also part of the top surface 103u of the field insulating layer 103. The first source/drain regions 140 may grow laterally along the top surface 103u of the field insulating layer 103 adjacent to the first source/drain regions 140. Therefore, respective surfaces of the first source/drain regions 140 which correspond to the field insulating layer 103 may extend along the top surface 103u of the field insulating layer 103.

An inner circumferential surface of each of the first source/drain regions 140 contacts the second portion 105b of the first multi-channel active pattern 105 and is formed along the top surface 105b-1 and the sidewalls 105b-2 of the second portion 105b of the first multi-channel active pattern 105 which protrudes further upward than the top surface 103u of the field insulating layer 103 and along the top surface 103u of the field insulating layer 103.

Compared with the first source/drain regions 140 of the semiconductor device 1 according to the first embodiment, the first source/drain regions 140 of the semiconductor device 2 according to the second example embodiment of the inventive concepts contact a larger area of the field insulating layer 103.

A semiconductor device according to a third example embodiment of the inventive concepts will now be described with reference to FIGS. 10 and 11. For simplicity, the third embodiment will be described, focusing mainly on differences with the first embodiment described above with reference to FIGS. 1 through 4.

Figure 10:
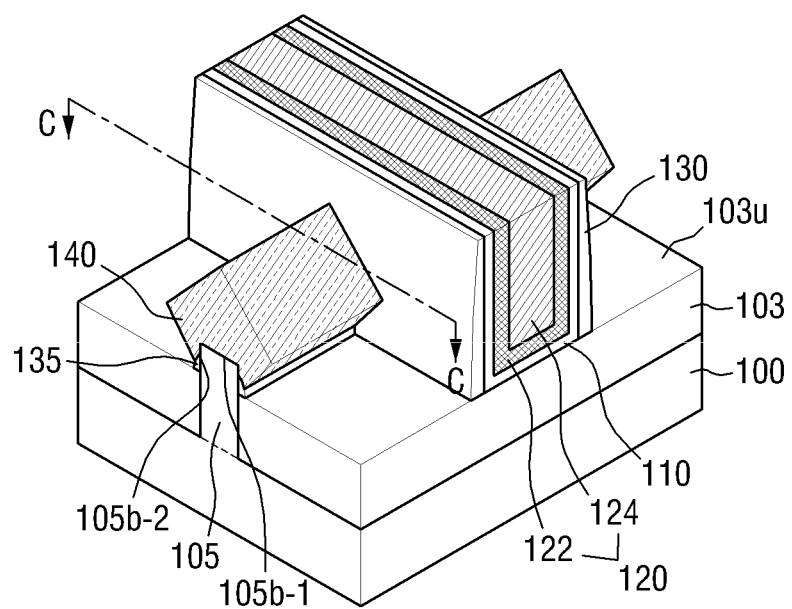
FIG. 10 is a perspective view of a semiconductor device according to a third example embodiment of the inventive concepts.

FIG. 10 is a perspective view of a semiconductor device 3 according to a third example embodiment of the inventive concepts. FIG. 11 is a cross-sectional view taken along the line C-C of FIG. 10.

Figure 11:
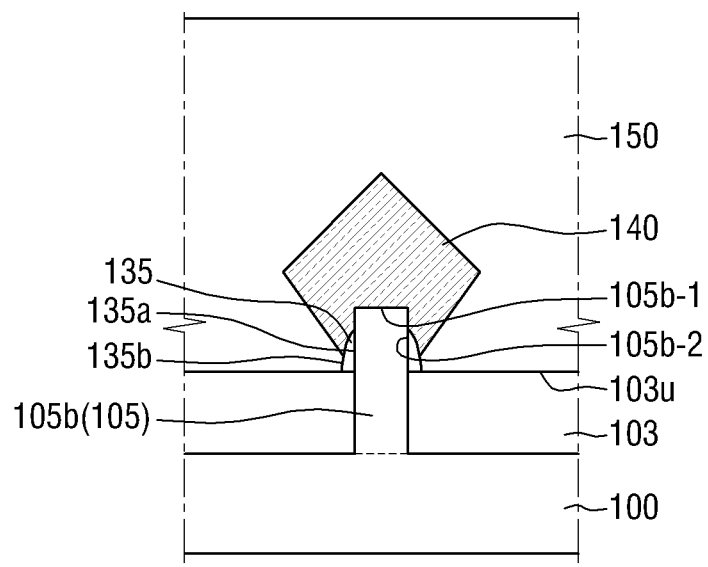
FIG. 11 is a cross-sectional view taken along the line C-C of FIG. 10.

Referring to FIGS. 10 and 11, the semiconductor device 3 according to the third example embodiment of the inventive concepts further includes first fin spacers 135.

The first fin spacers 135 are formed on part of sidewalls 105b-2 of a second portion 105b of a first multi-channel active pattern 105 which protrudes further upward than a top surface 103u of a field insulating layer 103. Therefore, part of the second portion 105b of the first multi-channel active pattern 105 protrudes further upward than the first fin spacers 135. That is, part of the sidewalls 105b-2 of the second portion 105b of the first multi-channel active pattern 105 is not covered by the first fin spacers 135.

Since the first fin spacers 135 are formed on the sidewalls 105b-2 of the second portion 105b of the protruding first multi-channel active pattern 105, they extend along a first direction X1. Each of the first fin spacers 135 includes an inner side surface 135a which is adjacent to the second portion 105b of the first multi-channel active pattern 105 and an outer side surface 135b which faces the inner side surface 135a.

The first fin spacers 135 are physically connected to first gate spacers 130 formed on sidewalls of a first gate electrode 120. The first fin spacers 135 and the first gate spacers 130 are connected to each other because they are formed at the same level. Here, the term "the same level" denotes that the first fin spacers 135 and the first gate spaces 130 are formed by the same fabrication process.

The first fin spacers 135 may include at least one of SiN, SiON, SiO$_2$, SiOCN, and combinations of the same. In the drawings, each of the first fin spacers 135 is illustrated as a single layer. However, the inventive concepts are not limited thereto, and each of the first fin spacers 135 can also have a multilayer structure.

First source/drain regions 140 partially surround the first fin spacers 135. In addition, each of the first source/drain regions 140 is formed to contact a top surface 105b-1 and the sidewalls 105b-2 of the second portion 105b of the first multi-channel active pattern 105 which protrudes further upward than the first fin spacers 135.

The first source/drain regions 140 contact the first fin spacers 135 along the outer side surfaces 135b of the first fin spacers 135. Since the first source/drain regions 140 partially cover the first fin spacers 135, they extend along part of the outer side surfaces 135b of the first fin spacers 135. That is, upper parts of the outer side surfaces 135b of the first fin spacers 135 contact the first source/drain regions 140, and lower parts of the outer side surfaces 135b of the first fin spacers 135 do not contact the first source/drain regions 140.

An inner circumferential surface of each of the first source/drain regions 140 contacts the second portion 105b of the first multi-channel active pattern 105 and is formed along the top surface 105b-1 and the sidewalls 105b-2 of the second portion 105b of the first multi-channel active pattern 105 which protrudes further upward than the first fin spacers 135 and along part of the outer side surfaces 135b of the first fin spacers 135.

In the semiconductor device 3 according to the third example embodiment of the inventive concepts, the first source/drain regions 140 do not contact the field insulating layer 103. That is, the first source/drain regions 140 are separated from the field insulating layer 103.

A semiconductor device according to a fourth example embodiment of the inventive concepts will now be described with reference to FIGS. 12 and 13. For simplicity, the fourth embodiment will be described, focusing mainly on differences with the third embodiment described above with reference to FIGS. 10 and 11.

Figure 12:
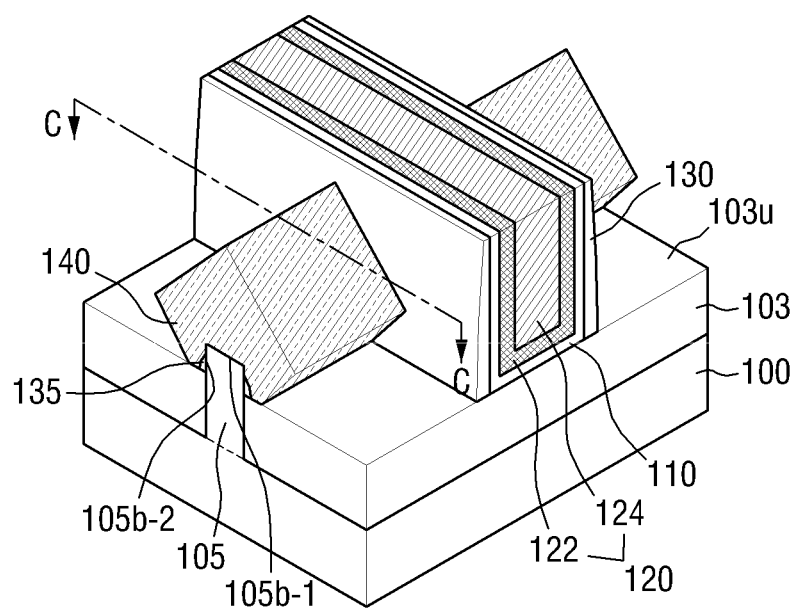
FIG. 12 is a perspective view of a semiconductor device according to a fourth example embodiment of the inventive concepts.

FIG. 12 is a perspective view of a semiconductor device 4 according to a fourth example embodiment of the inventive concepts. FIG. 13 is a cross-sectional view taken along the line C-C of FIG. 12.

Figure 13:
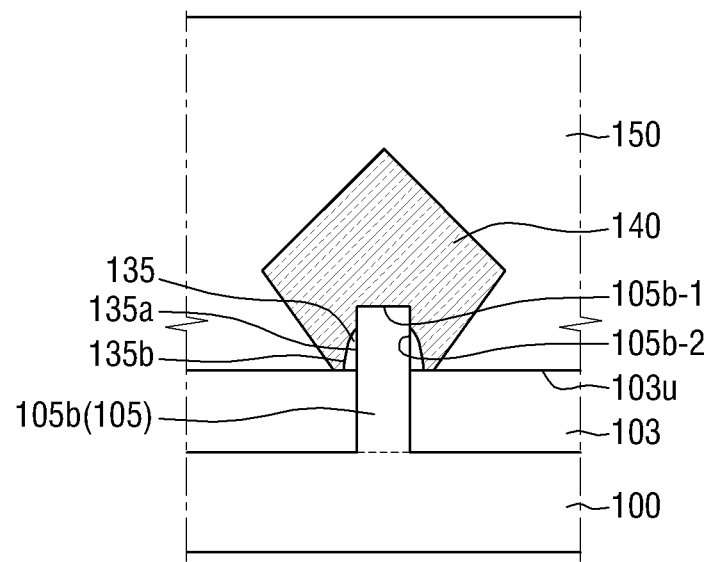
FIG. 13 is a cross-sectional view taken along the line C-C of FIG. 12.

Referring to FIGS. 12 and 13, in the semiconductor device 4 according to the fourth example embodiment of the inventive concepts, first source/drain regions 140 entirely cover first fin spacers 135.

Specifically, the first source/drain regions 140 entirely cover outer side surfaces 135b of the first fin spacers 135. Therefore, the first source/drain regions 140 may contact a field insulating layer 103.

In addition, the first source/drain regions 140 contact the field insulating layer 103 along a top surface 103u of the field insulating layer 103. That is, the first source/drain regions 140 entirely covering the first fin spacers 135 may grow laterally along the top surface 103u of the field insulating layer 103 which is adjacent to the outer side surfaces 135b of the first fin spacers 135. Therefore, surfaces of the first source/drain regions 140 which correspond to the top surface 103u of the field insulating layer 103 extend along the top surface 103u of the field insulating layer 103.

An inner circumferential surface of each of the first source/drain regions 140 contacts a second portion 105b of a first multi-channel active pattern 105 and is formed along a top surface 105b-1 and sidewalls 105b-2 of the second portion 105b of the first multi-channel active pattern 105 which protrudes further upward than the first fin spacers 135 and along the top surface 103u of the field insulating layer 103.

In FIGS. 12 and 13, the first source/drain regions 140 extend along the top surface 103u of the field insulating layer 103. However, the inventive concepts are not limited thereto. That is, a bottommost part of each of the first source/drain regions 140 is formed only in an upward direction Z1 along a boundary between the field insulating layer 103 and the outer side surfaces 135b of the first fin spacers 135. Further, while the bottommost parts of the first source/drain regions 140 contact the top surface 103u of the field insulating layer 103, they may not grow laterally along the top surface 103u of the field insulating layer 103.

A semiconductor device according to a fifth example embodiment of the inventive concepts will now be described with reference to FIGS. 14 through 16. For simplicity, the fifth embodiment will be described, focusing mainly on differences with the first embodiment described above with reference to FIGS. 1 through 4.

Figure 14:
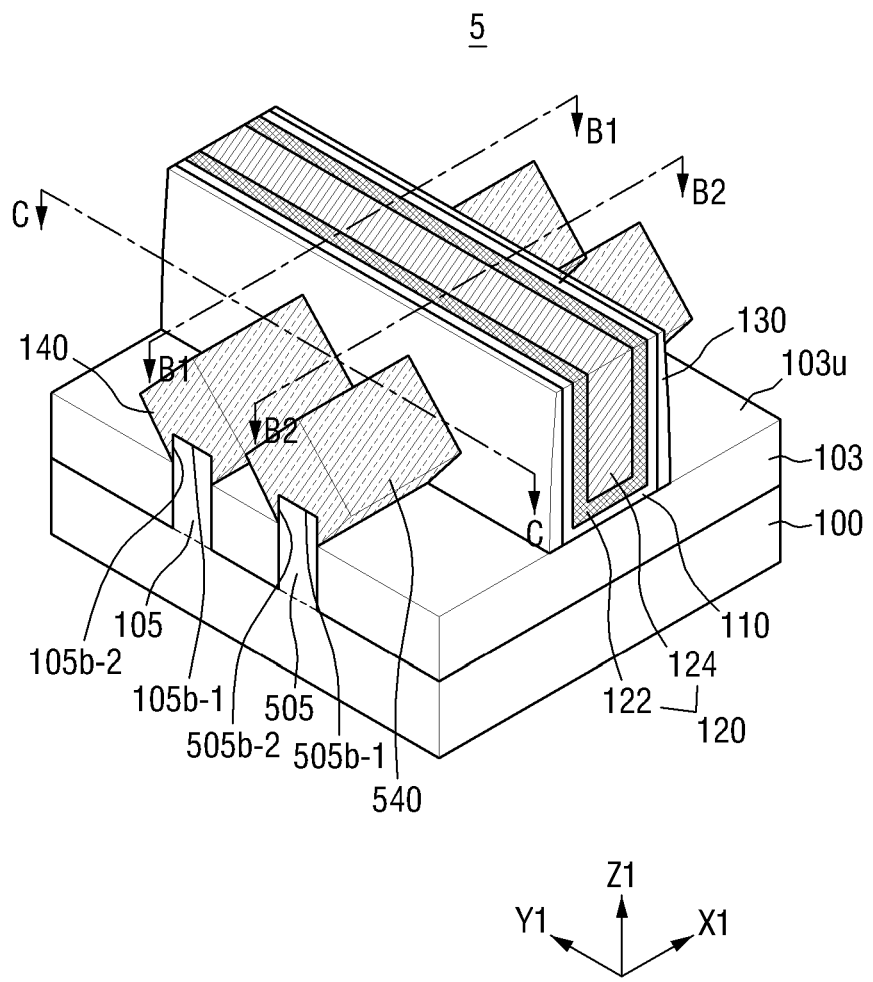
FIG. 14 is a perspective view of a semiconductor device according to a fifth example embodiment of the inventive concepts.

FIG. 14 is a perspective view of a semiconductor device 5 according to a fifth example embodiment of the inventive concepts. FIG. 15 is a cross-sectional view taken along the lines B1-B1 and B2-B2 of FIG. 14. FIG. 16 is a cross-sectional view taken along the line C-C of FIG. 14.

Figure 15:
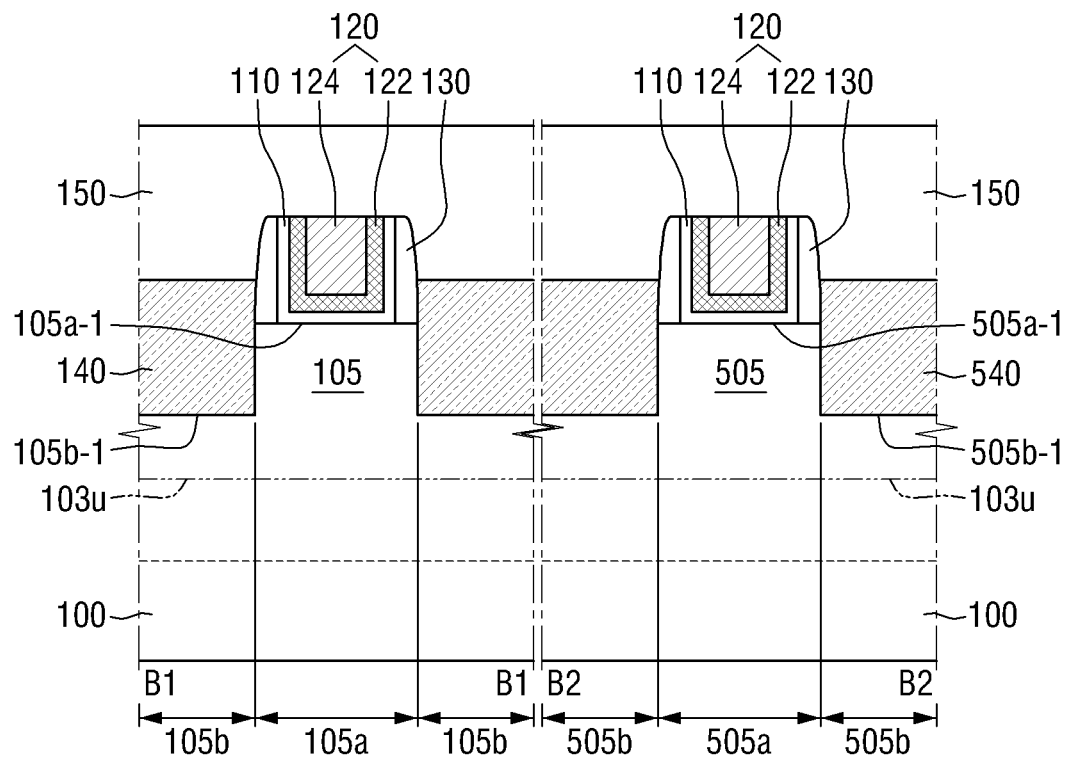
FIG. 15 is a cross-sectional view taken along the lines B1-B1 and B2-B2 of FIG. 14.
Figure 16:
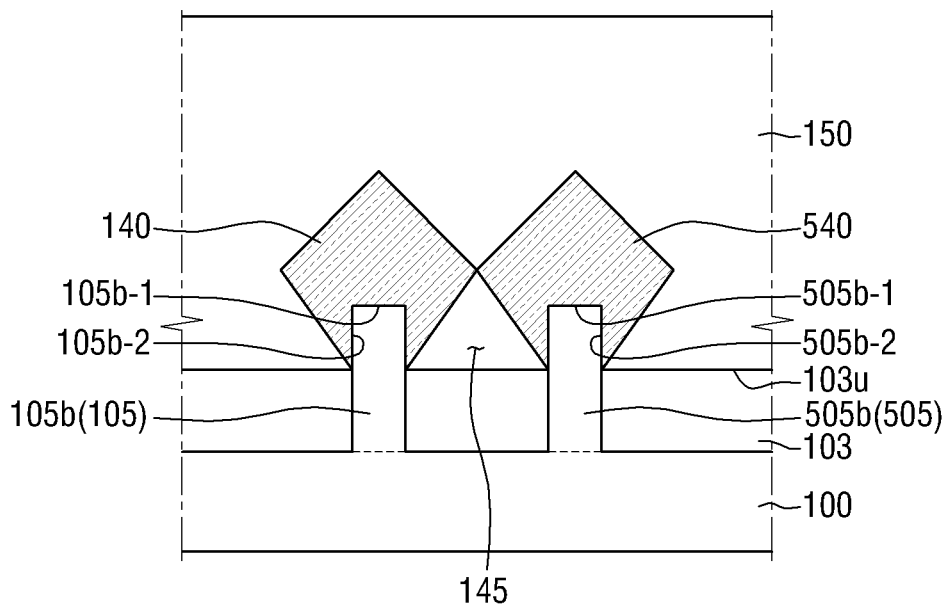
FIG. 16 is a cross-sectional view taken along the line C-C of FIG. 14.

Referring to FIGS. 14 through 16, in the semiconductor device 5 according to the fifth example embodiment of the inventive concepts, a first multi-channel active pattern 105 and a fifth multi-channel active pattern 505 may be formed on a substrate 100 to extend along a first direction X1. The first multi-channel active pattern 105 and the fifth multi-channel active pattern 505 are formed adjacent to each other with a field insulating layer 103 interposed therebetween.

The fifth multi-channel active pattern 505 protrudes further upward than the field insulating layer 103 formed on the substrate 100. Like the first multi-channel active pattern 105, the fifth multi-channel active pattern 505 is defined by the field insulating layer 103.

The fifth multi-channel active pattern 505 includes a first portion 505a and a second portion 505b. The second portion 505*b* of the fifth multi-channel active pattern 505 is disposed on both sides of the first portion 505*a* of the fifth multi-channel active pattern 505 in the first direction X1.

A top surface 505*b*-1 of the second portion 505*b* of the fifth multi-channel active pattern 505 and a top surface 505*a*-1 of the first portion 505*a* of the fifth multi-channel active pattern 505 protrude further upward than a top surface 103*u* of the field insulating layer 103. That is, the first portion 505*a* of the fifth multi-channel active pattern 505 and the second portion 505*b* of the fifth multi-channel active pattern 505 protrude further upward than the field insulating layer 103. The second portion 505*b* of the fifth multi-channel active pattern 505 is more recessed than the first portion 505*a* of the fifth multi-channel active pattern 505.

A first gate electrode 120 may extend along a second direction Y1 to intersect the first multi-channel active pattern 105 and the fifth multi-channel active pattern 505. The first gate electrode 120 may be formed on the first multi-channel active pattern 105, the fifth multi-channel active pattern 505, and the field insulating layer 103. The first gate electrode 120 is formed on a first portion 105*a* of the first multi-channel active pattern 105 and the first portion 505*a* of the fifth multi-channel active pattern 505.

Fifth source/drain regions 540 are formed on the fifth multi-channel active pattern 505 on both sides of the first gate electrode 120. In other words, each of the fifth source/drain regions 540 is formed on the second portion 505*b* of the fifth multi-channel active pattern 505. An outer circumferential surface of each of the fifth source/drain regions 540 may have various shapes. For example, the outer circumferential surface of each of the fifth source/drain regions 540 may have at least one of a diamond shape, a circular shape, and a rectangular shape. In FIG. 14, the diamond shape (or a pentagonal shape or a hexagonal shape) is illustrated, but the inventive concepts are not limited thereto.

Each of the fifth source/drain regions 540 is formed around the second portion 505*b* of the fifth multi-channel active pattern 505 which protrudes further upward than the top surface 103*u* of the field insulating layer 103. More specifically, each of the fifth source/drain regions 540 is formed on the top surface 505*b*-1 and sidewalls 505*b*-2 of the second portion 505*b* of the fifth multi-channel active pattern 505 which protrudes further upward than the top surface 103*u* of the field insulating layer 103.

The whole of the second portion 505*b* of the fifth multi-channel active pattern 505 which protrudes further upward than the top surface 103*u* of the field insulating layer 103 directly contacts each of the fifth source/drain regions 540. In addition, the fifth source/drain regions 540 contact the field insulating layer 103.

The fifth source/drain regions 540 may have the same conductivity type as first source/drain regions 140. In addition, the fifth source/drain regions 540 may include the same material as the first source/drain regions 140.

In the semiconductor device 5 according to the fifth example embodiment of the inventive concepts, the fifth source/drain regions 540 may contact and be connected to the first source/drain regions 140. That is, the fifth source/drain regions 540 may be electrically connected to the first source/drain regions 140.

Since the first source/drain regions 140 contact the fifth source/drain regions 540, an interlayer insulating layer 150 may not be formed between the first source/drain regions 140 and the fifth source/drain regions 540. Accordingly, an air gap 145 may be formed.

As in the fifth example embodiment of the inventive concepts, after a plurality of multi-channel active patterns are partially exposed, if source/drain regions are formed on each of the multi-channel active patterns, the following effects can be obtained.

That is, after part of side surfaces of each of a plurality of multi-channel active patterns and a top surface of each of the multi-channel active patterns are exposed, if source/drain regions are formed on the exposed side and top surfaces of each of the multi-channel active patterns, the size controllability of each of the source/drain regions can be improved. In other words, the source/drain regions disposed adjacent to each other can grow to a uniform size.

Figure 17:
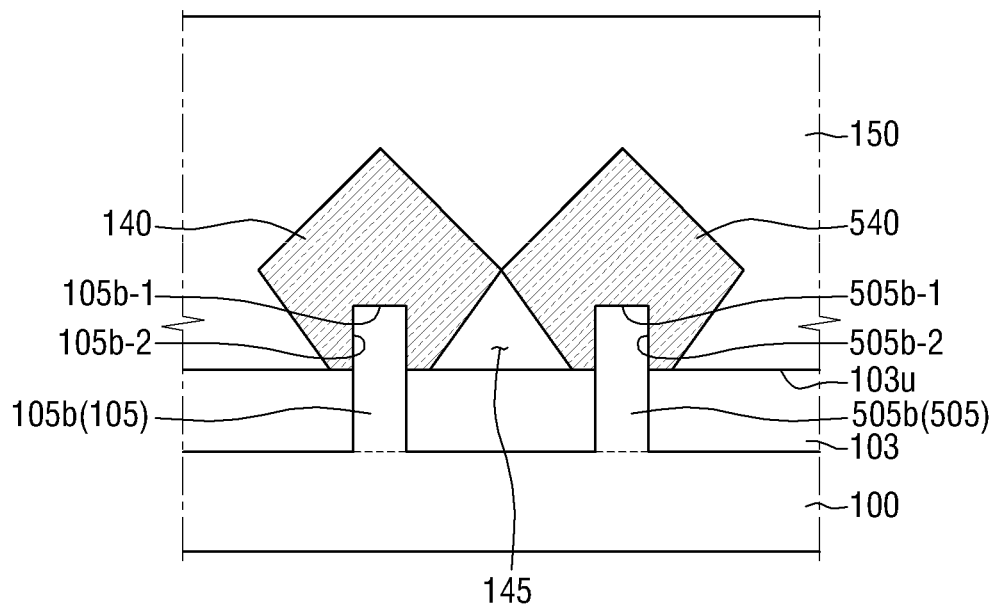
FIG. 17 is a cross-sectional view of a semiconductor device according to a sixth example embodiment of the inventive concepts.

FIG. 17 is a cross-sectional view of a semiconductor device 6 according to a sixth example embodiment of the inventive concepts. For simplicity, the sixth embodiment will be described, focusing mainly on differences with the fifth embodiment described above with reference to FIGS. 14 through 16.

Referring to FIG. 17, in the semiconductor device 6 according to the sixth example embodiment of the inventive concepts, a first source/drain region 140 and a fifth source/drain region 540 contact a field insulating layer 103 along a top surface 103*u* of the field insulating layer 103.

The first source/drain region 140 contacts not only a second portion 105*b* of a first multi-channel active pattern 105 which protrudes further upward than the top surface 103*u* of the field insulating layer 103 but also part of the top surface 103*u* of the field insulating layer 103. Like the first source/drain region 140, the fifth source/drain region 540 contacts not only a second portion 505*b* of a fifth multi-channel active pattern 505 which protrudes further upward than the field insulating layer 103 but also part of the top surface 103*u* of the field insulating layer 103. A surface of the first source/drain region 140 and a surface of the fifth source/drain region 540 which correspond to the field insulating layer 103 extend along the top surface 103*u* of the field insulating layer 103.

Figure 18:
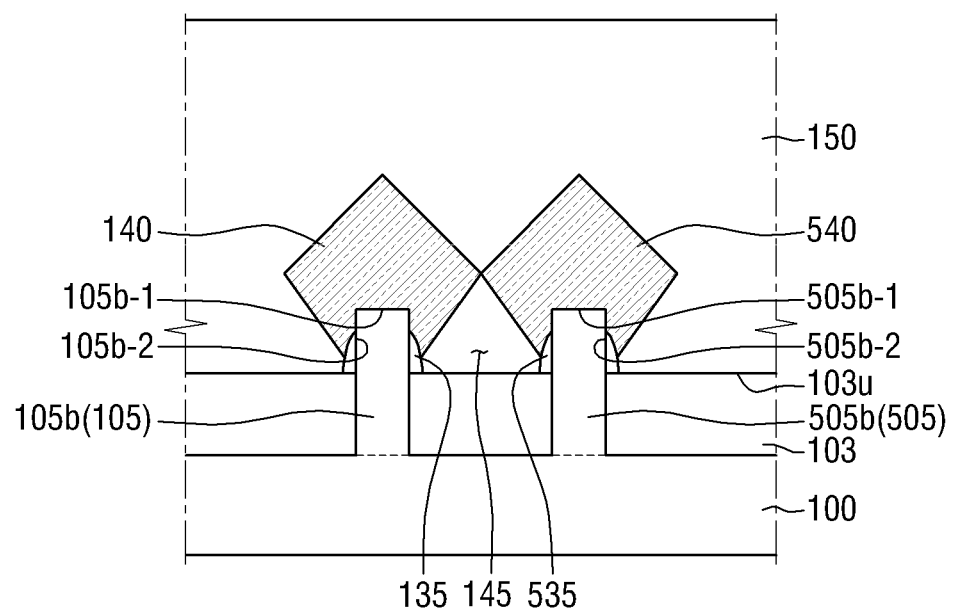
FIG. 18 is a cross-sectional view of a semiconductor device according to a seventh example embodiment of the inventive concepts.

FIG. 18 is a cross-sectional view of a semiconductor device 7 according to a seventh example embodiment of the inventive concepts. For simplicity, the seventh embodiment will be described, focusing mainly on differences with the third and fifth embodiments described above with reference to FIGS. 10, 11 and 14 through 16.

Referring to FIG. 18, the semiconductor device 7 according to the seventh example embodiment of the inventive concepts further includes first fin spacers 135 and fifth fin spacers 535.

The first fin spacers 135 are formed on part of sidewalls 105*b*-2 of a second portion 105*b* of a first multi-channel active pattern 105 which protrudes further upward than a top surface 103*u* of a field insulating layer 103. Thus, part of the second portion 105*b* of the first multi-channel active pattern 105 protrudes further upward than the first fin spacers 135. The fifth fin spacers 535 are formed on part of sidewalls 505*b*-2 of a second portion 505*b* of a fifth multi-channel active pattern 505 which protrudes further upward than the top surface 103*u* of the field insulating layer 103. Thus, part of the second portion 505*b* of the fifth multi-channel active pattern 505 protrudes further upward than the fifth fin spacers 535.

The first fin spacers 135 and the fifth fin spacers 535 extend along a first direction X1. In addition, the first fin spacers 135 and the fifth fin spacers 535 are formed at the same level.

A first source/drain region 140 is formed along part of the first fin spacers 135 and around the second portion 105*b* of the first multi-channel active pattern 105 which protrudes further upward than the first fin spacers 135. A fifth source/ drain regions 540 is formed along part of the fifth fin spacers 535 and around the second portion 505b of the fifth multi-channel active pattern 505 which protrudes further upward than the fifth fin spacers 535.

In the semiconductor device 7 according to the seventh example embodiment of the inventive concepts, the first source/drain region 140 and the fifth source/drain region 540 contact each other. However, the first source/drain region 140 and the fifth source/drain region 540 are separated from the field insulating layer 103.

In the cross-sectional view, an air gap 145 formed between the first source/drain region 140 and the fifth source/drain region 540 may be surrounded by the field insulating layer 103, the first fin spacer 135, the fifth fin spacer 535, the first source/drain region 140, and the fifth source/drain region 540.

Figure 19:
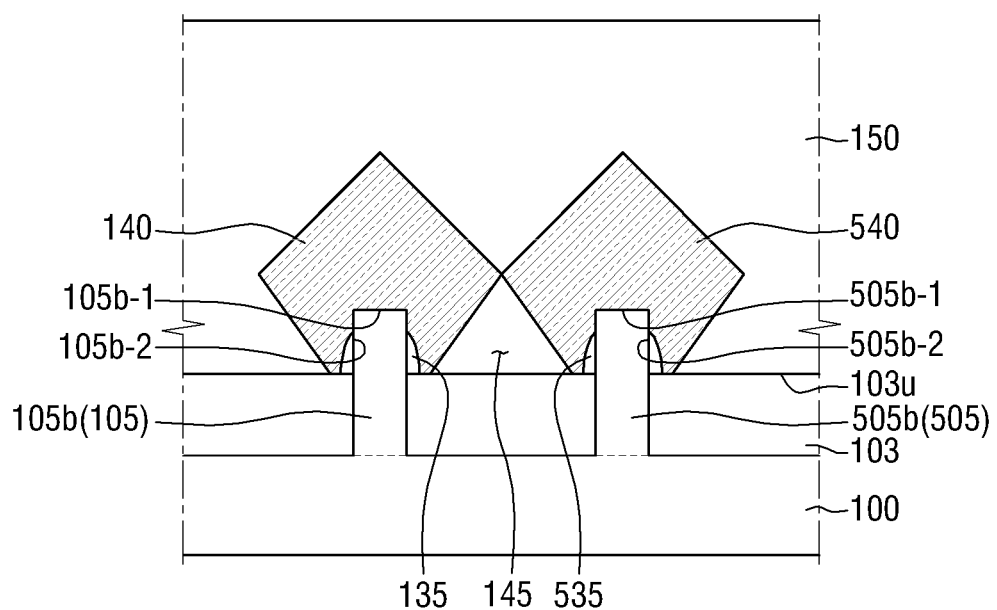
FIG. 19 is a cross-sectional view of a semiconductor device according to an eighth example embodiment of the inventive concepts.

FIG. 19 is a cross-sectional view of a semiconductor device 8 according to an eighth example embodiment of the inventive concepts. For simplicity, the eighth embodiment will be described, focusing mainly on differences with the seventh embodiment described above with reference to FIG. 18.

Referring to FIG. 19, in the semiconductor device 8 according to the eighth example embodiment of the inventive concepts, a first source/drain region 140 entirely covers first fin spacers 135, and a fifth source/drain region 540 entirely covers fifth fin spacers 535.

Therefore, the first source/drain region 140 and the fifth source/drain region 540 may contact a field insulating layer 103. In FIG. 19, the first source/drain region 140 and the fifth source/drain region 540 are grown laterally such that a surface of the first source/drain region 140 and a surface of the fifth source/drain region 540 which correspond to a top surface 103u of the field insulating layer 103 extend along the top surface 103u of the field insulating layer 103, but the inventive concepts are not limited thereto. That is, a bottommost part of the first source/drain region 140 may be formed only in an upward direction Z1 along a boundary between the field insulating layer 103 and the first fin spacers 135. Further, the bottommost part of the first source/drain region 140 contacts the top surface 103u of the field insulating layer 103 but may not grow laterally along the top surface 103u of the field insulating layer 103. Like the first source/drain region 140, the fifth source/drain region 540 contacts the top surface 103u of the field insulating layer 103 but may not grow laterally along the top surface 103u of the field insulating layer 103.

A semiconductor device according to a ninth example embodiment of the inventive concepts will now be described with reference to FIGS. 20 and 21a-21b.

Figure 20:
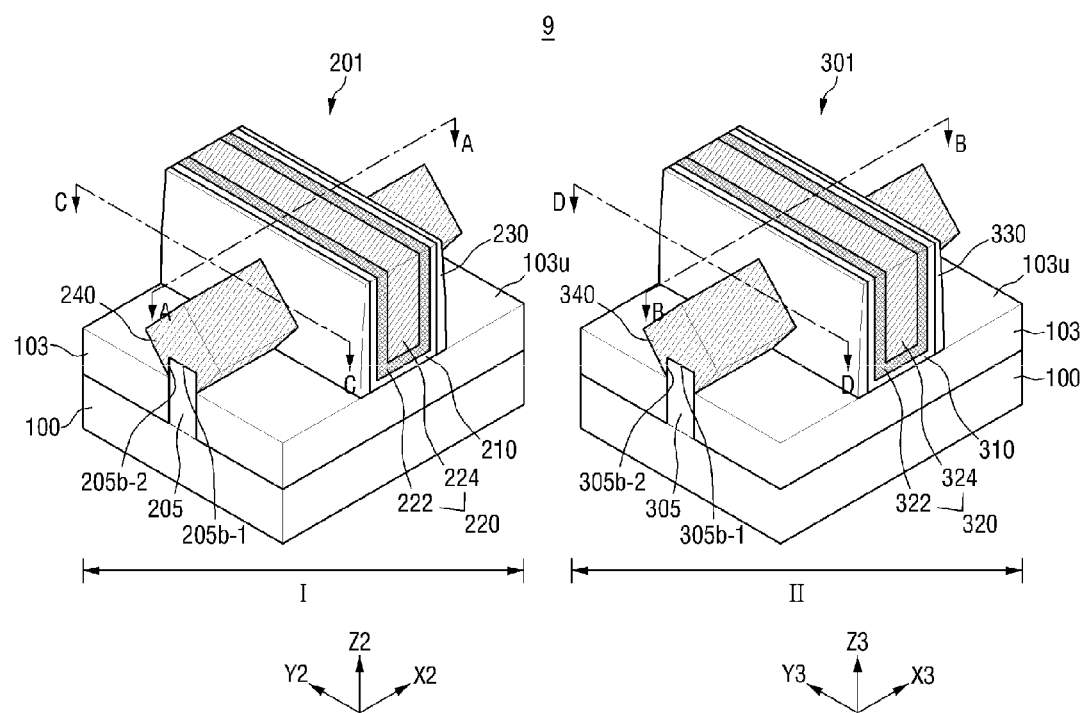
FIG. 20 is a perspective view of a semiconductor device according to a ninth example embodiment of the inventive concepts.

FIG. 20 is a perspective view of a semiconductor device 9 according to a ninth example embodiment of the inventive concepts. FIG. 21a is a cross-sectional view taken along the lines A-A and B-B of FIG. 20. FIG. 21b is a cross-sectional view taken along the lines C-C and D-D of FIG. 20.

Figure 21A:
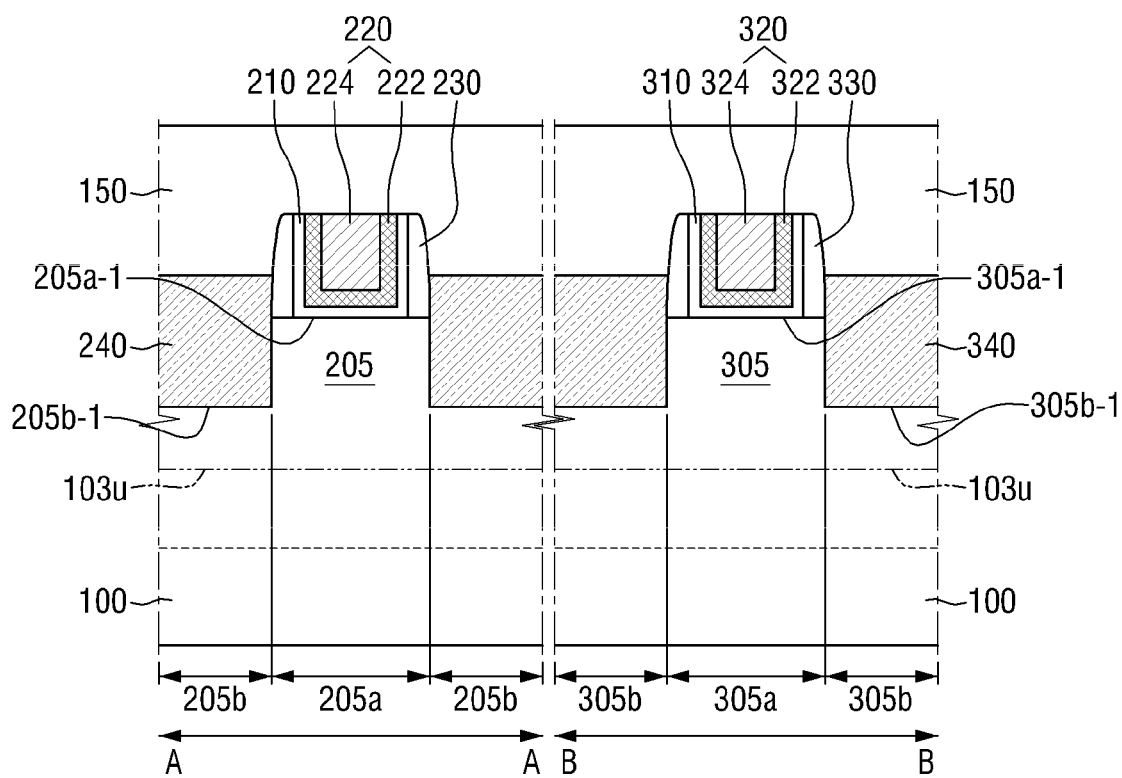
FIGS. 21a and 21b are cross-sectional views taken along the lines A-A, B-B, C-C and D-D of FIG. 20.
Figure 21B:
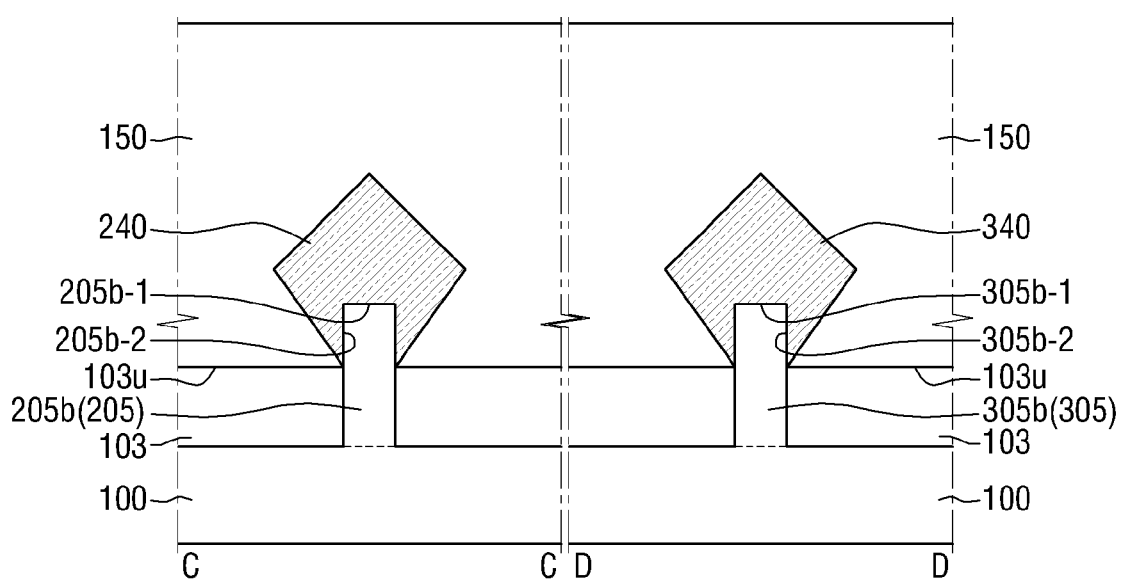

Referring to FIGS. 20, 21a and 21b, the semiconductor device 9 according to the ninth example embodiment of the inventive concepts may include a substrate 100, a second multi-channel active pattern 205, a third multi-channel active pattern 305, a second gate electrode 220, a third gate electrode 320, second source/drain regions 240, third source/drain regions 340 and an interlayer insulating film 150.

The substrate 100 may include a first region I and a second region II. The first region I and the second region II may be separated from each other or may be connected to each other. The first region I may include a P-type transistor region, and the second region II may include an N-type transistor region. That is, a first transistor 201 may be a P-type transistor, and a second transistor 301 may be an N-type transistor. Therefore, the first transistor 201 is formed in the first region I, and the second transistor 301 is formed in the second region II.

The first transistor 201 includes the second multi-channel active pattern 205, the second gate electrode 220, and the second source/drain regions 240.

The second multi-channel active pattern 205 may be defined by a field insulating layer 103 and extend along a third direction X2. As shown in FIG. 21a, the second multi-channel active pattern 205 includes a first portion 205a and a second portion 205b. The second portion 205b of the second multi-channel active pattern 205 is disposed on both sides of the first portion 205a of the second multi-channel active pattern 205 in the third direction X2.

A top surface 205b-1 of the second portion 205b of the second multi-channel active pattern 205 and a top surface 205a-1 of the first portion 205a of the second multi-channel active pattern 205 may protrude further upward than a top surface 103u of the field insulating layer 103. That is, the first portion 205a of the second multi-channel active pattern 205 and the second portion 205b of the second multi-channel active pattern 205 may protrude further upward than the field insulating layer 103. The second portion 205b of the second multi-channel active pattern 205 is more recessed than the first portion 205a of the second multi-channel active pattern 205.

The profile of sidewalls of the second portion 205b of the second multi-channel active pattern 205 is continuous. Specifically, the second portion 205b of the second multi-channel active pattern 205 includes a portion which contacts the field insulating layer 103 and a portion which protrudes further upward than the field insulating layer 103 without contacting the field insulating layer 103. Here, the profile of sidewalls of the second portion 205b of the second multi-channel active pattern 205 which contacts the field insulating layer 103 is continuous with the profile of sidewalls 205b-2 of the second portion 205b of the second multi-channel active pattern 205 which protrudes further upward than the field insulating layer 103.

The second gate electrode 220 may extend along a fourth direction Y2 and intersect the second multi-channel active pattern 205. The second gate electrode 220 may be formed on the second multi-channel active pattern 205, more specifically, the first portion 205a of the second multi-channel active pattern 205. The second gate electrode 220 may include metal layers (222, 224). As illustrated in the drawings, the second gate electrode 220 may be a stack of two or more metal layers (222, 224). The second gate electrode 220 may include a material included in the first gate electrode 120 described above with reference to FIGS. 1 through 4.

The second source/drain regions 240 are formed on the second multi-channel active pattern 205 on both sides of the second gate electrode 220. In other words, each of the second source/drain regions 240 is formed on the second portion 205b of the second multi-channel active pattern 205.

Each of the second source/drain regions 240 is formed around the second portion 205b of the second multi-channel active pattern 205 which protrudes further upward than the top surface 103u of the field insulating layer 103. More specifically, each of the second source/drain regions 240 is formed on the top surface 205b-1 and the sidewalls 205b-2 of the second portion 205b of the second multi-channel active pattern 205 which protrudes further upward than the top surface 103u of the field insulating layer 103.

The whole of the second portion 205b of the second multi-channel active pattern 205 which protrudes further upward than the top surface 103u of the field insulating layer 103 contacts each of the second source/drain regions 240. In addition, the second source/drain regions 240 contact the field insulating layer 103.

The second transistor 301 includes the third multi-channel active pattern 305, the third gate electrode 320, and the third source/drain regions 340.

The third multi-channel active pattern 305 may be defined by the field insulating layer 103 and extend along a fifth direction X3. As shown in FIG. 21a, the third multi-channel active pattern 305 includes a first portion 305a and a second portion 305b. The second portion 305b of the third multi-channel active pattern 305 is disposed on both sides of the first portion 305a of the third multi-channel active pattern 305 in the fifth direction X3.

A top surface 305b-1 of the second portion 305b of the third multi-channel active pattern 305 and a top surface 305a-1 of the first portion 305a of the third multi-channel active pattern 305 may protrude further upward than the top surface 103u of the field insulating layer 103. Further, the second portion 305b of the third multi-channel active pattern 305 is more recessed than the first portion 305a of the third multi-channel active pattern 305.

The profile of sidewalls of the second portion 305b of the third multi-channel active pattern 305 is continuous. Specifically, the second portion 305b of the third multi-channel active pattern 305 includes a portion which contacts the field insulating layer 103 and a portion which protrudes further upward than the field insulating layer 103 without contacting the field insulating layer 103. Here, the profile of sidewalls of the second portion 305b of the third multi-channel active pattern 305 which contacts the field insulating layer 103 is continuous with the profile of sidewalls 305b-2 of the second portion 305b of the third multi-channel active pattern 305 which protrudes further upward than the field insulating layer 103.

The third gate electrode 320 may extend along a sixth direction Y3 and intersect the third multi-channel active pattern 305. The third gate electrode 320 may be formed on the first portion 305a of the third multi-channel active pattern 305. The third gate electrode 320 may include metal layers (322, 324). As illustrated in the drawings, the third gate electrode 320 may be a stack of two or more metal layers (322, 324). The third gate electrode 320 may include a material included in the first gate electrode 120 described above with reference to FIGS. 1 through 4.

The third source/drain regions 340 are formed on the third multi-channel active pattern 305 on both sides of the third gate electrode 320. In other words, each of the third source/drain regions 340 is formed on the second portion 305b of the third multi-channel active pattern 305.

Each of the third source/drain regions 340 is formed around the second portion 305b of the third multi-channel active pattern 305 which protrudes further upward than the top surface 103u of the field insulating layer 103. More specifically, each of the third source/drain regions 340 is formed on the top surface 305b-1 and the sidewalls 305b-2 of the second portion 305b of the third multi-channel active pattern 305 which protrudes further upward than the top surface 103u of the field insulating layer 103.

The whole of the second portion 305b of the third multi-channel active pattern 305 which protrudes further upward than the top surface 103u of the field insulating layer 103 contacts each of the third source/drain regions 340. In addition, the third source/drain regions 340 contact the field insulating layer 103.

In the semiconductor device 9 according to the ninth example embodiment of the inventive concepts, the second source/drain regions 240 which contact the field insulating layer 103 are formed higher (in an upward direction Z2) than a boundary between the second multi-channel active pattern 205 and the field insulating layer 103. That is, a bottommost part of each of the source/drain regions 240 is formed along the boundary between the field insulating layer 103 and the second multi-channel active pattern 205. Further, the third source/drain regions 340 which contact the field insulating layer 103 are formed higher (in an upward direction Z3) than a boundary between the third multi-channel active pattern 305 and the field insulating layer 103. That is, a bottommost part of each of the third source/drain regions 340 is formed along the boundary between the field insulating layer 103 and the third multi-channel active pattern 305.

Figure 22:
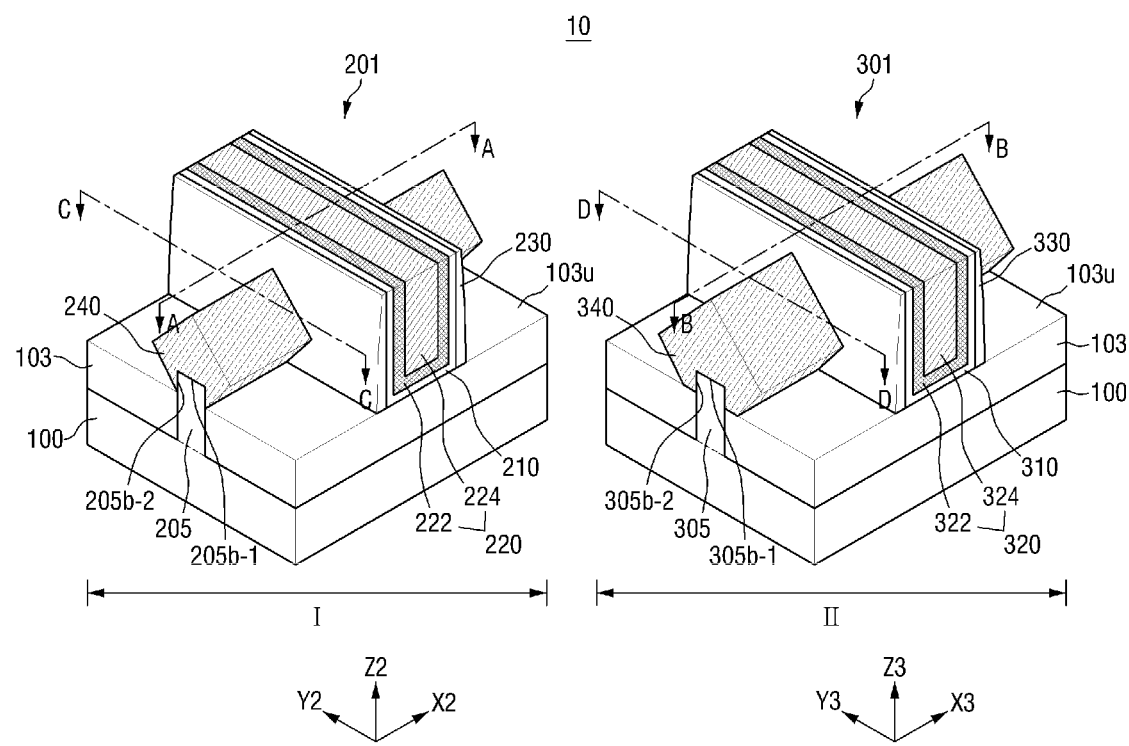
FIG. 22 is a perspective view of a semiconductor device according to a tenth example embodiment of the inventive concepts.
Figure 23A:
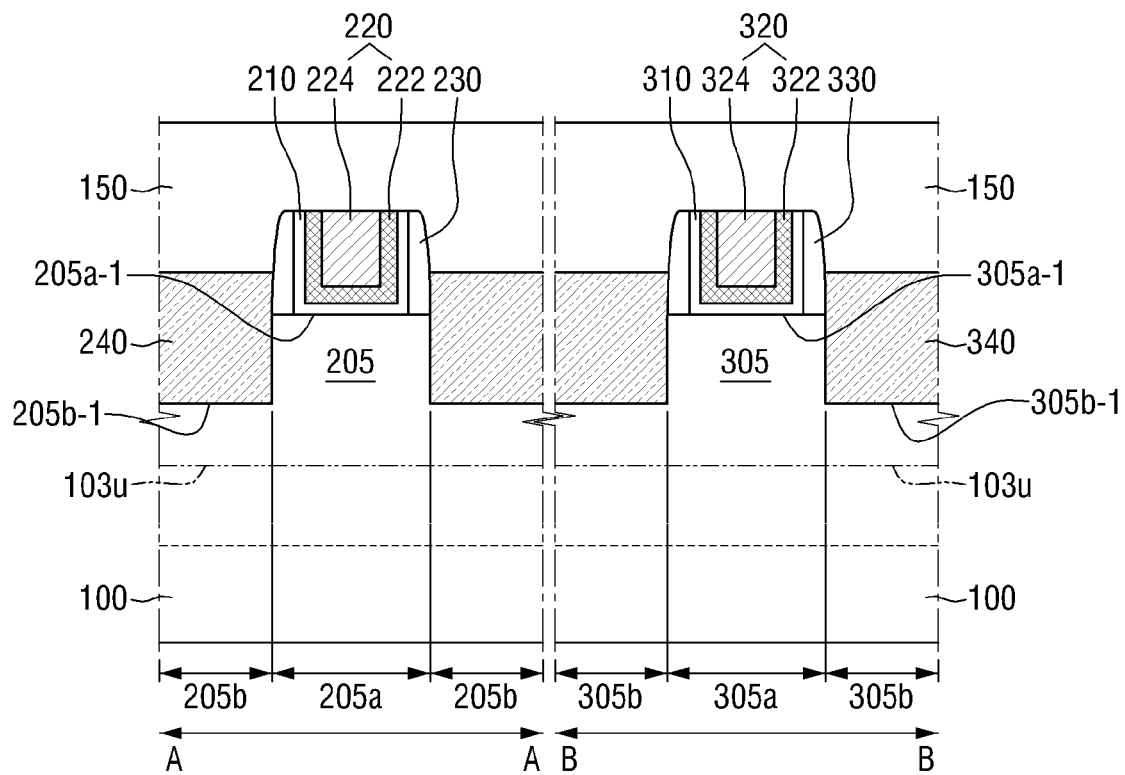
FIGS. 23a and 23b are cross-sectional views taken along the lines A-A, B-B, C-C and D-D of FIG. 22.
Figure 23B:
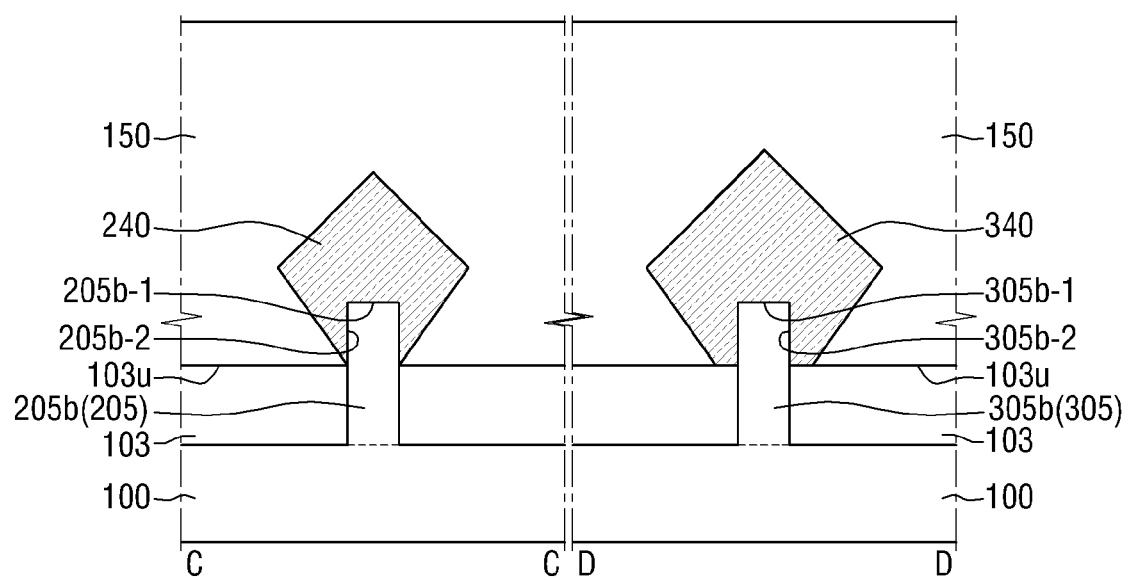

FIG. 22 is a perspective view of a semiconductor device 10 according to a tenth example embodiment of the inventive concepts. FIG. 23a is a cross-sectional view taken along the lines A-A and B-B of FIG. 22. FIG. 23b is a cross-sectional view taken along the lines C-C and D-D of FIG. 22. For simplicity, the tenth embodiment will be described, focusing mainly on differences with the ninth embodiment described above with reference to FIGS. 20 and 21.

Referring to FIGS. 22, 23a and 23b, in the semiconductor device 10 according to the tenth example embodiment of the inventive concepts, third source/drain regions 340 contact a field insulating layer 103 along a top surface 103u of the field insulating layer 103.

Each of the third source/drain regions 340 contacts not only a second portion 305b of a third multi-channel active pattern 305 which protrudes further upward than the top surface 103u of the field insulating layer 103 but also part of the top surface 103u of the field insulating layer 103. Surfaces of the third source/drain regions 340 which correspond to the field insulating layer 103 extend along the top surface 103u of the field insulating layer 103. That is, bottommost surfaces of the third source/drain regions 340 may be formed by lateral growth of the third source/drain regions 340 along part of the top surface 103u of the field insulating layer 103.

On the other hand, bottommost parts of second source/drain regions 240 are formed along a boundary between the field insulating layer 103 and a second multi-channel active pattern 205. That is, the bottommost parts of the second source/drain regions 240 do not grow laterally along the top surface 103u of the field insulating layer 103.

Therefore, in the semiconductor device 10 according to the tenth example embodiment of the inventive concepts, the area of a first region in which the second source/drain regions 240 contact the field insulating layer 103 is different from the area of a second region in which the third source/drain regions 340 contact the field insulating layer 103. For example, the area of the second region in which the third source/drain regions 340 contact the field insulating layer 103 is greater than the area of the first region in which the second source/drain regions 240 contact the field insulating layer 103. This difference in contact area varies according to whether the second source/drain regions 240 and the third source/drain regions 340 grow laterally along the top surface 103u of the field insulating layer 103.

Figure 24:
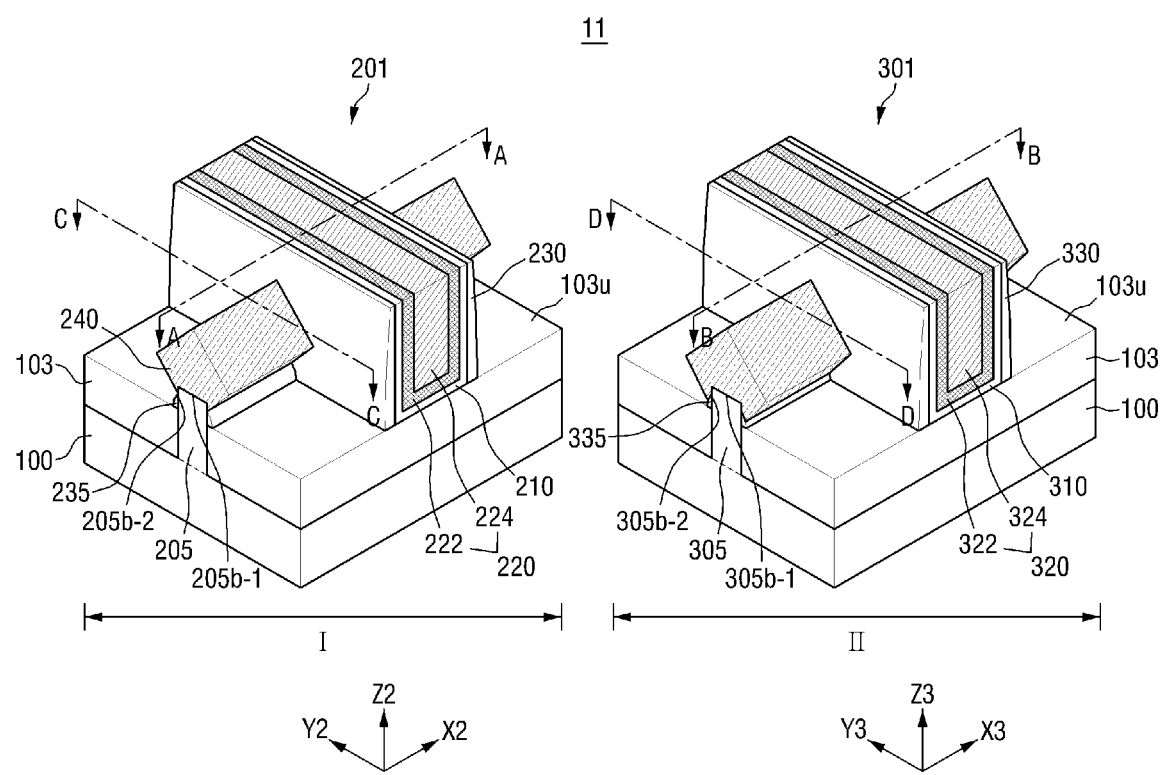
FIG. 24 is a perspective view of a semiconductor device according to an eleventh example embodiment of the inventive concepts.
Figure 25A:
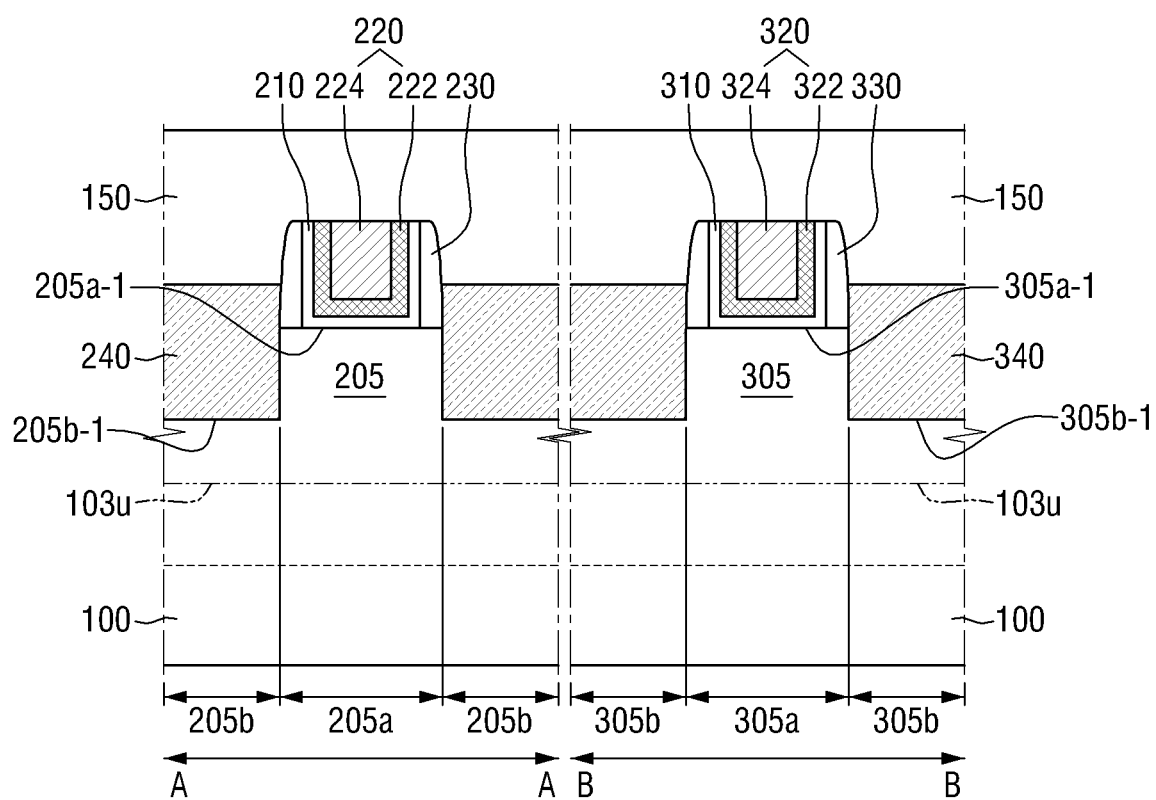
FIGS. 25a and 25b are cross-sectional views taken along the lines A-A, B-B, C-C and D-D of FIG. 24.
Figure 25B:
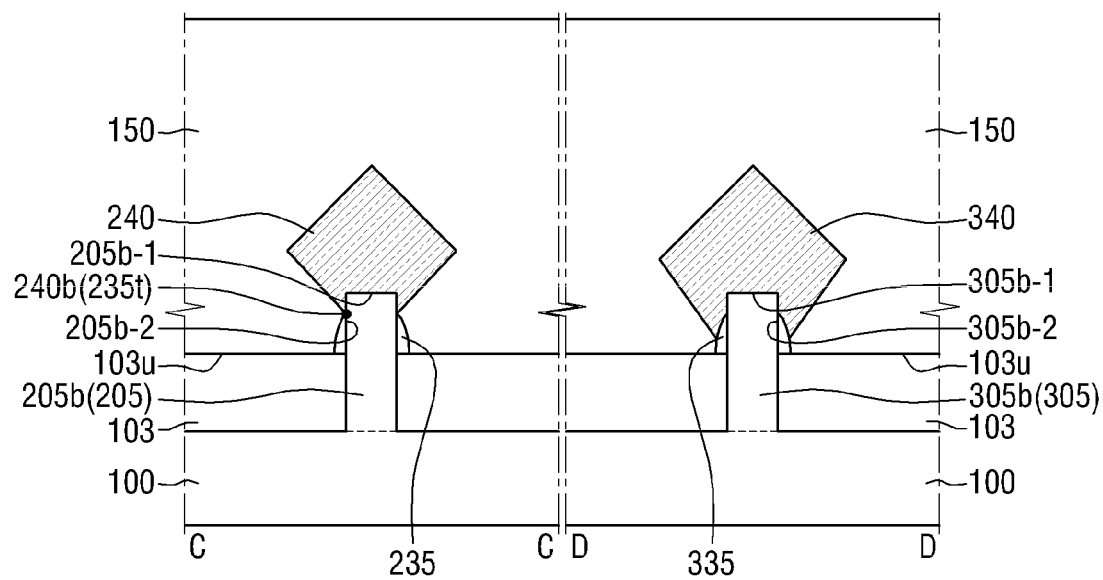

FIG. 24 is a perspective view of a semiconductor device 11 according to an eleventh example embodiment of the inventive concepts. FIG. 25a is a cross-sectional view taken along the lines A-A and B-B of FIG. 24. FIG. 25b is a cross-sectional view taken along the lines C-C and D-D of FIG. 24. For simplicity, the eleventh embodiment will be described, focusing mainly on differences with the ninth embodiment described above with reference to FIGS. 20 and 21.

Referring to FIGS. 24, 25a and 25b, in the semiconductor device 11 according to the eleventh example embodiment of the inventive concepts, a first transistor 201 further includes second fin spacers 235, and a second transistor 301 further includes third fin spacers 335.

In the first transistor 201, the second fin spacers 235 are formed on part of sidewalls 205b-2 of a second portion 205b of a second multi-channel active pattern 205 which protrudes further upward than a top surface 103u of a field insulating layer 103. Therefore, part of the second portion 205b of the second multi-channel active pattern 205 protrudes further upward than the second fin spacers 235.

The second fin spacers 235 and second gate spacers 230 are formed at the same level and are connected to each other.

Second source/drain regions 240 are formed on a top surface 205b-1 and the sidewalls 205b-2 of the second portion 205b of the second multi-channel active pattern 205 which protrudes further than the second fin spacers 235. Each of the second source/drain regions 240 is formed around the second portion 205b of the second multi-channel active pattern 205 which protrudes further upward than the second fin spacers 235 to contact the second portion 205b.

In the semiconductor device 11 according to the eleventh example embodiment of the inventive concepts, bottommost parts 240b of the second source/drain regions 240 may be formed along topmost parts 235t of the second fin spacers 235. That is, the second source/drain regions 240 may not extend along outer side surfaces of the second fin spacers 235.

In the second transistor 301, the third fin spacers 335 are formed on part of sidewalls 305b-2 of a second portion 305b of a third multi-channel active pattern 305 which protrudes further upward than the top surface 103u of the field insulating layer 103. Therefore, part of the second portion 305b of the third multi-channel active pattern 305 protrudes further upward than the third fin spacers 335.

The third fin spacers 335 and third gate spacers 330 are formed at the same level and are connected to each other.

In the second transistor 301, third source/drain regions 304 partially cover the third fin spacers 335. In addition, the third source/drain regions 340 are formed to contact a top surface 305b-1 and the sidewalls 305b-2 of the second portion 305b of the third multi-channel active pattern 305 which protrudes further upward than the third fin spacers 335. The third source/drain regions 340 are formed around the second portion 305b of the third multi-channel active pattern 305 which protrudes further upward than the third fin spacers 335 to contact the second portion 305b.

The third source/drain regions 340 contact the third fin spacers 335 along outer side surfaces of the third fin spacers 335. Since the third source/drain regions 340 partially cover the third fin spacers 335, they extend along part of the outer side surfaces of the third fin spacers 335.

In the semiconductor device 11 according to the eleventh example embodiment of the inventive concepts, the second source/drain regions 240 and the third source/drain regions are separated from the field insulating layer 103 without contacting the field insulating layer 103. Assuming that a height from the top surface 103u of the field insulating layer 103 to the topmost parts 235t of the second fin spacers 235 is equal to a height from the top surface 103u of the field insulating layer 103 to topmost parts of the third fin spacers 335, a vertical gap between the second source/drain regions 240 and the field insulating layer 103 is greater than a vertical gap between the third source/drain regions 340 and the field insulating layer 103.

Figure 26:
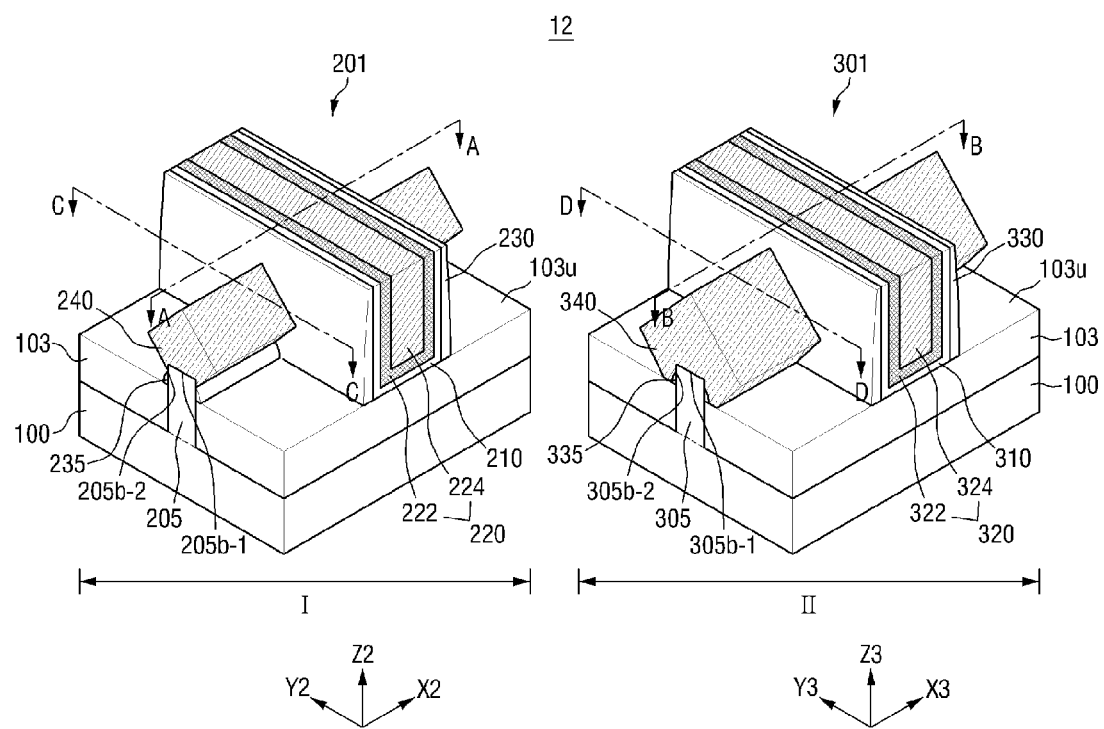
FIG. 26 is a perspective view of a semiconductor device according to a twelfth example embodiment of the inventive concepts.
Figure 27A:
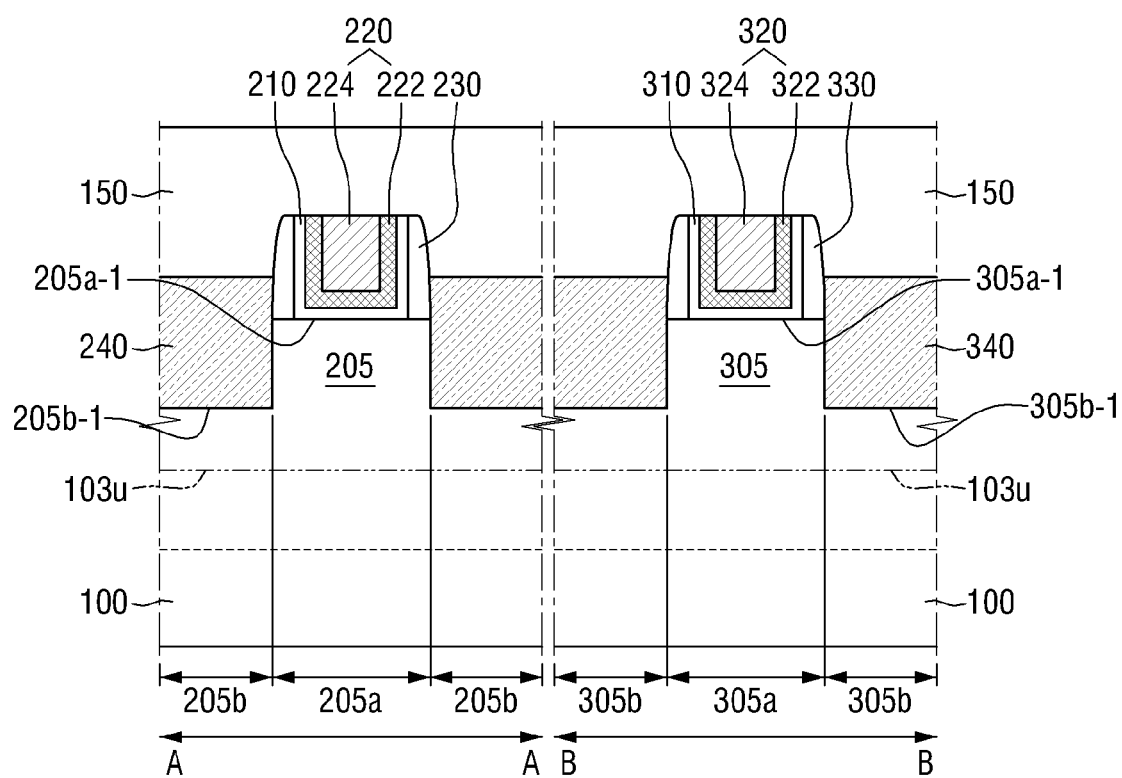
FIGS. 27a and 27b are cross-sectional views taken along the lines A-A, B-B, C-C and D-D of FIG. 26.
Figure 27B:
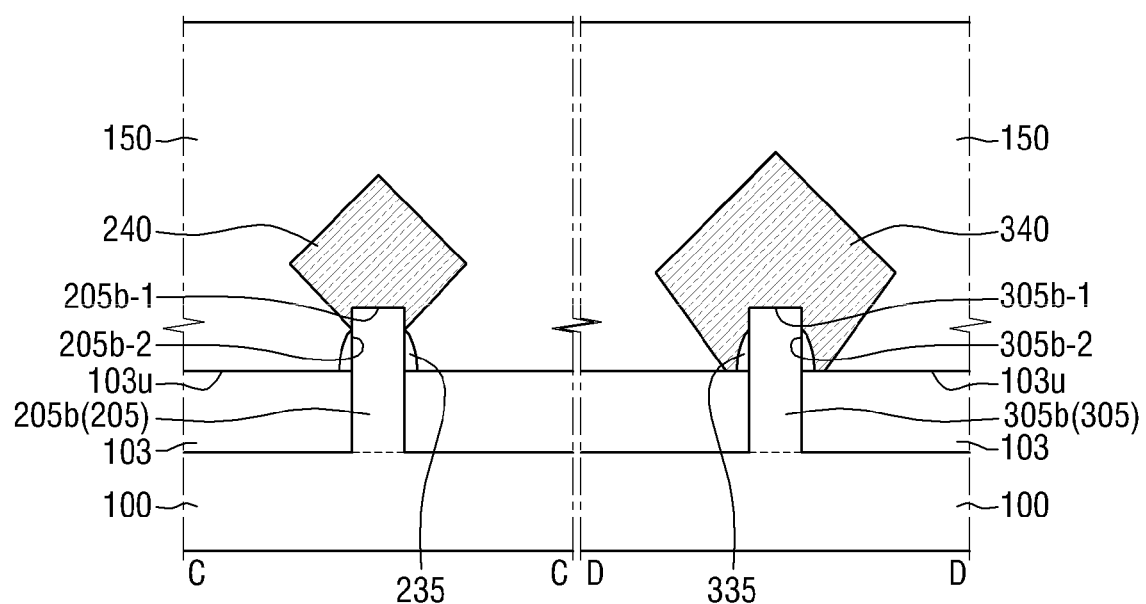

FIG. 26 is a perspective view of a semiconductor device 12 according to a twelfth example embodiment of the inventive concepts. FIG. 27a is a cross-sectional view taken along the lines A-A and B-B of FIG. 26. FIG. 27b is a cross-sectional view taken along the lines C-C and D-D of FIG. 26. For simplicity, the twelfth embodiment will be described, focusing mainly on differences with the eleventh embodiment described above with reference to FIGS. 24 and 25.

Referring to FIGS. 26, 27a and 27b, in the semiconductor device 12 according to the twelfth example embodiment of the inventive concepts, third source/drain regions 340 may entirely cover third fin spacers 335 and contact a field insulating layer 103.

In FIGS. 27a and 27b, in a second transistor 301, the third source/drain regions 340 are grown laterally such that surfaces of the third source/drain regions 340 which correspond to a top surface 103u of the field insulating layer 103 extend along the top surface 103u of the field insulating layer 103, but the inventive concepts are not limited thereto. That is, bottommost parts of the third source/drain regions 340 may contact the top surface 103u of the field insulating layer 103 but may not grow laterally along the top surface 103u of the field insulating layer 103.

A semiconductor device according to a thirteenth example embodiment of the inventive concepts will now be described with reference to FIGS. 28 through 30.

Figure 28:
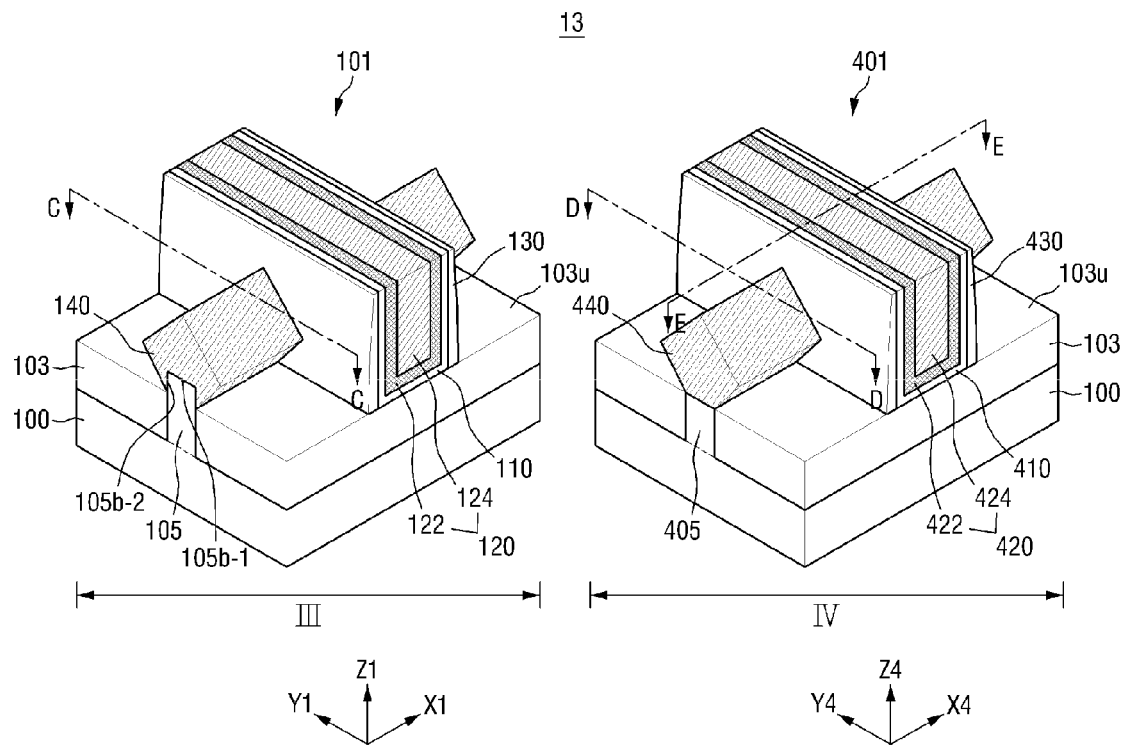
FIG. 28 is a perspective view of a semiconductor device according to a thirteenth example embodiment of the inventive concepts.

FIG. 28 is a perspective view of a semiconductor device 13 according to a thirteenth example embodiment of the inventive concepts. FIG. 29 is a cross-sectional view taken along the lines C-C and D-D of FIG. 28. FIG. 30 is a cross-sectional view taken along the line E-E of FIG. 28.

More specifically, a third transistor 101 formed in a third region III of FIG. 28 may be one of the semiconductor devices 1 and 2 according to the first and second some example embodiments of the inventive concepts. A case where the third transistor 101 formed in the third region III is the semiconductor device 1 according to the first example embodiment of the inventive concepts will be described below as an example.

Figure 29:
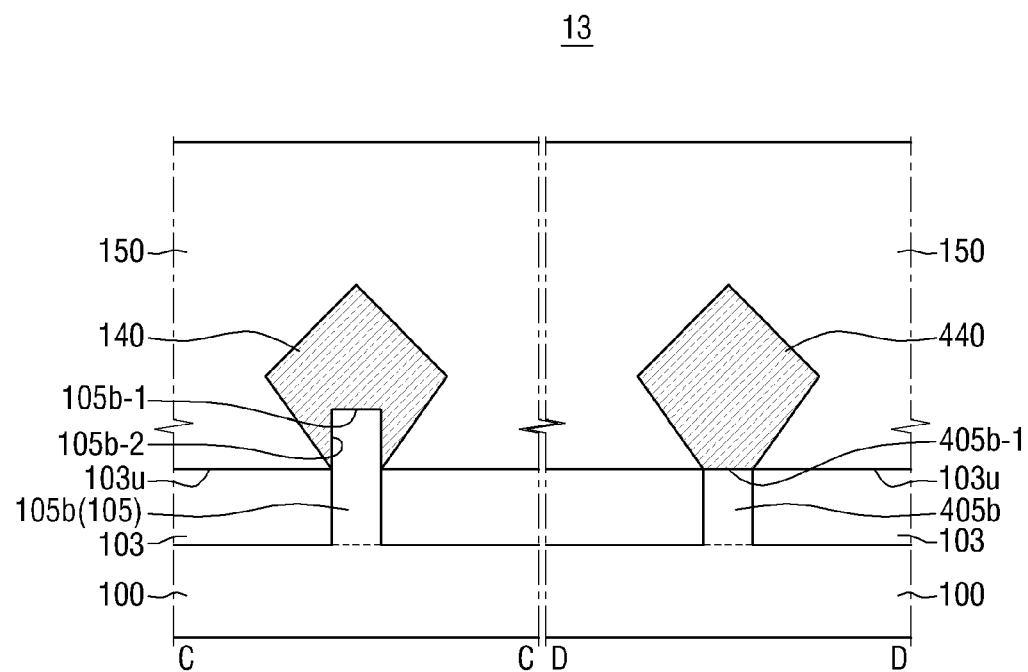
FIG. 29 is a cross-sectional view taken along the lines C-C and D-D of FIG. 28.
Figure 30:
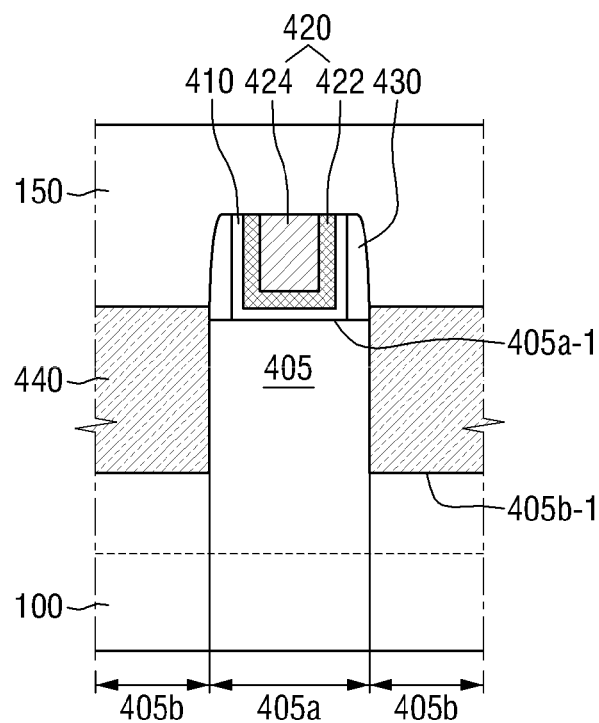
FIG. 30 is a cross-sectional view taken along the line E-E of FIG. 28.

Referring to FIGS. 28 through 30, the semiconductor device 13 according to the thirteenth example embodiment of the inventive concepts may include a substrate 100, a first multi-channel active pattern 105, a fourth multi-channel active pattern 405, a first gate electrode 120, a fourth gate electrode 420, first source/drain regions 140, fourth source/drain regions 440, etc.

The substrate 100 may include the third region III and a fourth region IV. The third region III and the fourth region IV may be separated from each other or may be connected to each other. In addition, the third region III and the fourth region IV may include transistor regions of different types or the same type.

The third transistor 101 includes the first multi-channel active pattern 105, the first gate electrode 120, and the first source/drain regions 140. Since the third transistor 101 has been described above with reference to FIGS. 1 through 4, a repetitive description thereof will be omitted.

A fourth transistor 401 includes the fourth multi-channel active pattern 405, the fourth gate electrode 420, and the fourth source/drain regions 440.

The fourth multi-channel active pattern 405 may be defined by a field insulating layer 103 and extend along a seventh direction X4. The fourth multi-channel active pattern 405 includes a first portion 405a and a second portion 405b. The second portion 405b of the fourth multi-channel active pattern 405 is disposed on both sides of the first portion 405a of the fourth multi-channel active pattern 405 in the seventh direction X4.

A top surface 405a-1 of the first portion 405a of the fourth multi-channel active pattern 405 protrudes further upward than a top surface 103u of the field insulating layer 103. However, a top surface 405b-1 of the second portion 405b of the fourth multi-channel active pattern 405 does not protrude further upward than the top surface 103u of the field insulating layer 103.

For ease of description, the top surface 103u of the field insulating layer 103 is illustrated in the drawings as being flat, and the top surface 405b-1 of the second portion 405b of the fourth multi-channel active pattern 405 is illustrated in the drawings as lying in the same plane with the top surface 103u of the field insulating layer 103.

However, if the top surface 103u of the field insulating layer 103 is not flat, a distance from the substrate 100 to a boundary line between the field insulating layer 103 and the fourth multi-channel active pattern 405 is substantially equal to a height of the top surface 405b-1 of the second portion 405b of the fourth multi-channel active pattern 405.

The fourth gate electrode 420 may extend along an eighth direction Y4 and intersect the fourth multi-channel active pattern 405. The fourth gate electrode 420 is formed on the first portion 405a of the fourth multi-channel active pattern 405.

The fourth source/drain regions 440 are formed on the fourth multi-channel active pattern 405 on both sides of the fourth gate electrode 420. The fourth source/drain regions 440 may contact the field insulating layer 103.

Figure 31:
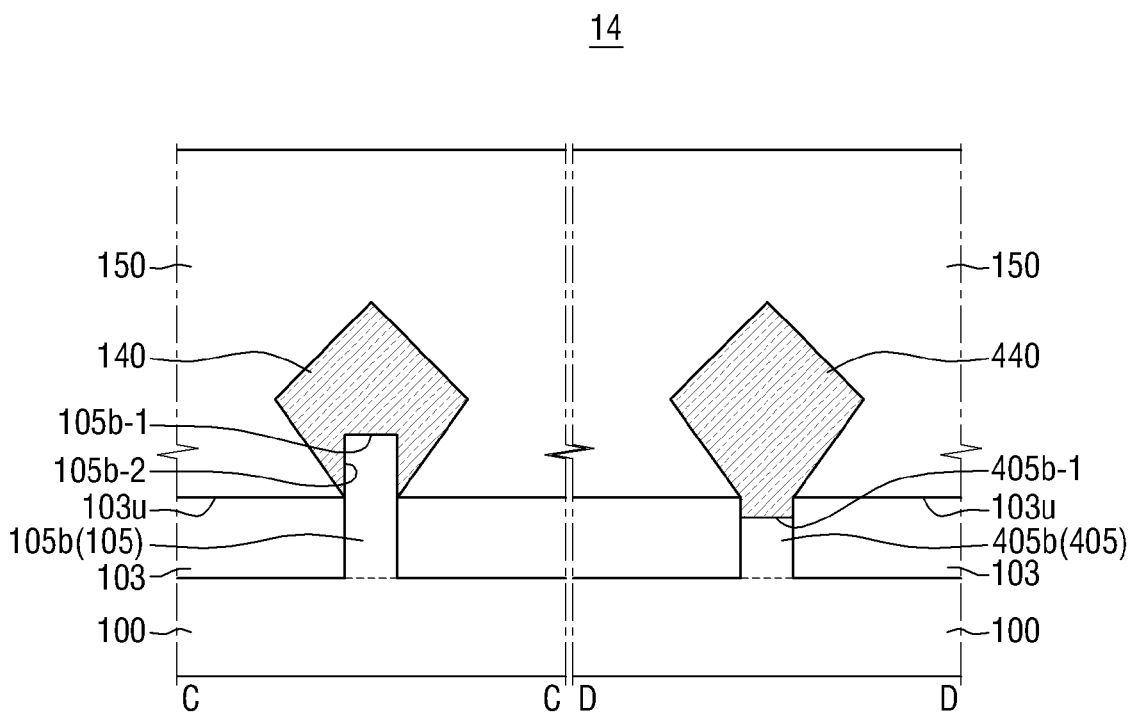
FIG. 31 is a cross-sectional view of a semiconductor device according to a fourteenth example embodiment of the inventive concepts.

FIG. 31 is a cross-sectional view of a semiconductor device 14 according to a fourteenth example embodiment of the inventive concepts. For simplicity, the fourteenth embodiment will be described, focusing mainly on differences with the thirteenth embodiment described above with reference to FIGS. 28 through 30.

Referring to FIG. 31, in the semiconductor device 14 according to the fourteenth example embodiment of the inventive concepts, a top surface 405b-1 of a second portion 405b of a fourth multi-channel active pattern 405 is more recessed than a top surface 103u of a field insulating layer 103.

That is, the top surface 405b-1 of the second portion 405b of the fourth multi-channel active pattern 405 and the top surface 103u of the field insulating layer 103 are discontinuous due to a step formed between them.

Part of a fourth source/drain region 440 formed on the top surface 405b-1 of the second portion 405b of the fourth multi-channel active pattern 405 is surrounded by the field insulating layer 103.

Figure 32:
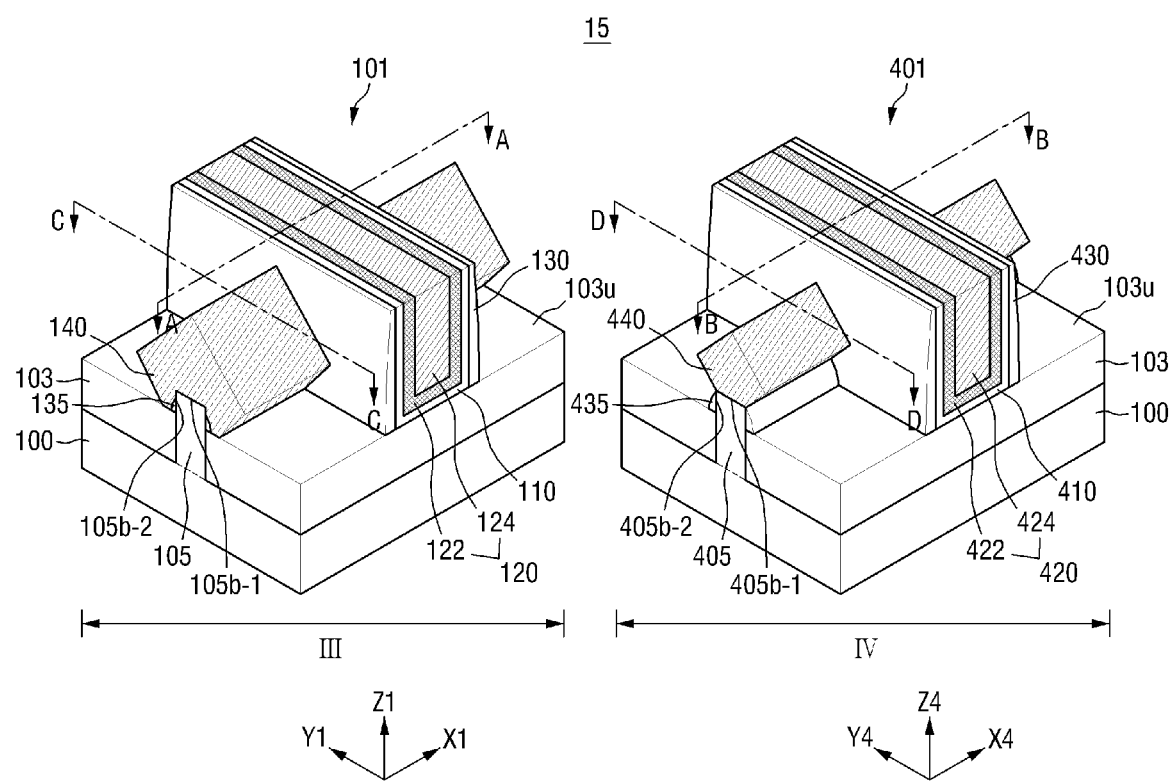
FIG. 32 is a perspective view of a semiconductor device according to a fifteenth example embodiment of the inventive concepts.
Figure 33A:
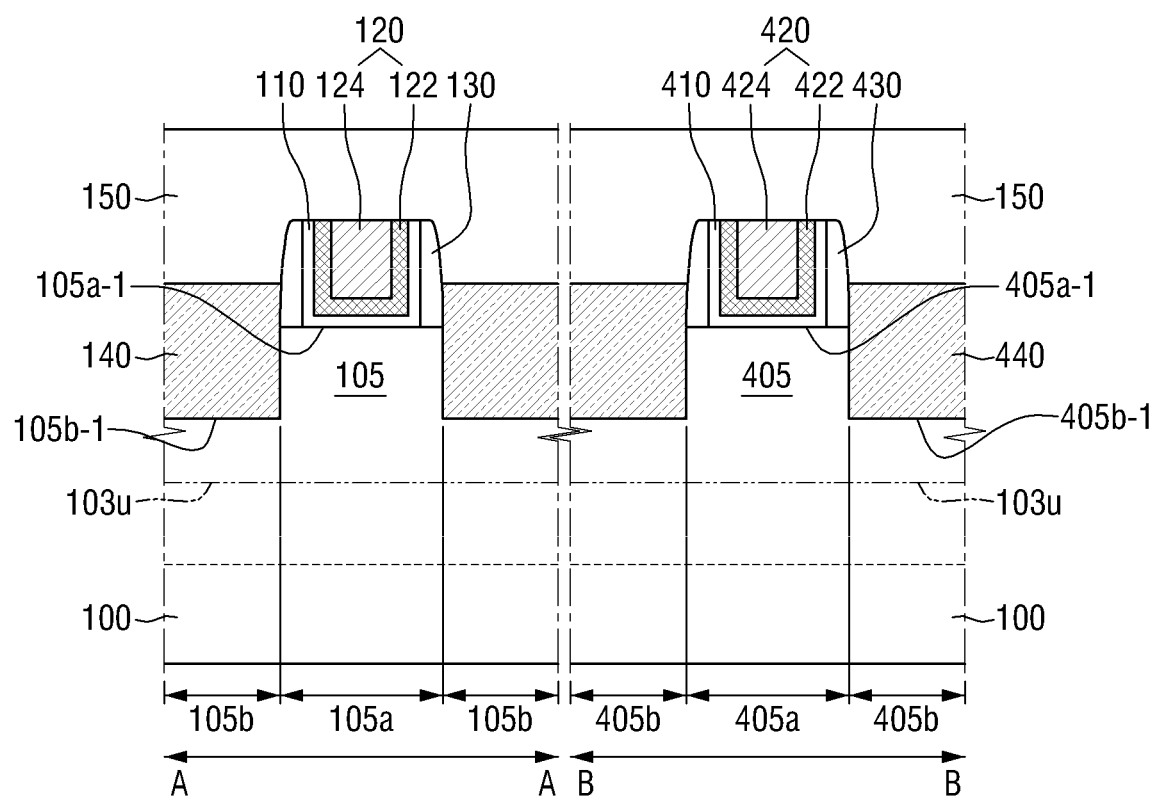
FIGS. 33a and 33b are cross-sectional views taken along the lines A-A, B-B, C-C and D-D of FIG. 32.
Figure 33B:
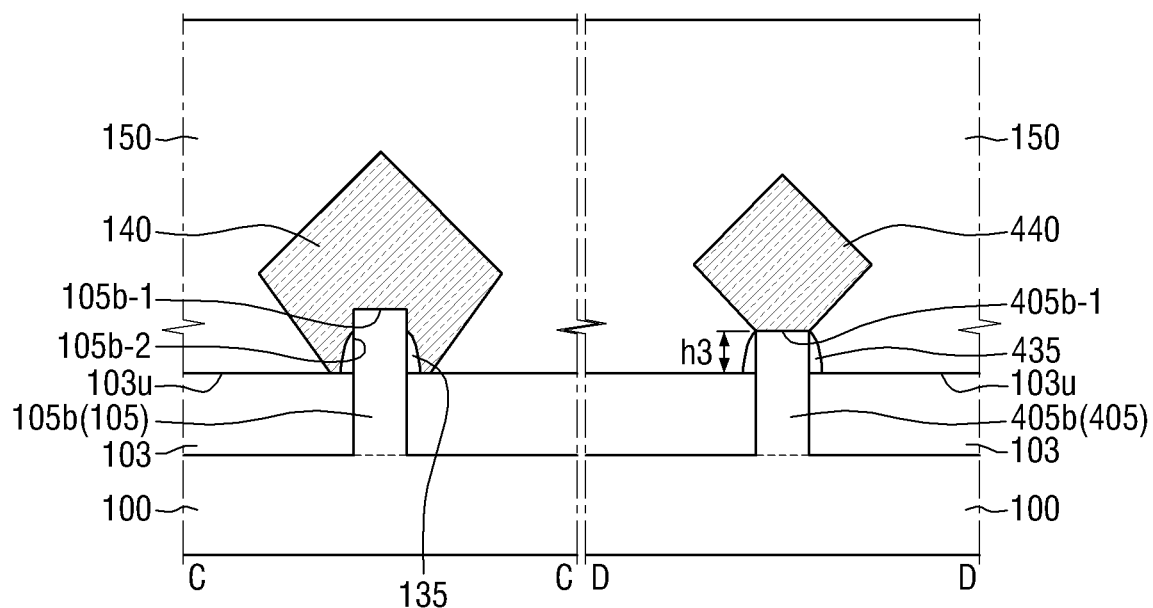

FIG. 32 is a perspective view of a semiconductor device 15 according to a fifteenth example embodiment of the inventive concepts. FIG. 33a is a cross-sectional view taken along the lines A-A and B-B of FIG. 32. FIG. 33b is a cross-sectional view taken along the lines C-C and D-D of FIG. 32. For simplicity, the fifteenth embodiment will be described, focusing mainly on differences with the thirteenth embodiment described above with reference to FIGS. 28 through 30.

More specifically, a third transistor 101 formed in a third region III of FIG. 32 may be one of the semiconductor devices 3 and 4 according to the third and fourth some example embodiments of the inventive concepts. A case where the third transistor 101 formed in the third region III is the semiconductor device 4 according to the fourth example embodiment of the inventive concepts will be described below as an example.

Referring to FIGS. 32, 33a and 33b, in the semiconductor device 15 according to the fifteenth example embodiment of the inventive concepts, the third transistor 101 further includes first fin spacers 135, and a fourth transistor 401 further includes fourth fin spacers 435.

The fourth transistor 401 includes a fourth multi-channel active pattern 405, a fourth gate electrode 420, the fourth fin spacers 435, and fourth source/drain regions 440.

In the fourth transistor 401, a top surface 405b-1 of a second portion 405b of the fourth multi-channel active pattern 405 and a top surface 405a-1 of a first portion 405a of the fourth multi-channel active pattern 405 protrude further upward than a top surface 103u of a field insulating layer 103. That is, as illustrated in FIG. 33a, the first portion 405a of the fourth multi-channel active pattern 405 and the second portion 405b of the fourth multi-channel active pattern 405 protrude further upward than the field insulating layer 103.

The fourth fin spacers 435 are formed on sidewalls 405b-2 of the second portion 405b of the fourth multi-channel active pattern 405 which protrude further upward than the top surface 103u of the field insulating layer 103.

In the semiconductor device 15 according to the fifteenth example embodiment of the inventive concepts, a third height h3 of the fourth fin spacers 435 is substantially equal to a height from the top surface 103u of the field insulating layer 103 to the top surface 405b-1 of the second portion 405b of the fourth multi-channel active pattern 405. Therefore, the top surface 405b-1 of the second portion 405b of the fourth multi-channel active pattern 405 which protrudes further upward than the top surface 103u of the field insulating layer 103 does not protrude further upward than the fourth fin spacers 435.

The fourth fin spacers 435 and fourth gate spacers 430 are formed at the same level and are connected to each other.

The fourth source/drain regions 440 are formed on the fourth multi-channel active pattern 405 on both sides of the fourth gate electrode 420. The fourth source/drain regions 440 may contact the fourth fin spacers 435.

In FIG. 33b, a bottommost part of each of the fourth source/drain regions 440 is formed along topmost parts of the fourth fin spacers 435. However, the inventive concepts are not limited thereto. Each of the fourth source/drain regions 440 can also surround at least part of the fourth fin spacers 435.

Figure 34:
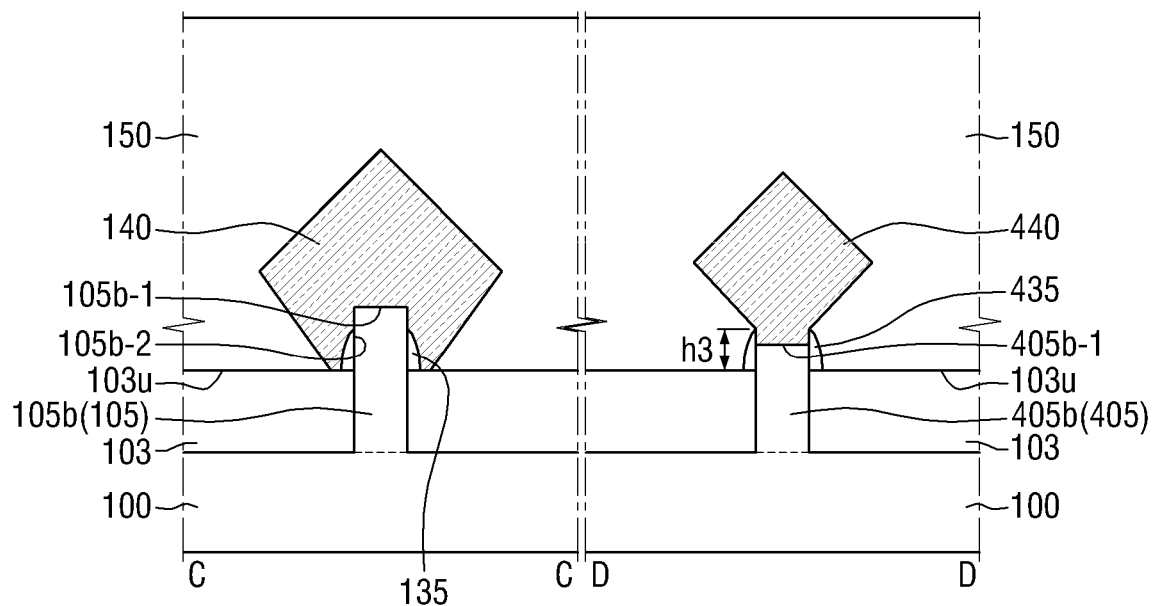
FIG. 34 is a cross-sectional view of a semiconductor device according to a sixteenth example embodiment of the inventive concepts.

FIG. 34 is a cross-sectional view of a semiconductor device 16 according to a sixteenth example embodiment of the inventive concepts. For simplicity, the sixteenth embodiment will be described, focusing mainly on differences with the fifteenth embodiment described above with reference to FIGS. 32 and 33.

Referring to FIG. 34, in the semiconductor device 16 according to the sixteenth example embodiment of the inventive concepts, a top surface 405b-1 of a second portion 405b of a fourth multi-channel active pattern 405 is more recessed than topmost parts 435t of fourth fin spacers 435.

Part of a fourth source/drain region 440 formed on the top surface 405b-1 of the second portion 405b of the fourth multi-channel active pattern 405 is surrounded by the fourth fin spacers 435.

Figure 35:
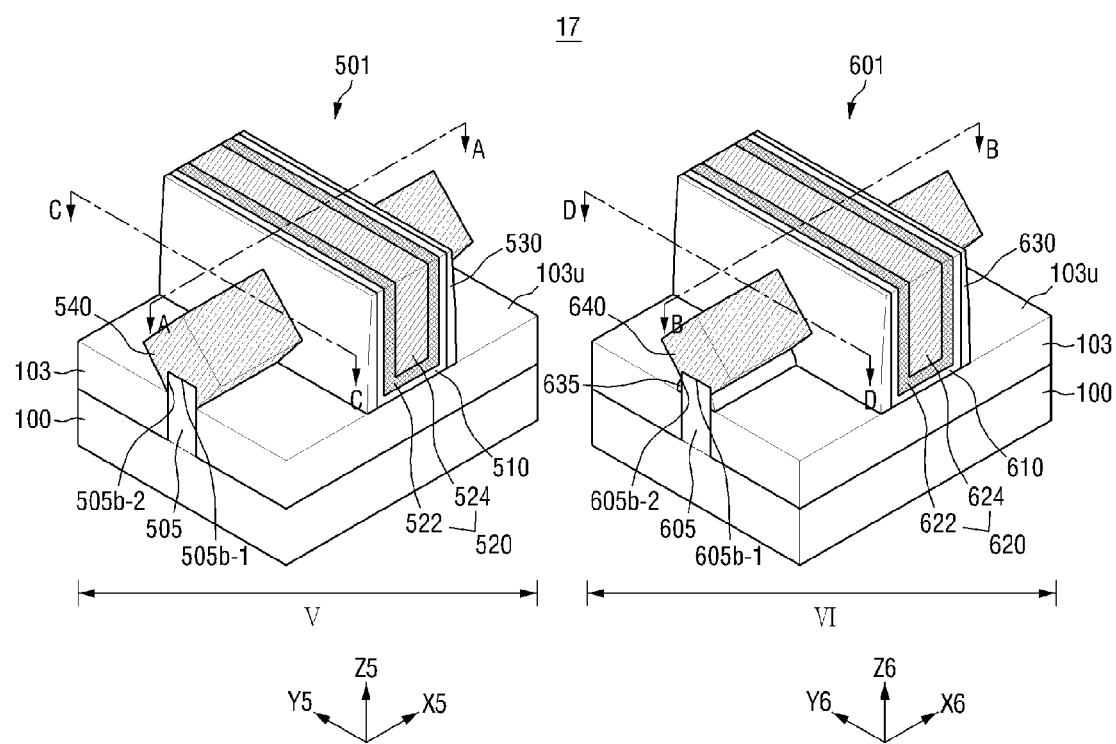
FIG. 35 is a perspective view of a semiconductor device according to a seventeenth example embodiment of the inventive concepts.
Figure 36A:
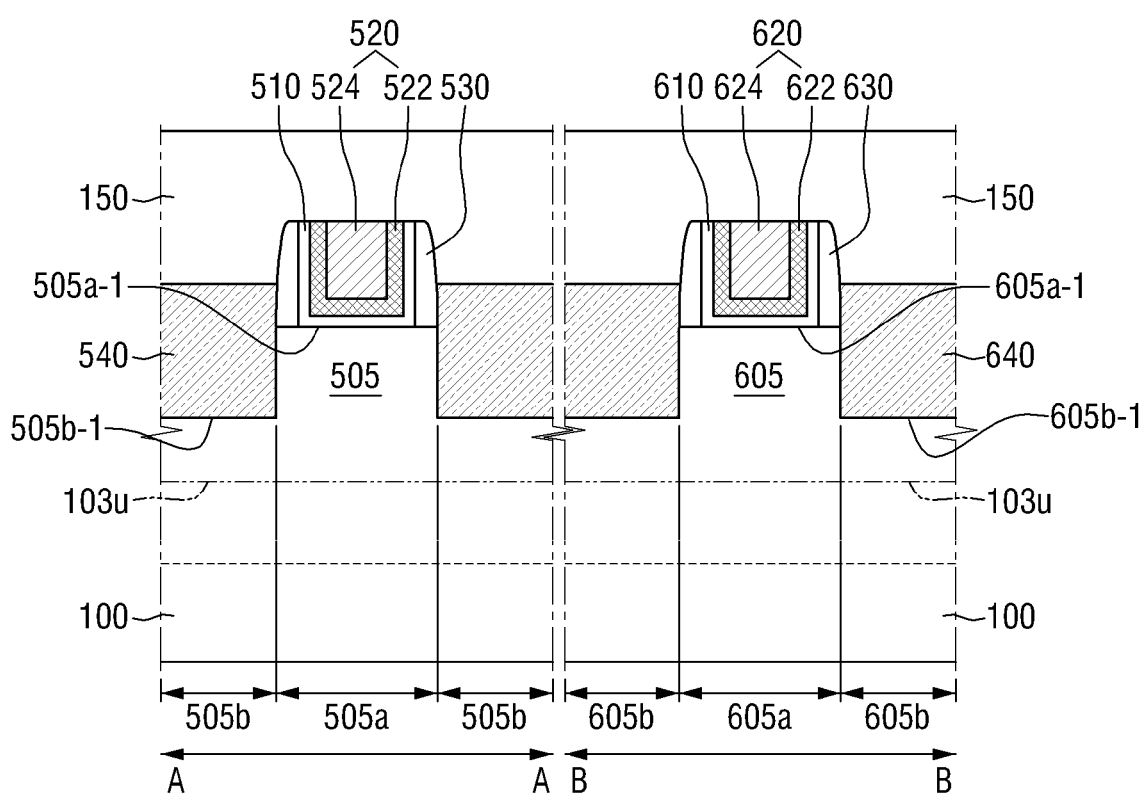
FIGS. 36a and 36b are cross-sectional views taken along the lines A-A, B-B, C-C and D-D of FIG. 35.
Figure 36B:
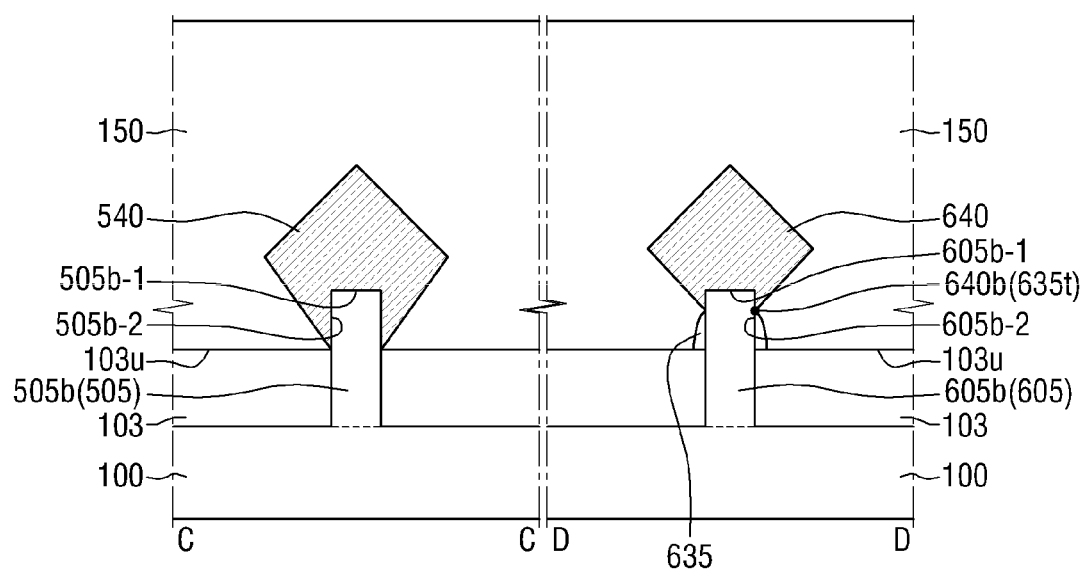

FIGS. 35, 36a and 36b are views of a semiconductor device 17 according to a seventeenth example embodiment of the inventive concepts. Specifically, FIG. 35 is a perspective view of the semiconductor device 17 according to the seventeenth example embodiment of the inventive concepts. FIG. 36a is a cross-sectional view taken along the lines A-A and B-B of FIG. 35. FIG. 36b is a cross-sectional view taken along the lines C-C and D-D of FIG. 35.

Referring to FIGS. 35, 36a and 36b, the semiconductor device 17 according to the seventeenth example embodiment of the inventive concepts may include a substrate 100, a fifth multi-channel active pattern 505, a sixth multi-channel active pattern 605, a fifth gate electrode 520, a sixth gate electrode 620, fifth source/drain regions 540, sixth source/drain regions 640, fifth fin spacers 635, and an interlayer insulating film 150.

The substrate 100 may include a fifth region V and a sixth region VI. The fifth region V and the sixth region VI may be separated from each other or may be connected to each other. In addition, the fifth region V and the sixth region VI may include transistor regions of different types or the same type.

A fifth transistor 501 may be formed on the fifth region V of the substrate 100, and a sixth transistor 601 may be formed on the sixth region VI of the substrate 100. The fifth transistor 501 includes the fifth multi-channel active pattern 505, the fifth gate electrode 520, and the fifth source/drain regions 540.

The fifth multi-channel active pattern 505 may be defined by a field insulating layer 103 and extend along a ninth direction X5. As in FIG. 36a, the fifth multi-channel active pattern 505 includes a first portion 505a and a second portion 505b. The second portion 505b of the fifth multi-channel active pattern 505 is disposed on both sides of the first portion 505a of the fifth multi-channel active pattern 505 in the ninth direction X5.

A top surface 505b-1 of the second portion 505b of the fifth multi-channel active pattern 505 and a top surface 505a-1 of the first portion 505a of the fifth multi-channel active pattern 505 protrude further upward than a top surface 103u of a field insulating layer 103. That is, the first portion 505a of the fifth multi-channel active pattern 505 and the second portion 505b of the fifth multi-channel active pattern 505 protrude further upward than the field insulating layer 103. The second portion 505b of the fifth multi-channel active pattern 505 is more recessed than the first portion 505a of the fifth multi-channel active pattern 505.

The profile of sidewalls of the second portion 505b of the fifth multi-channel active pattern 505 is continuous. Specifically, the second portion 505b of the fifth multi-channel active pattern 505 includes a portion which contacts the field insulating layer 103 and a portion which protrudes further upward than the field insulating layer 103 without contacting the field insulating layer 103. Here, the profile of sidewalls of the second portion 505b of the fifth multi-channel active pattern 505 which contacts the field insulating layer 103 is continuous with the profile of sidewalls 505b-2 of the second portion 505b of the fifth multi-channel active pattern 505 which protrudes further upward than the field insulating layer 103.

The fifth gate electrode 520 may extend along a tenth direction Y5 and intersect the fifth multi-channel active pattern 505. The fifth gate electrode 520 may be formed on the fifth multi-channel active pattern 505, more specifically, on the first portion 505a of the fifth multi-channel active pattern 505. The fifth gate electrode 520 may include metal layers (522, 524). As illustrated in the drawings, the fifth gate electrode 520 may be a stack of two or more metal layers (522, 524).

The fifth source/drain regions 540 are formed on the fifth multi-channel active pattern 505 on both sides of the fifth gate electrode 520. In other words, each of the fifth source/drain regions 540 is formed on the second portion 505b of the fifth multi-channel active pattern 505.

Each of the fifth source/drain regions 540 is formed around the second portion 505b of the fifth multi-channel active pattern 505 which protrudes further upward than the top surface 103u of the field insulating layer 103. More specifically, each of the fifth source/drain regions 540 is formed on the top surface 505b-1 and the sidewalls 505b-2 of the second portion 505b of the fifth multi-channel active pattern 505 which protrudes further upward than the top surface 103u of the field insulating layer 103.

The whole of the second portion 505b of the fifth multi-channel active pattern 505 which protrudes further upward than the top surface 103u of the field insulating layer 103 contacts each of the fifth source/drain regions 540. In addition, the fifth source/drain regions 540 contact the field insulating layer 103.

In FIG. 36b, bottommost parts of the fifth source/drain regions 540 do not extend along the top surface 103u of the field insulating layer 103. However, the inventive concepts are not limited thereto. That is, as illustrated in FIG. 9, the fifth source/drain regions 540 can grow laterally along the top surface 103u of the field insulating layer 103 adjacent thereto.

The sixth transistor 601 includes the sixth multi-channel active pattern 605, the sixth gate electrode 620, the fifth fin spacers 635, and the sixth source/drain regions 640. Since the sixth multi-channel active pattern 605 and the sixth gate electrode 620 are substantially identical to the fifth multi-channel active pattern 505 and the fifth gate electrode 520 described above, a repetitive description thereof will be omitted.

The fifth fin spacers 635 are formed on part of sidewalls 605b-2 of a second portion 605b of the sixth multi-channel active pattern 605 which protrudes further upward than the top surface 103u of the field insulating layer 103. Therefore, part of the second portion 605b of the sixth multi-channel active pattern 605 protrudes further upward than the fifth fin spacers 635.

The fifth fin spacers 635 and sixth gate spacers 630 are formed at the same level and are connected to each other.

Each of the sixth source/drain regions 640 is formed on a top surface 605b-1 and the sidewalls 605b-2 of the second portion 605b of the sixth multi-channel active pattern 605 which protrudes further than the fifth fin spacers 635. Each of the sixth source/drain regions 640 is formed around the second portion 605b of the sixth multi-channel active pattern 605 which protrudes further than the fifth fin spacers 635 to contact the second portion 605b.

In the semiconductor device 17 according to the seventeenth example embodiment of the inventive concepts, a bottommost part 640b of each of the sixth source/drain regions 640 may be formed along topmost parts 635t of the fifth fin spacers 635. That is, each of the sixth source/drain regions 640 may not extend along outer side surfaces of the fifth fin spacers 635.

Figure 37:
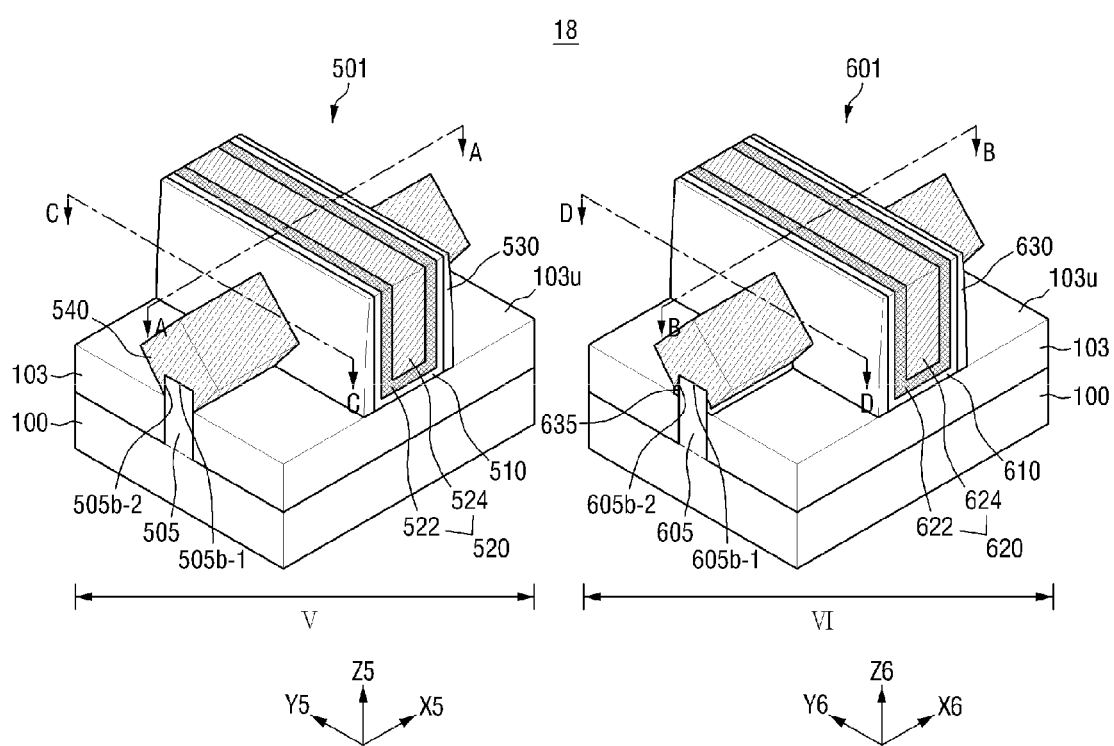
FIG. 37 is a perspective view of a semiconductor device according to an eighteenth example embodiment of the inventive concepts.
Figure 38A:
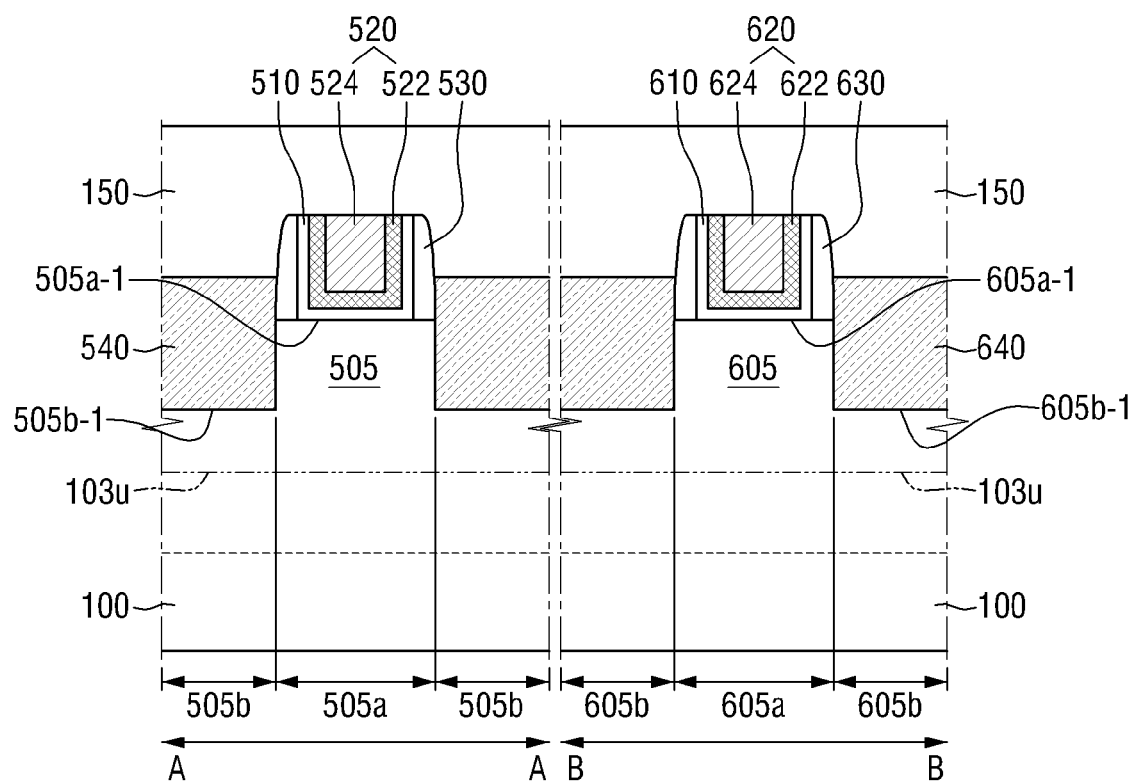
FIGS. 38a and 38b are cross-sectional views taken along the lines A-A, B-B, C-C and D-D of FIG. 37.
Figure 38B:
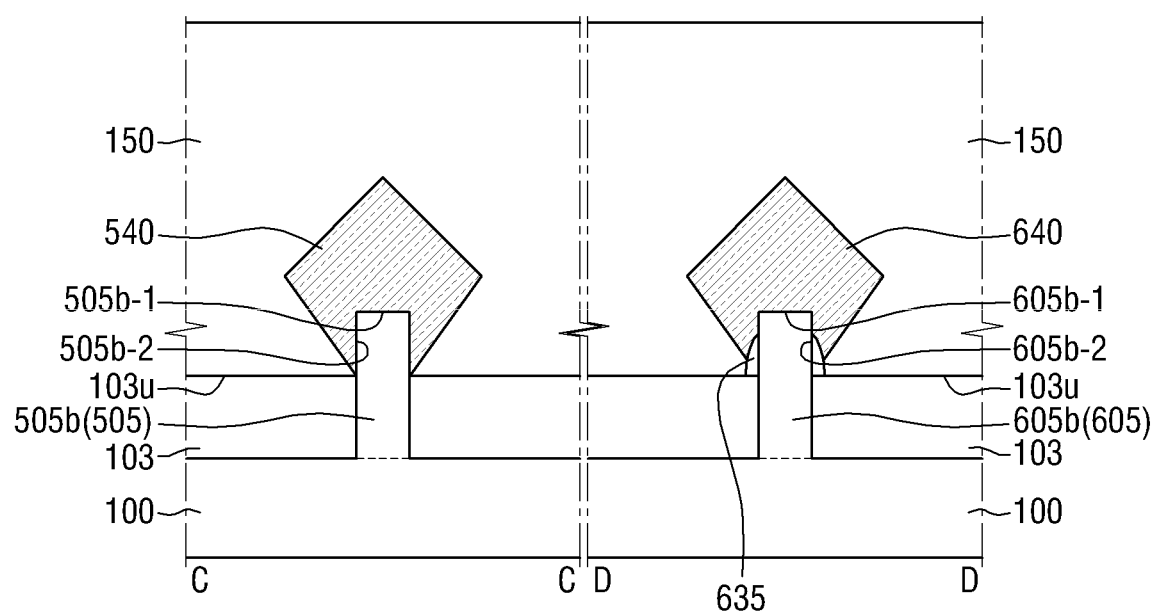

FIGS. 37, 38a and 38b are views of a semiconductor device 18 according to an eighteenth example embodiment of the inventive concepts. Specifically, FIG. 37 is a perspective view of the semiconductor device 18 according to the eighteenth example embodiment of the inventive concepts.

FIG. 38a is a cross-sectional view taken along the lines A-A and B-B of FIG. 37. FIG. 38b is a cross-sectional view taken along the lines C-C and D-D of FIG. 37. For simplicity, the eighteenth embodiment will be described, focusing mainly on differences with the seventeenth embodiment described above with reference to FIGS. 35, 36a and 36b.

Referring to FIGS. 37, 38a and 38b, each of sixth source/drain regions 640 covers at least part of fifth fin spacers 635.

Each of the sixth source/drain regions 640 may extend along at least part of outer side surfaces of the fifth fin spacers 635. In addition, each of the sixth source/drain regions 640 may contact the fifth fin spacers 635 along the outer side surfaces of the fifth fin spacers 635.

In FIGS. 37, 38a and 38b, each of the sixth source/drain regions 640 partially cover the fifth fin spacers 635 and are separated from a field insulating layer 103 without contacting the field insulating layer 103. However, the inventive concepts are not limited thereto.

That is, each of the sixth source/drain regions 640 can also entirely cover the fifth fin spacers 635 and contact the field insulating layer 103.

A method of fabricating a semiconductor device according to an example embodiment of the inventive concepts will now be described with reference to FIGS. 39 through 49. A semiconductor device formed through the processes of FIGS. 39 through 49 is one of the semiconductor devices 1 and 2 described above with reference to FIGS. 1 through 4, 8 and 9.

FIGS. 39 through 49 are views illustrating steps of a method of fabricating a semiconductor device according to an example embodiment of the inventive concepts.

Figure 39:
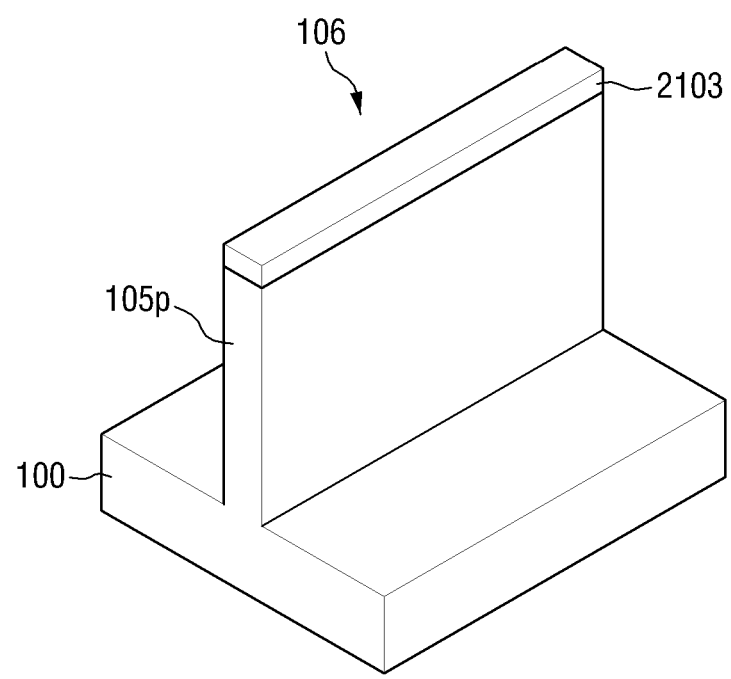
FIGS. 39 through 49 are views illustrating steps of a method of fabricating a semiconductor device according to an example embodiment of the inventive concepts.

Referring to FIG. 39, a pre-multi-channel active pattern 105p is formed on a substrate 100.

Specifically, a mask pattern 2103 is formed on the substrate 100 and then etched to form the pre-multi-channel active pattern 105p. The pre-multi-channel active pattern 105p may extend along a first direction X1. Trenches 106 are formed around the pre-multi-channel active pattern 105p. The mask pattern 2103 may be made of a material including at least one of a silicon oxide layer, a silicon nitride layer, and a silicon oxynitride layer.

Figure 40:
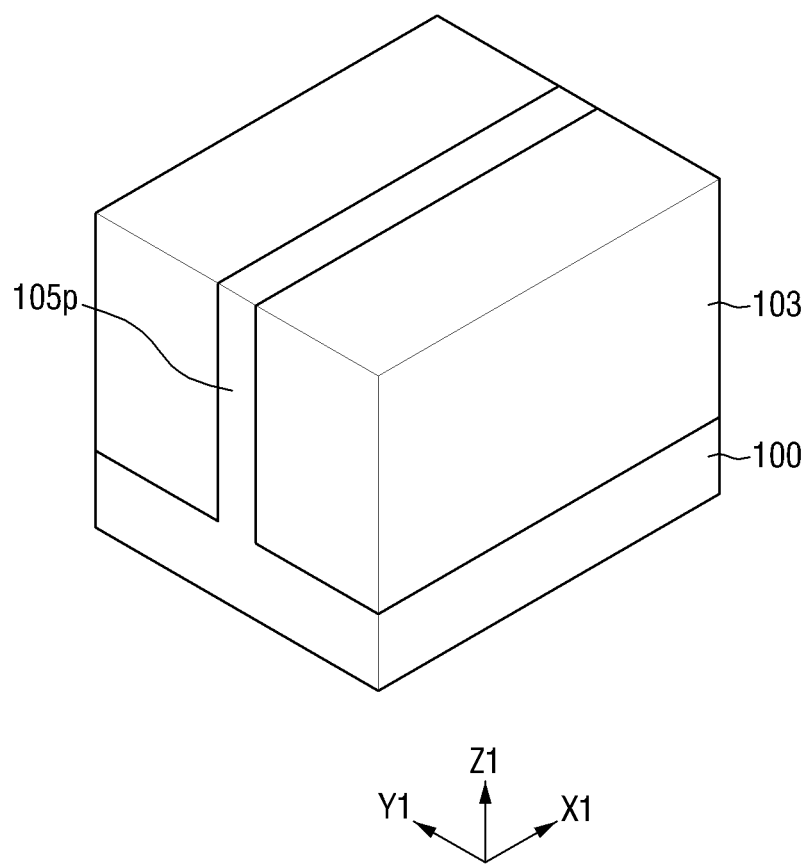

Referring to FIG. 40, a field insulating layer 103 is formed to fill the trenches 106. The field insulating layer 103 may be made of a material including at least one of a silicon oxide layer, a silicon nitride layer, and a silicon oxynitride layer.

The pre-multi-channel active pattern 105p and the field insulating layer 103 may be made to lie in the same plane by a planarization process. In the planarization process, the mask pattern 2103 may be removed. However, the inventive concepts are not limited thereto. That is, the mask pattern 2103 may be removed before the formation of the field insulating layer 103 or after a recess process which will be described with reference to FIG. 41.

Figure 41:
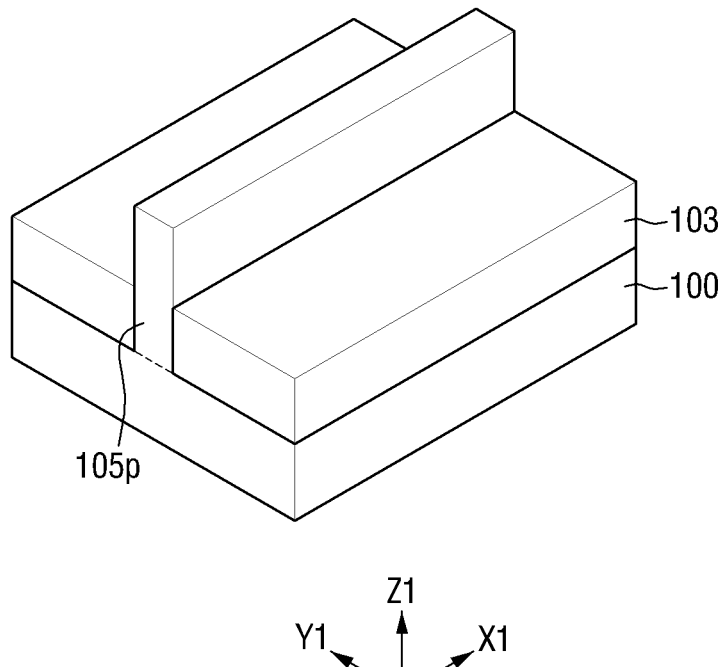

Referring to FIG. 41, an upper part of the field insulating layer 103 is recessed to partially expose the pre-multi-channel active pattern 105p. The recess process may include a selective etching process. That is, the pre-multi-channel active pattern 105p is formed to protrude further upward than the field insulating layer 103. In other words, a lower part of the pre-multi-channel active pattern 105p may contact the field insulating layer 103 and may be surrounded by the field insulating layer 103. However, an upper part of the pre-multi-channel active pattern 105p may protrude further upward than the field insulating layer 103 without contacting the field insulating layer 103.

A portion of the pre-multi-channel active pattern 105p which protrudes further upward than the field insulating layer 103 may also be formed by an epitaxial process. Specifically, after the formation of the field insulating layer 103, a recess process may not be performed. Instead, a portion of the pre-multi-channel active pattern 105p may be formed by an epitaxial process that uses a top surface of the pre-multi-channel active pattern 105p exposed by the field insulating layer 103 as a seed.

In addition, a doping process for controlling a threshold voltage may be performed on the pre-multi-channel active pattern 105p. If the semiconductor device 1, 2, 3 or 4 is an NMOS fin transistor, impurities used may be boron (B). If the semiconductor device 1, 2, 3 or 4 is a PMOS fin transistor, the impurities used may be phosphorous (P) or arsenic (As).

Figure 42:
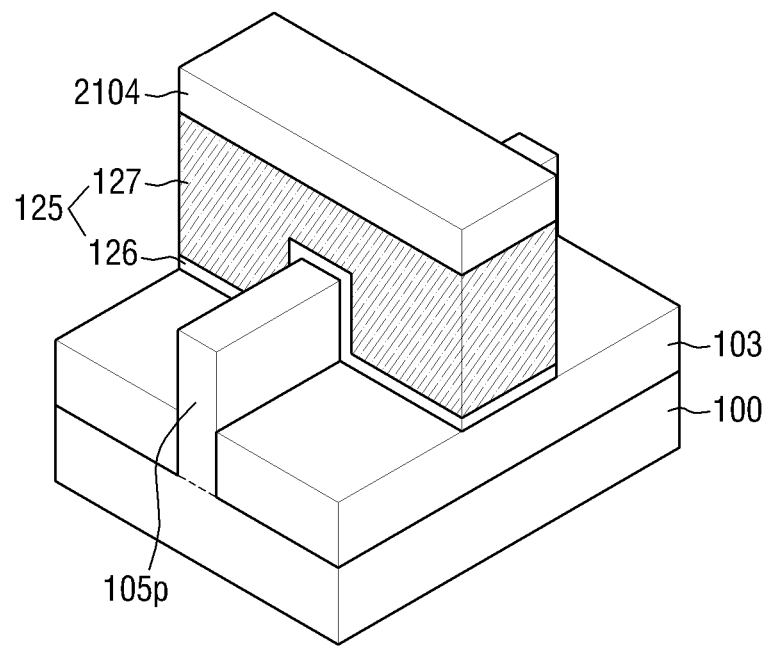

Referring to FIG. 42, an etching process is performed using the mask pattern 2104, thereby forming a dummy gate pattern 125 which intersects the pre-multi-channel active pattern 105p and extends along a second direction Y1.

Accordingly, the dummy gate pattern 125 is formed on the pre-multi-channel active pattern 105p. The dummy gate pattern 125 may be formed on the field insulating layer 103 to partially overlap the pre-multi-channel active pattern 105p. The pre-multi-channel active pattern 105p includes a portion covered by the dummy gate pattern 125 and a portion exposed by the dummy gate pattern 125.

The dummy gate pattern 125 includes a dummy gate insulating layer 126 and a dummy gate electrode 127. For example, the dummy gate insulating layer 126 may be a silicon oxide layer, and the dummy gate electrode 127 may be polysilicon.

In the method of fabricating a semiconductor device according to the current embodiment, the dummy gate pattern 125 is formed to form a replacement gate electrode. However, the inventive concepts are not limited thereto. That is, not a dummy gate pattern but a gate pattern can be formed using a material that will be used for a gate insulating layer and a gate electrode of a transistor.

Figure 43:
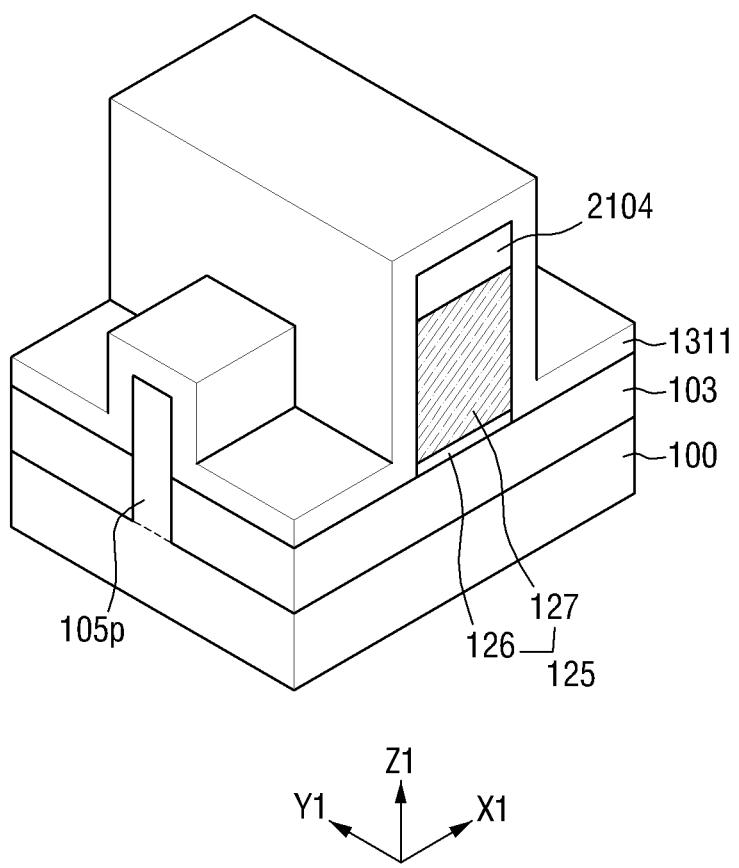

Referring to FIG. 43, a spacer layer 131l is formed on the field insulating layer 103 to cover the dummy gate pattern 125 and the pre-multi-channel active pattern 105p.

The spacer layer 131l may be conformally formed on the dummy gate pattern 125 and the pre-multi-channel active pattern 105p. The spacer layer 131l is formed on the pre-multi-channel active pattern 105p which protrudes further upward than the field insulating layer 103.

The spacer layer 131l may include at least one of SiN, SiON, SiO$_2$, SiOCN, and combinations of the same. The spacer layer 131l may be formed by, e.g., chemical vapor deposition (CVD) or atomic layer deposition (ALD).

Figure 44:
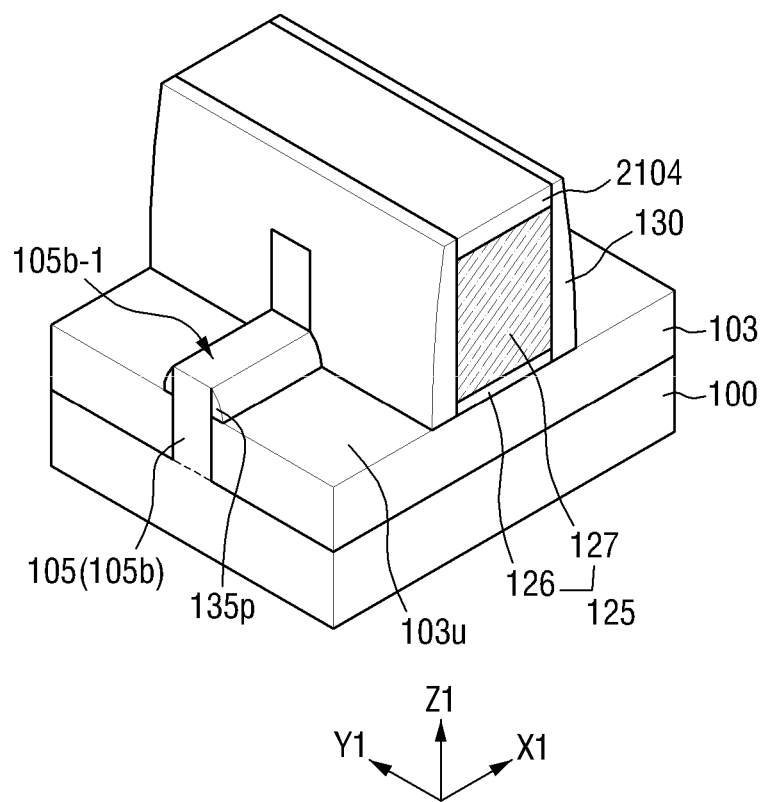

Referring to FIG. 44, a first multi-channel active pattern 105, first gate spacers 130, and pre-fin spacers 135p are formed by partially etching the spacer layer 131l and the pre-multi-channel active pattern 105p which protrudes further upward than the field insulating layer 103.

Specifically, a portion of the pre-multi-channel active pattern 105p which is not overlapped by the dummy gate pattern 125 is recessed by etching the pre-multi-channel active pattern 105p using the dummy gate pattern 125 as an etch mask. In the process of recessing the portion of the pre-multi-channel active pattern 105p which is not overlapped by the dummy gate pattern 125, the first gate spacers 130 are formed on sidewalls of the dummy gate electrode 127, and the pre-fin spacers 135p are formed on sidewalls of a second portion 105b of the first multi-channel active pattern 105 which protrudes further upward than a top surface 103u of the field insulating layer 103.

The first multi-channel active pattern 105 formed in the process of forming the first gate spacers 130 and the pre-fin spacers 135p is defined by the field insulating layer 103 and extends along the first direction X1. The first multi-channel active pattern 105 includes a first portion 105a and the second portion 105b. The dummy gate electrode 127 is formed on the first portion 105a of the first multi-channel active pattern 105.

The portion of the pre-multi-channel active pattern 105p which is not overlapped by the dummy gate electrode 127 is etched using the dummy gate electrode 127 as an etch mask. As a result, the second portion 105b of the first multi-channel active pattern 105 is formed. Therefore, the second portion 105b of the first multi-channel active pattern 105 is more recessed than the first portion 105a of the first multi-channel active pattern 105. That is, a top surface 105b-1 of the second portion 105b of the first multi-channel active pattern 105 is more recessed than a top surface of the first portion 105a of the first multi-channel active pattern 105.

In addition, the top surface 105b-1 of the second portion 105b of the first multi-channel active pattern 105 and the top surface of the first portion 105a of the first multi-channel active pattern 105 protrude further upward than the top surface 103u of the field insulating layer 103.

Figure 45:
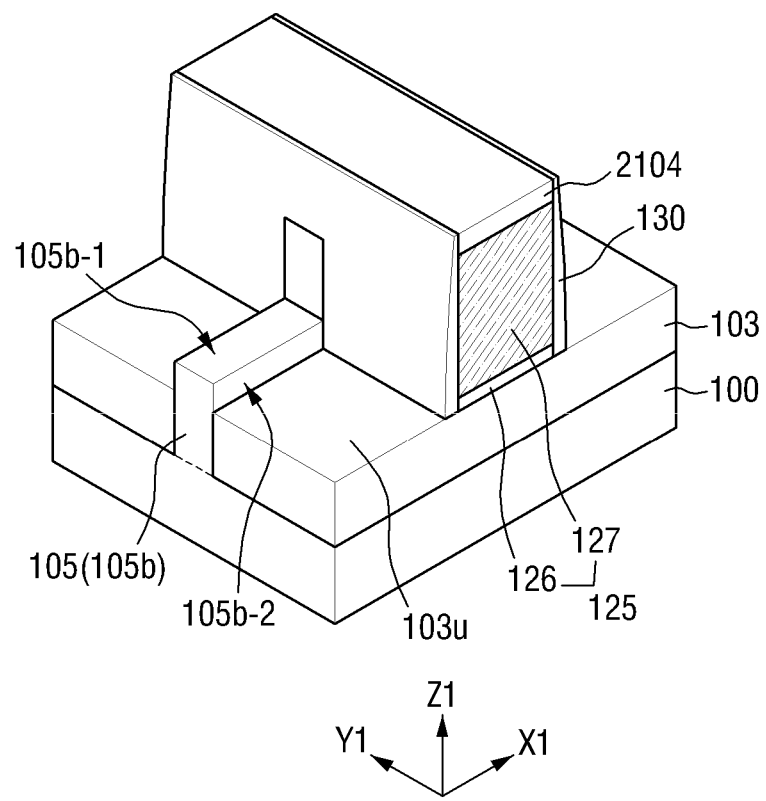

Referring to FIG. 45, the pre-fin spacers 135p are completely removed to completely expose sidewalls 105b-2 of the second portion 105b of the first multi-channel active pattern 105 which protrudes further upward than the top surface 103u of the field insulating layer 103.

Accordingly, the sidewalls 105b-2 and the top surface 105b-1 of the second portion 105b of the first multi-channel active pattern 105 which protrudes further upward than the top surface 103u of the field insulating layer 103 are exposed.

The removal of the pre-fin spacers 135p may be accomplished by, e.g., an etching process. The pre-fin spacers 135p and the first gate spacers 130 may be made of the same material. Therefore, while the pre-fin spacers 135p are being removed, the first gate spacers 130 may be partially removed.

Figure 46:
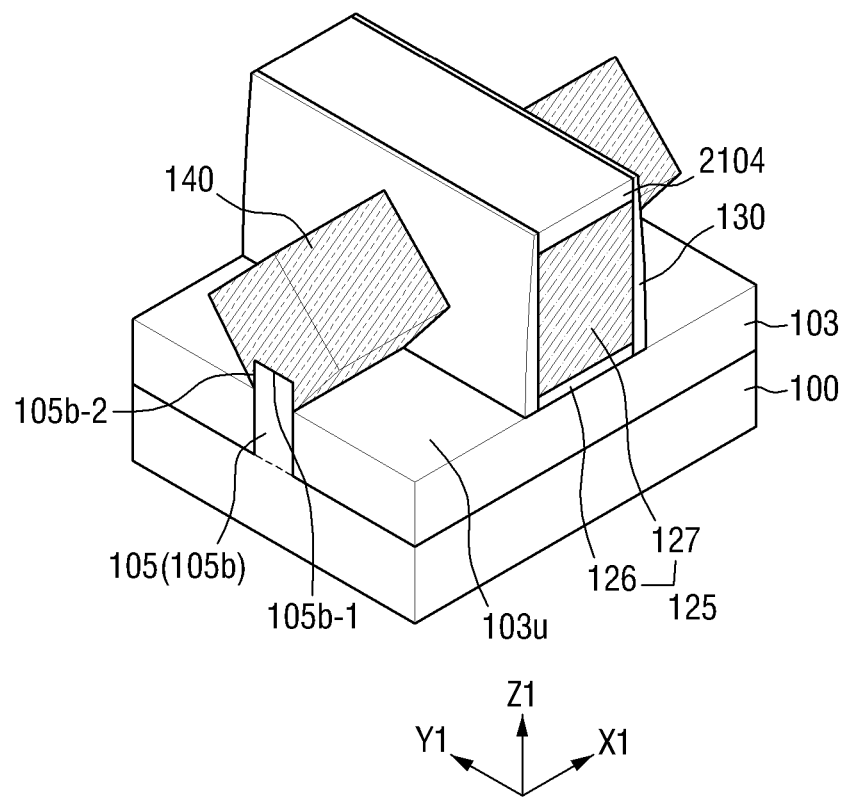

Referring to FIG. 46, each of first source/drain regions 140 is formed to contact the sidewalls 105b-2 and the top surface 105b-1 of the second portion 105b of the first multi-channel active pattern 105 which protrudes further upward than the top surface 103u of the field insulating layer 103.

In the method of fabricating a semiconductor device according to the current embodiment, the whole of the second portion 105b of the first multi-channel active pattern 105 which protrudes further upward than the top surface 103u of the field insulating layer 103 directly contacts each of the first source/drain regions 140.

The first source/drain regions 140 may be formed by an epitaxial process. The material that forms the first source/drain regions 140 may vary according to whether the semiconductor 1, 2, 3 or 4 according to an example embodiment of the inventive concepts is an n-type transistor or a p-type transistor. If necessary, impurities can be in-situ-doped during the epitaxial process.

Each of the first source/drain regions 140 may have at least one of a diamond shape, a circular shape, and a rectangular shape. In FIG. 46, the diamond shape (or a pentagonal shape or a hexagonal shape) is illustrated.

Figure 47:
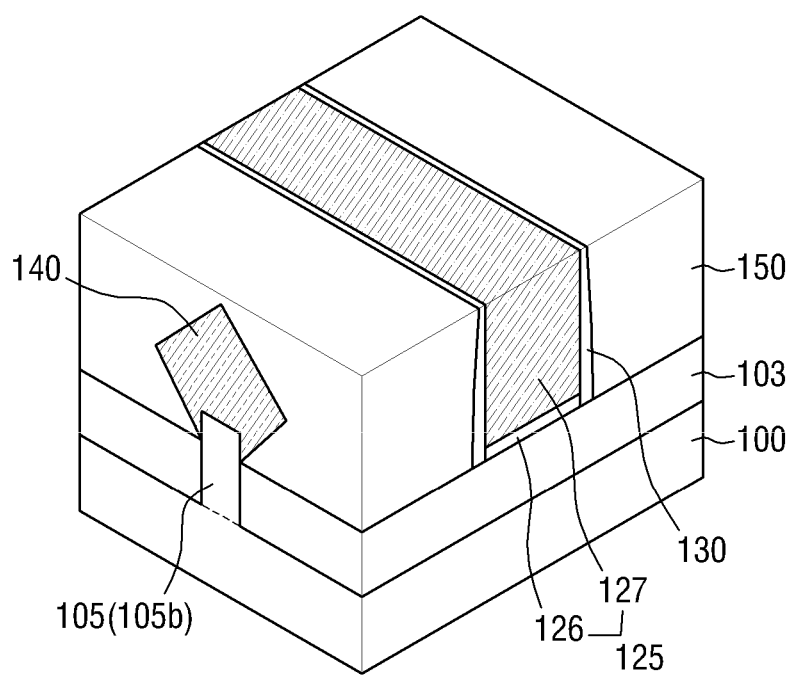

Referring to FIG. 47, an interlayer insulating film 150 is formed to cover the first source/drain regions 140, the first gate spacers 130, the dummy gate pattern 125, etc.

The interlayer insulating film 150 may include at least one of a low-k material, an oxide layer, a nitride layer, and an oxynitride layer. The low-k material may be formed of Flowable Oxide (FOX), Tonen SilaZen (TOSZ), Undoped Silica Glass (USG), Borosilica Glass (BSG), PhosphoSilaca (PSG), BoroPhosphoSilica Glass (BPSG), Plasma Enhanced Tetra Ethyl Ortho Silicate (PETEOS), Fluoride Silicate Glass (FSG), High Density Plasma (HDP) oxide, Plasma Enhanced Oxide (PEOX), Flowable CVD (FCVD) oxide, or any combination of the same.

The interlayer insulating film 150 is planarized until a top surface of the dummy gate electrode 127 is exposed. As a result, the mask pattern 2104 may be removed, and the top surface of the dummy gate electrode 127 may be exposed.

Figure 48:
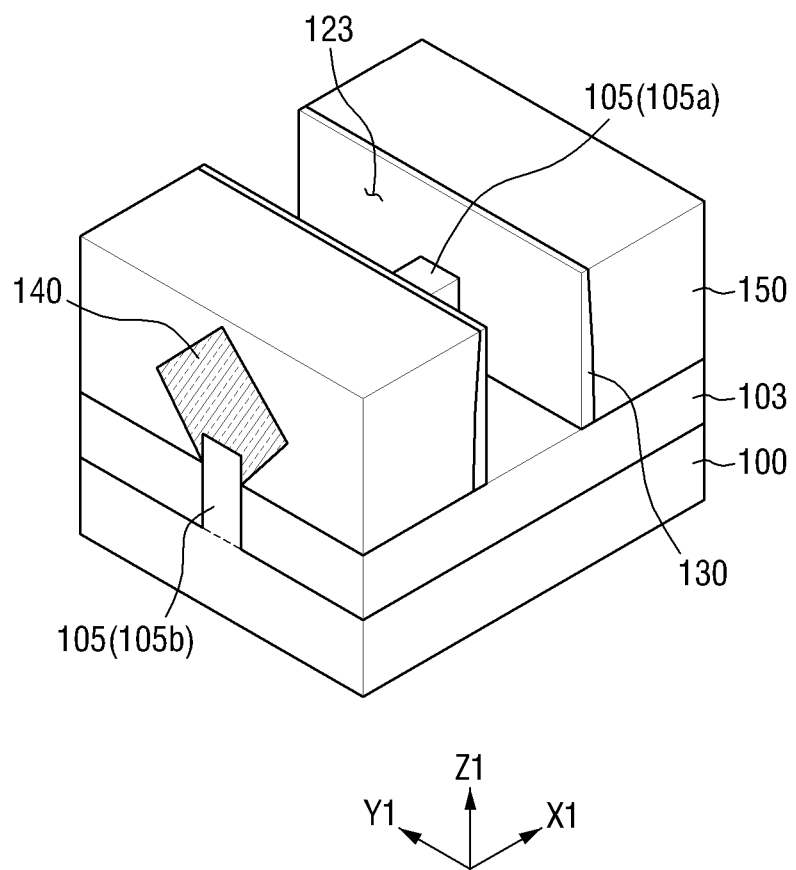

Referring to FIG. 48, the dummy gate pattern 125, that is, the dummy gate insulating layer 126 and the dummy gate electrode 127 are removed.

The removal of the dummy gate insulating layer 126 and the dummy gate electrode 127 forms a trench 123 which partially exposes the field insulating layer 103 and the first portion 105a of the first multi-channel active pattern 105.

Figure 49:
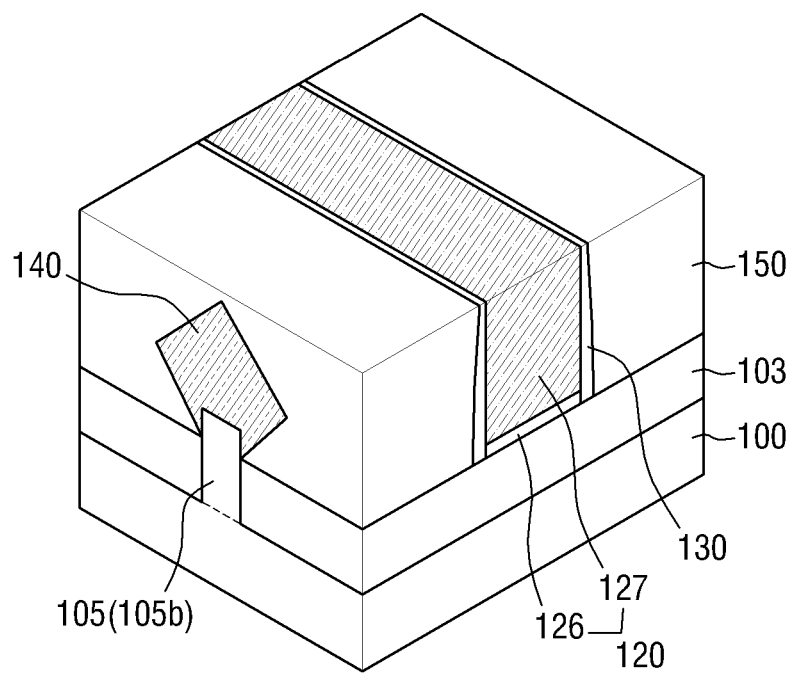

Referring to FIG. 49, a first gate insulating layer 110 and a first gate electrode 120 are formed in the trench 123.

The first gate insulating layer 110 may include a high-k material having a higher dielectric constant than a silicon oxide layer. The first gate insulating layer 110 may be formed substantially conformally along sidewalls and a bottom surface of the trench 123.

The first gate electrode 120 may include metal layers 122 and 124. The first gate electrode 120 may be formed by stacking two or more metal layers 122 and 124.

A method of fabricating a semiconductor device according to another example embodiment of the inventive concepts will now be described with reference to FIGS. 39 through 44 and 47 through 51. A semiconductor device fabricated through the processes of FIGS. 39 through 44 and 47 through 51 is one of the semiconductor devices 3 and 4 described above with reference to FIGS. 10 through 13.

Figure 50:
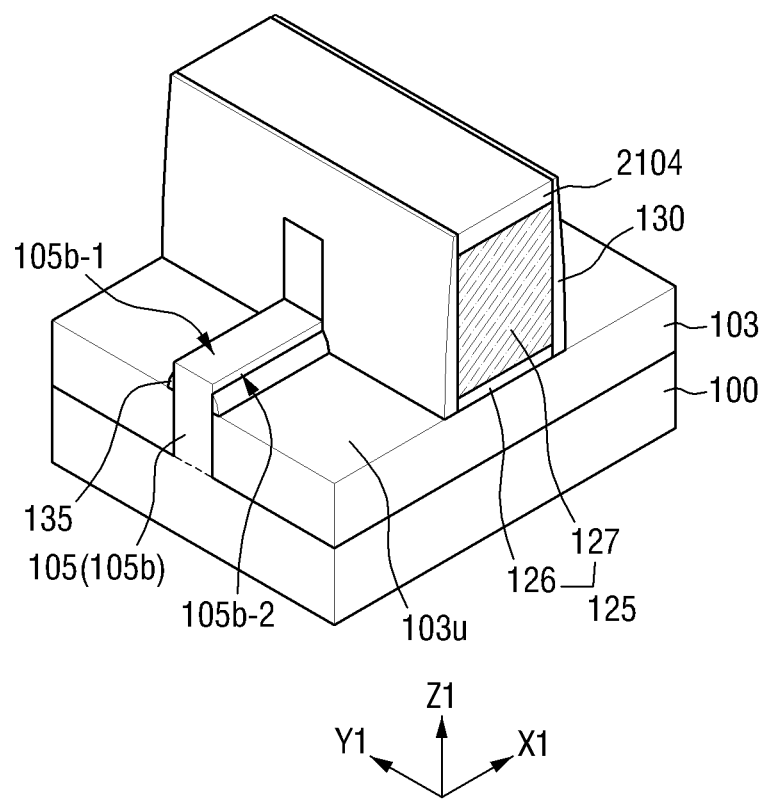
FIGS. 50 and 51 are views illustrating steps of a method of fabricating a semiconductor device according to another example embodiment of the inventive concepts.
Figure 51:
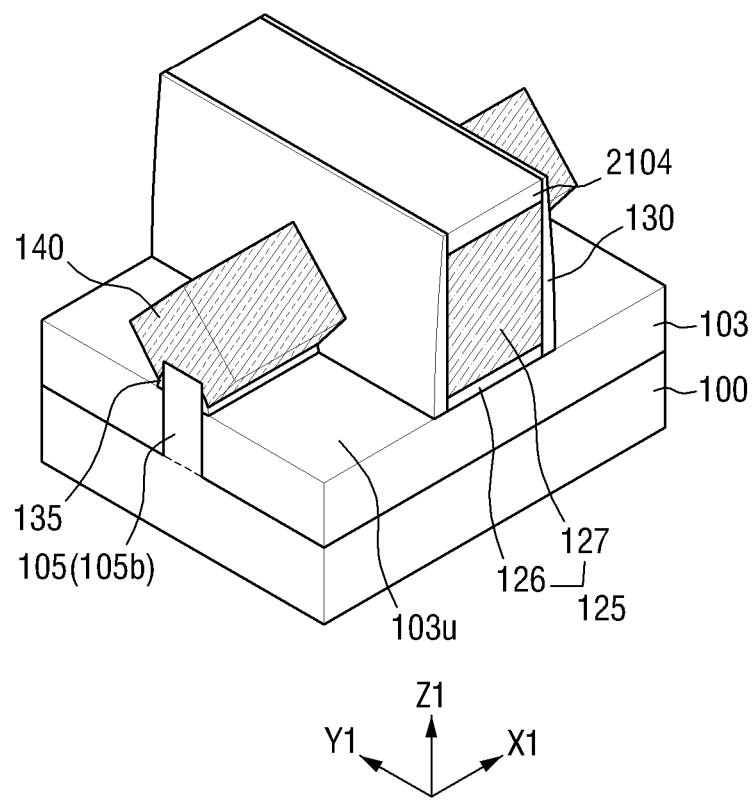

FIGS. 50 and 51 are views illustrating steps of a method of fabricating a semiconductor device according to another example embodiment of the inventive concepts.

Referring to FIG. 50, pre-fin spacers 135p are partially removed, thereby partially exposing sidewalls 105b-2 of a second portion 105b of a first multi-channel active pattern 105 which protrudes further upward than a top surface 103u of a field insulating layer 103.

The partial removal of the pre-fin spacers 135p also results in the formation of first fin spacers 135 on part of the sidewalls 105b-2 of the second portion 105b of the first multi-channel active pattern 105 which protrudes further upward than the top surface 103u of the field insulating layer 103. Therefore, part of the second portion 105b of the first multi-channel active pattern 105 protrudes further upward than the first fin spacers 135.

Referring to FIG. 51, each of first source/drain regions 140 is formed to contact the sidewalls 105b-2 and the top surface 105b-1 of the second portion 105b of the first multi-channel active pattern 105 which protrudes further than the first fin spacers 135.

Each of the first source/drain regions 140 covers at least part of the first fin spacers 135. In addition, each of the first source/drain regions 140 is formed to contact the top surface 105b-1 and the sidewalls 105b-2 of the second portion 105b of the first multi-channel active pattern 105 which protrudes further upward than the first fin spacers 135.

Examples of an electronic system using the semiconductor devices 1 through 18 described above with reference to FIGS. 1 through 38 will now be described.

Figure 52:
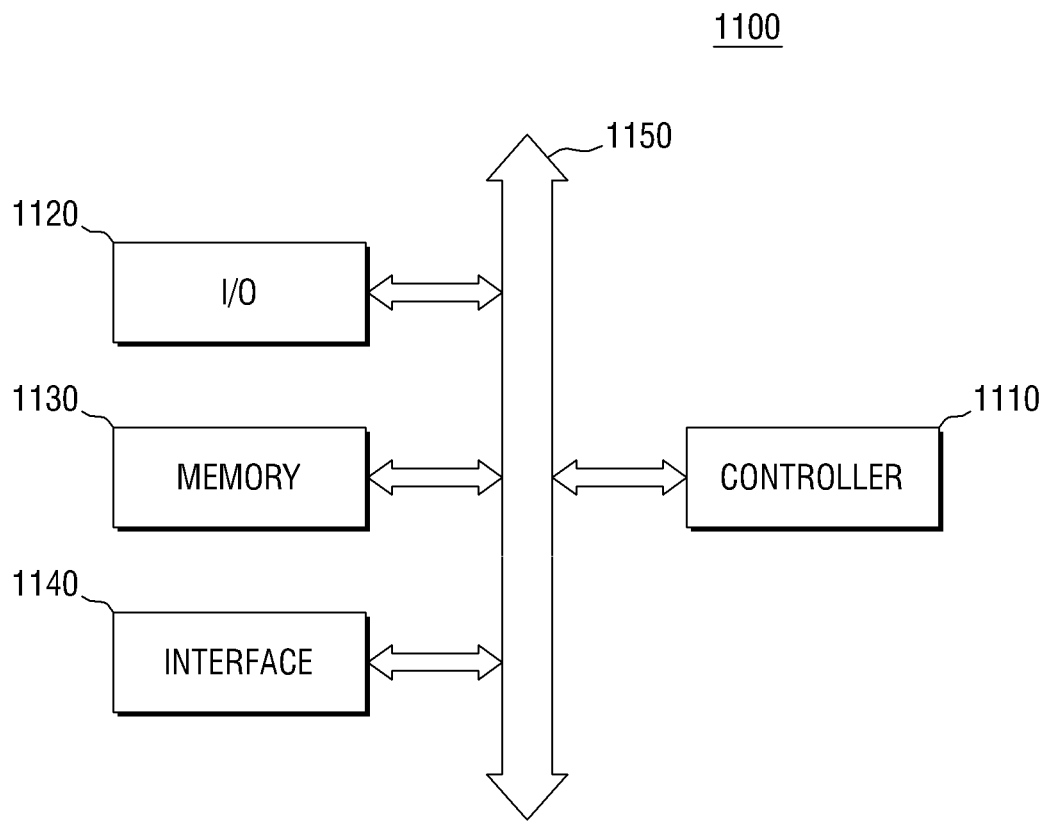
FIG. 52 is a block diagram of an electronic system including semiconductor devices according to some example embodiments of the inventive concepts.

FIG. 52 is a block diagram of an electronic system 1100 including semiconductor devices according to some example embodiments of the inventive concepts.

Referring to FIG. 52, the electronic system 1100 may include a controller 1110, an input/output (I/O) device 1120, a memory device 1130, an interface 1140 and a bus 1150. The controller 1110, the I/O device 1120, the memory device 1130 and/or the interface 1140 may be connected to one another by the bus 1150. The bus 1150 may serve as a path for transmitting data.

The controller 1110 may include at least one of a microprocessor, a digital signal processor, a microcontroller and logic devices capable of performing similar functions to those of a microprocessor, a digital signal processor and a microcontroller. The I/O device 1120 may include a keypad, a keyboard and a display device. The memory device 1130 may store data and/or commands. The interface 1140 may be used to transmit data to or receive data from a communication network. The interface 1140 may be a wired or wireless interface. In an example, the interface 1140 may include an antenna or a wired or wireless transceiver. Although not illustrated in the drawing, the electronic system 1100 may further include an operating memory for improving the operation of the controller 1110, such as a high-speed dynamic random access memory (DRAM) and/or static random access memory (SRAM). Any one of the semiconductor devices according to the above-described embodiments may be provided in the memory device 1130 or in the controller 1110 or the I/O device 1120.

The electronic system 1100 may be applied to nearly all types of electronic products capable of transmitting or receiving information in a wireless environment, such as a personal data assistant (PDA), a portable computer, a web tablet, a wireless phone, a mobile phone, a digital music player, a memory card, etc.

Figure 53:
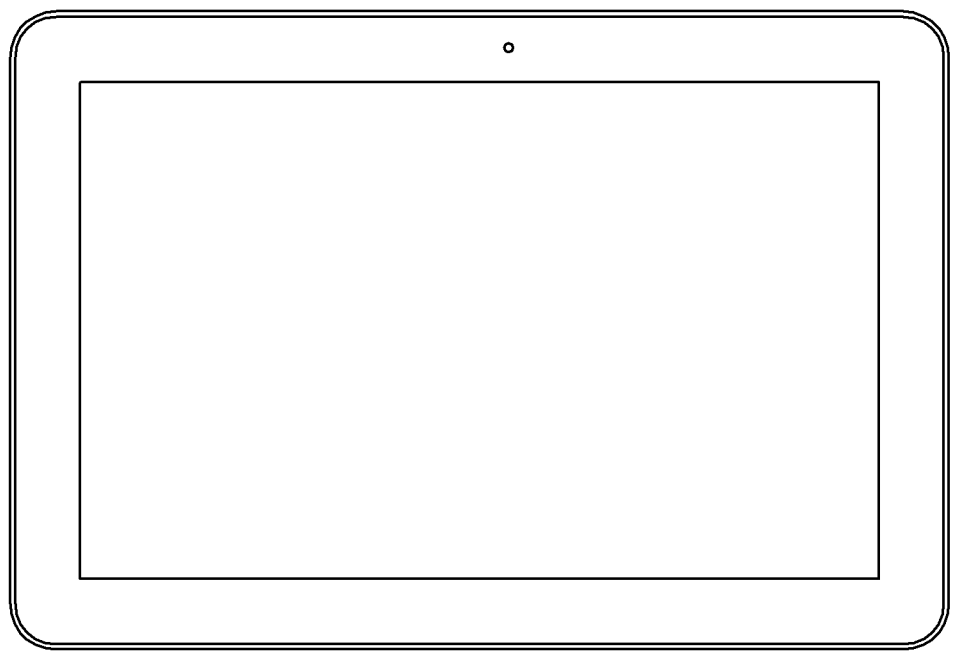
FIGS. 53 and 54 are diagrams illustrating examples of a semiconductor system to which semiconductor devices according to some example embodiments of the inventive concepts can be applied.
Figure 54:
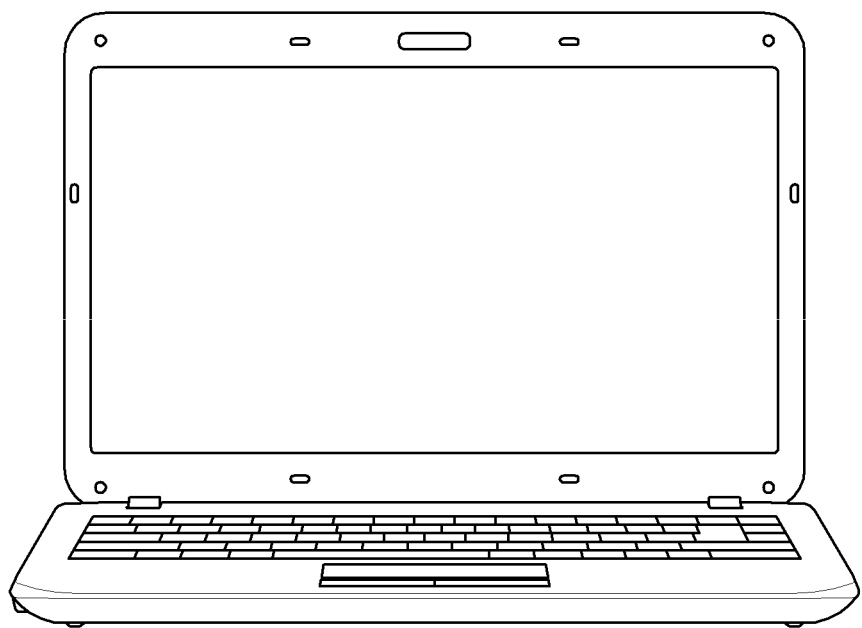

FIGS. 53 and 54 are diagrams illustrating examples of a semiconductor system to which semiconductor devices according to some example embodiments of the inventive concepts can be applied. FIG. 53 illustrates a tablet personal computer (PC), and FIG. 54 illustrates a notebook computer. At least one of the semiconductor devices according to the above-described example embodiments of the inventive concepts, as set forth herein, may be used in the tablet PC, the notebook computer, etc. The semiconductor devices according to the example embodiments of the inventive concepts, as set forth herein, may also be applied to various integrated circuit (IC) devices other than those set forth herein.

While the inventive concepts have been particularly shown and described with reference to example embodiments thereof, it will be understood by those of ordinary skill in the art that various changes in form and details may be made therein without departing from the spirit and scope of the inventive concepts as defined by the following claims. It is therefore desired that the present embodiments be considered in all respects as illustrative and not restrictive, reference being made to the appended claims rather than the foregoing description to indicate the scope of the inventive concepts.

What is claimed is:

1. A semiconductor device comprising:
    a first multi-channel active pattern defined by a field insulating layer and extending along a first direction, the first multi-channel active pattern including,
        a first portion having a top surface protruding further in an upward direction than a top surface of the field insulating layer, and
        a second portion on both sides of the first portion, the second portion having a top surface protruding further in the upward direction than the top surface of the field insulating layer and protruding in the upward direction less than the top surface of the first portion, the second portion having sidewalls with a continuous profile;
    a gate electrode on the first portion of the first multi-channel active pattern, the gate electrode extending along a second direction different from the first direction; and
    a first source/drain region on the second portion of the first multi-channel active pattern and contacting the field insulating layer.

2. The semiconductor device of claim 1, wherein
    the entire second portion protrudes further in the upward direction than the top surface of the field insulating layer, and
    the first source/drain region is formed on the top surface and sidewalls of the second portion.

3. The semiconductor device of claim 1, wherein
    the entire second portion protrudes further in the upward direction than the top surface of the field insulating layer, and
    the first source/drain region directly contacts the entire second portion.

4. The semiconductor device of claim 3, wherein the first source/drain region contacts the top surface of the field insulating layer.

5. The semiconductor device of claim 1, further comprising:
    fin spacers on a part of the sidewalls of the second portion protruding further in the upward direction than the top surface of the field insulating layer.

6. The semiconductor device of claim 5, wherein a part of the second portion protrudes further in the upward direction than the fin spacers.

7. The semiconductor device of claim 5, wherein
    each of the fin spacers includes an inner side surface adjacent to the second portion and an outer side surface facing the inner side surface, and
    the first source/drain region contacts each of the fin spacers along the outer side surface of each of the fin spacers.

8. The semiconductor device of claim 7, wherein the first source/drain region contacts the top surface of the field insulating layer.

9. The semiconductor device of claim 1, further comprising:
    a second multi-channel active pattern adjacent to the first multi-channel active pattern and extending along the first direction, the second multi-channel active pattern including,
        a third portion having a top surface protruding further in the upward direction than a top surface of the field insulating layer, and
        a fourth portion on both sides of the third portion, the fourth portion having a top surface protruding further in the upward direction than the top surface of the field insulating layer and protruding in the upward direction less than the top surface of the third portion; and a second source/drain region on the fourth portion of the second multi-channel active pattern and contacting the field insulating layer, wherein the gate electrode is formed on the third portion and the second source/drain region is formed on both sides of the gate electrode.

10. The semiconductor device of claim 9, wherein the second source/drain region contacts the first source/drain region.

11. The semiconductor device of claim 9, wherein each of the first source/drain region and the second source/drain region contacts the top surface of the field insulating layer.

12. The semiconductor device of claim 1, wherein
a height from the top surface of the field insulating layer to the top surface of the first portion is a first height,
a height from the top surface of the field insulating layer to the top surface of the second portion is a second height, and
the first height is greater than the second height.

13. The semiconductor device of claim 1, wherein an outer circumferential surface of the first source/drain region has at least one of a diamond shape, a circular shape, and a rectangular shape.

14. The semiconductor device of claim 1, wherein the first multi-channel active pattern is a fin-type active pattern.

15. A semiconductor device comprising:
a multi-channel active pattern defined by a field insulating layer and extending along a first direction, the multi-channel active pattern including,
  a first portion having a top surface protruding further in an upward direction than a top surface of the field insulating layer, and
  a second portion on both sides of the first portion, the second portion protruding further in the upward direction than the top surface of the field insulating layer and protruding in the upward direction less than the top surface of the first portion;
a gate electrode on the first portion of the multi-channel active pattern, the gate electrode extending along a second direction different from the first direction;
fin spacers on a part of sidewalls of the second portion protruding further in the upward direction than the top surface of the field insulating layer; and
a source/drain region covering at least part of the fin spacers and contacting the top surface and the sidewalls of the second portion protruding further in the upward direction than the fin spacers.

16. The semiconductor device of claim 15, wherein the source/drain region partially covers the fin spacers.

17. The semiconductor device of claim 16, wherein
each of the fin spacers comprises an inner side surface adjacent to the second portion protruding further in the upward direction than the top surface of the field insulating layer and an outer side surface facing the inner side surface, and upper parts of the outer side surfaces of the fin spacers contact the source/drain region and lower parts of the outer side surfaces of the fin spacers do not contact the source/drain region.

18. The semiconductor device of claim 15, wherein the source/drain region contacts the field insulating layer.

19. A semiconductor device comprising:
a field insulating layer on a substrate;
a first multi-channel active pattern defined by a field insulating layer and extending along a first direction, the multi-channel active pattern including,
  a first portion having a top surface protruding further in an upward direction than a top surface of the field insulating layer, and
  a second portion on both sides of the first portion, the second portion protruding further in the upward direction than the top surface of the field insulating layer and protruding in the upward direction less than the top surface of the first portion, the second portion having sidewalls with a continuous profile;
a first gate electrode on the first portion of the first multi-channel active pattern, the first gate electrode extending along a second direction different from the first direction;
a first source/drain region surrounding the second portion protruding further in the upward direction than a top surface of the field insulating layer:
a second multi-channel active pattern defined by the field insulating layer and extending along a third direction, the second multi-channel active pattern including,
  a third portion having a top surface protruding further in the upward direction than a top surface of the field insulating layer, and
  a fourth portion on both sides of the third portion in the third direction, the fourth portion having a top surface protruding further in the upward direction than the top surface of the field insulating layer and protruding in the upward direction less than the top surface of the third portion;
a second gate electrode on the third portion of the second multi-channel active pattern, the second gate electrode extending along a fourth direction different from the third direction;
fin spacers on a part of sidewalls of the fourth portion protruding further in the upward direction than the top surface of the field insulating layer; and
a second source/drain region contacting the top surface and the sidewalls of the fourth portion protruding further than the fin spacers.

20. The semiconductor device of claim 19, wherein the second source/drain region covers at least a portion of the fin spacers.

* * * * *